United States Patent [19]
Agrawal et al.

[11] Patent Number: 6,034,544
[45] Date of Patent: Mar. 7, 2000

[54] PROGRAMMABLE INPUT/OUTPUT BLOCK (IOB) IN FPGA INTEGRATED CIRCUITS

[75] Inventors: Om P. Agrawal, Los Altos; Herman M. Chang, Cupertino; Bradley A. Sharpe-Geisler; Bai Nguyen, both of San Jose, all of Calif.

[73] Assignee: Lattice Semiconductor Corporation, Sunnyvale, Calif.

[21] Appl. No.: 08/995,615

[22] Filed: Dec. 22, 1997

[51] Int. Cl.[7] .......................... H03K 19/177; G06F 7/38
[52] U.S. Cl. ............................ 326/39; 326/41; 326/47
[58] Field of Search ................................. 326/38, 39, 40, 326/41, 47, 56

[56] References Cited

U.S. PATENT DOCUMENTS

| | | | |
|---|---|---|---|
| 5,210,448 | 5/1993 | Takata | 326/41 |
| 5,260,881 | 11/1993 | Agrawal et al. | 326/39 |
| 5,365,125 | 11/1994 | Goetting et al. | 326/41 |
| 5,581,199 | 12/1996 | Pierce et al. | 326/41 |
| 5,594,367 | 1/1997 | Trimberger et al. | 326/41 |

*Primary Examiner*—Michael Tokar
*Assistant Examiner*—Daniel D. Chang
*Attorney, Agent, or Firm*—Fliesler, Dubb, Meyer & Lovejoy LLP

[57] ABSTRACT

A Field Programmable Gate Array (FPGA) device includes a plurality of input/output blocks (IOBs) and variable grain blocks (VGBs) An inter-connect network provides routing of signals between the IOBs and VGBs. The VGBs include a plurality of L-organized CBBs (configurable logic blocks) having function-producing resources. The IOBs are arranged along a top, left, bottom and right side of the plurality of VGBs. An IOB includes a 1) delay for timing input signals, 2) a configurable output latch which may be set or reset responsive to control signals, and 3) transistor for controlling a NOR line. The IOB is programmably configured to the inter-connect network which includes vertical and horizontal inter-connect channels comprising adjacent inter-connect lines.

5 Claims, 53 Drawing Sheets

PROGRAMMABLE INPUT/OUTPUT BLOCK (IOB) IN FPGA INTEGRATED CIRCUITS

BACKGROUND

1. Field of the Invention

The invention is generally directed to integrated circuits, more specifically to Programmable Logic Devices (PLDs), and even more specifically to a subclass of PLDs known as Field Programmable Gate Arrays (FPGAs).

2a. Cross Reference to Related Applications

The following copending U.S. patent applications are assigned to the assignee of the present application, and their disclosures are incorporated herein by reference:

(A) Ser. No. 08/828,520 filed Apr. 1, 1997 by Bradley A. Sharpe-Geisler and originally entitled, "MEMORY BITS USED TO COUPLE LOOK UP TABLE INPUTS TO FACILITATE INCREASED AVAILABILITY TO ROUTING RESOURCES PARTICULARLY FOR VARIABLE SIZED LOOK UP TABLES FOR A FIELD PROGRAMMABLE GATE ARRAY (FPGA)";

(B) Ser. No. 08/931,798, filed Sep. 16, 1997 by Bradley A. Sharpe-Geisler and originally entitled, "CIRCUITRY TO PROVIDE FAST CARRY";

(C) Ser. No. 08/700,616 filed Aug. 16, 1996 by Om Agrawal et al. and entitled, "PROGRAMMABLE LOGIC DEVICE (PLD) HAVING DIRECT CONNECTIONS BETWEEN CONFIGURABLE LOGIC BLOCKS (CLBs) AND CONFIGURABLE INPUT/OUTPUT BLOCKS (IOBs) (AS AMENDED)" (as a continuing divisional with chained cross referencing back to Ser. No. 07/394,221 filed Aug. 15, 1989);

(D) Ser. No. 08/912,763 filed Aug. 18, 1997, by Bradley A. Sharpe-Geisler and originally entitled, "OUTPUT BUFFER FOR MAKING A 2.5 VOLT CIRCUIT COMPATIBLE WITH A 5.0 VOLT CIRCUIT";

(E) Ser. No. 08/948,306 filed Oct. 9, 1997, by Om Agrawal et al. and originally entitled, "VARIABLE GRAIN ARCHITECTURE FOR FPGA INTEGRATED CIRCUITS";

(F) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(G) Ser. No. 08/996,049 filed Dec. 22, 1997, by Om Agrawal et al. and originally entitled, "DUAL PORT SRAM MEMORY FOR RUN-TIME USE IN FPGA INTEGRATED CIRCUITS";

(H) Ser. No. 08/995,614 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(I) Ser. No. 08/995,612 filed Dec. 22, 1997, by Om Agrawal et al. and originally entitled, "FLEXIBLE DIRECT CONNECTIONS BETWEEN INPUT/OUTPUT BLOCKs (IOBs) AND VARIABLE GRAIN BLOCKs (VGBs) IN FPGA INTEGRATED CIRCUITS";

(J) Ser. No. 08/997,221 filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS";

(K) Ser. No. 08/996,119 filed Dec. 22, 1997, by Bradley Sharpe-Geisler and originally entitled, "MULTIPLE INPUT ZERO POWER AND/NOR GATE FOR USE WITH A FIELD PROGRAMMABLE GATE ARRAY (FPGA)"; and, (L) Ser. No. 08/996,442 filed Dec. 22, 1997, by Bradley Sharpe-Geisler and originally entitled, "INPUT BUFFER PROVIDING VIRTUAL HYSTERESIS".

2b. Cross Reference to Related Patents

The following U.S. patents are assigned to the assignee of the present application, and their disclosures are incorporated herein by reference:

(A) U.S. Pat. No. 5,212,652 issued May 18, 1993 to Om Agrawal et al. and entitled, PROGRAMMABLE GATE ARRAY WITH IMPROVED Inter-connect STRUCTURE;

(B) U.S. Pat. No. 5,621,650 issued Apr. 15, 1997 to Om Agrawal et al. and entitled, PROGRAMMABLE LOGIC DEVICE WITH INTERNAL TIME-CONSTANT MULTIPLEXING OF SIGNALS FROM EXTERNAL Inter-connect BUSES; and (C) U.S. Pat. No. 5,185,706 issued Feb. 9, 1993 to Om Agrawal et al. and entitled, PROGRAMMABLE GATE ARRAY WITH LOGIC CELLS HAVING CONFIGURABLE OUTPUT ENABLE.

3. Description of Related Art

Field-Programmable Logic Devices (FPLDs) have continuously evolved to better serve the unique needs of different end-users. From the time of introduction of simple PLDs such as the Advanced Micro Devices 22V10 Programmable Array Logic device (PAL), the art has branched out in several different directions.

One evolutionary branch of FPLDs has grown along a paradigm known as Complex PLDs or CPLDs. This paradigm is characterized by devices such as the Advanced Micro Devices MACH family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.).

Another evolutionary chain in the art of field programmable logic has branched out along a paradigm known as Field Programmable Gate Arrays or FPGAs. Examples of such devices include the XC2000 and XC3000 families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device can be characterized as an integrated circuit that has four major features as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reProgrammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOBs) are provided for interconnecting other internal circuit components of the FPGA device with external circuitry. The 'IOBs' may have fixed configurations or they may be configurable in accordance with user-provided configuration instructions stored in the configuration-defining memory means.

(3) Configurable Logic Blocks (CLBs) are provided for carrying out user-programmed logic functions as defined by user-provided configuration instructions stored in the configuration-defining memory means. Typically, each of the many CLBs of an FPGA has at least one lookup table (LUT) that is user-configurable to define any desired truth table, —to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An inter-connect network is provided for carrying signal traffic within the FPGA device between various CLBs and/or between various IOBs and/or between various IOBs and CLBs. At least part of the inter-connect network is typically configurable so as to allow for programmably-defined routing of signals between various CLBs and/or IOBs in accordance with user-defined routing instructions stored in the configuration-defining memory means. Another part of the inter-connect network may be hard wired or nonconfigurable such that it does not allow for programmed definition of the path to be taken by respective signals traveling along such hard wired inter-connect. A version of hard wired inter-connect wherein a given conductor is dedicatedly connected to be always driven by a particular output driver, is sometimes referred to as 'direct connect'.

Modern FPGAs tend to be fairly complex. They typically offer a large spectrum of user-configurable options with respect to how each of many CLBs should be configured, how each of many inter-connect resources should be configured, and how each of many IOBs should be configured. Rather than determining with pencil and paper how each of the configurable resources of an FPGA device should be programmed, it is common practice to employ a computer and appropriate FPGA-configuring software to automatically generate the configuration instruction signals that will be supplied to, and that will cause an unprogrammed FPGA to implement a specific design.

FPGA-configuring software typically cycles through a series of phases, referred to commonly as 'partitioning', 'placement', and 'routing'. This software is sometimes referred to as a 'place and route' program. Alternate names may include, 'synthesis, mapping and optimization tools'.

In the partitioning phase, an original circuit design (which is usually relatively large and complex) is divided into smaller chunks, where each chunk is made sufficiently small to be implemented by a single CLB, the single CLB being a yet-unspecified one of the many CLBs that are available in the yet-unprogrammed FPGA device. Differently designed FPGAs can have differently designed CLBs with respective logic-implementing resources. As such, the maximum size of a partitioned chunk can vary in accordance with the specific FPGA device that is designated to implement the original circuit design. The original circuit design can be specified in terms of a gate level description, or in Hardware Descriptor Language (HDL) form or in other suitable form.

After the partitioning phase is carried out, each resulting chunk is virtually positioned into a specific, chunk-implementing CLB of the designated FPGA during a subsequent placement phase.

In the ensuing routing phase, an attempt is made to algorithmically establish connections between the various chunk-implementing CLBs of the FPGA device, using the inter-connect resources of the designated FPGA device. The goal is to reconstruct the original circuit design by reconnecting all the partitioned and placed chunks.

If all goes well in the partitioning, placement, and routing phases, the FPGA configuring software will find a workable 'solution' comprised of a specific partitioning of the original circuit, a specific set of CLB placements and a specific set of inter-connect usage decisions (routings). It can then deem its mission to be complete and it can use the placement and routing results to generate the configuring code that will be used to correspondingly configure the designated FPGA.

In various instances, however, the FPGA configuring software may find that it cannot complete its mission successfully on a first try. It may find, for example that the initially-chosen placement strategy prevents the routing phase from completing successfully. This might occur because signal routing resources have been exhausted in one or more congested parts of the designated FPGA device. Some necessary inter-connections may have not been completed through those congested parts. Alternatively, all necessary inter-connections may have been completed, but the FPGA configuring software may find that simulation-predicted performance of the resulting circuit (the so-configured FPGA) is below an acceptable threshold. For example, signal propagation time may be too large in a speed-critical part of the FPGA-implemented circuit.

In either case, if the initial partitioning, placement and routing phases do not provide an acceptable solution, the FPGA configuring software will try to modify its initial place and route choices so as to remedy the problem. Typically, the software will make iterative modifications to its initial choices until at least a functional place-and-route strategy is found (one where all necessary connections are completed), and more preferably until a place-and-route strategy is found that brings performance of the FPGA-implemented circuit to a near-optimum point. The latter step is at times referred to as 'optimization'. Modifications attempted by the software may include re-partitionings of the original circuit design as well as repeated iterations of the place and route phases.

There are usually a very large number of possible choices in each of the partitioning, placement, and routing phases. FPGA configuring programs typically try to explore a multitude of promising avenues within a finite amount of time to see what effects each partitioning, placement, and routing move may have on the ultimate outcome. This in a way is analogous to how chess-playing machines explore ramifications of each move of each chess piece on the end-game. Even when relatively powerful, high-speed computers are used, it may take the FPGA configuring software a significant amount of time to find a workable solution. Turn around time can take more than 8 hours.

In some instances, even after having spent a large amount of time trying to find a solution for a given FPGA-implementation problem, the FPGA configuring software may fail to come up with a workable solution and the time spent becomes lost turn-around time. It may be that, because of packing inefficiencies, the user has chosen too small an FPGA device for implementing too large of an original circuit.

Another possibility is that the internal architecture of the designated FPGA device does not mesh well with the organization and/or timing requirements of the original circuit design.

Organizations of original circuit designs can include portions that may be described as 'random logic' (because they have no generally repeating pattern). The organizations can additionally or alternatively include portions that may be described as 'bus oriented' (because they carry out nibble-wide, byte-wide, or word-wide, parallel operations). The organizations can yet further include portions that may be described as 'matrix oriented' (because they carry out matrix-like operations such as multiplying two, multidimensional vectors). These are just examples of taxonomical descriptions that may be applied to various design organizations. There may be more. The point is that some FPGA structures may be better suited for implementing random logic while others may be better suited for implementing bus oriented designs or other kinds of designs.

If the FPGA configuring software fails in a first run, the user may choose to try again with a differently-structured FPGA device. The user may alternatively choose to spread the problem out over a larger number of FPGA devices, or even to switch to another circuit implementing strategy such as CPLD or ASIC (where the latter is an Application Specific hardwired design of an IC). Each of these options invariably consumes extra time and can incur more costs than originally planned for.

FPGA device users usually do not want to suffer through such problems. Instead, they typically want to see a fast turnaround time of no more than, say 4 hours, between the time they complete their original circuit design and the time a first-run FPGA is available to implement and physically test that design. FPGA users also usually want the implementing FPGA circuit to provide an optimal emulation of the original design in terms of function packing density, cost, speed, power usage, and so forth irrespective of whether the original design is taxonomically describable generally as 'random logic', or as 'bus oriented', or as a combination of these, or otherwise.

When multiple FPGAs are required to implement a very large original design, high function packing density and efficient use of FPGA internal resources are desired so that implementation costs can be minimized in terms of both the number of FPGAs that will have to be purchased and the amount of printed circuit board space that will be consumed.

Even when only one FPGA is needed to implement a given design, a relatively high function packing density is still desirable because it usually means that performance speed is being optimized due to reduced wire length. It also usually means that a lower cost member of a family of differently sized FPGAs can be selected or that unused resources of the one FPGA can be reserved for future expansion needs.

In summary, end users want the FPGA configuring software to complete its task quickly and to provide an efficiently-packed, high-speed compilation of the functionalities provided by an original circuit design irrespective of the taxonomic organization of the original design.

In the past, it was thought that attainment of these goals was primarily the responsibility of the computer programmers who designed the FPGA configuring software. It has been shown however, that the architecture or topology of the unprogrammed FPGA can play a significant role in determining how well and how quickly the FPGA configuring software completes the partitioning, placement, and routing tasks.

An improved FPGA architecture that helps FPGA configuring software to better reach its goals was disclosed in U.S. Pat. No. 5,212,652, issued May 18, 1993 to Agrawal et al. The improvement provided a symmetrically balanced distribution of logic function resources and routing resources in both horizontal and vertical directions so that placement and routing was not directionally constrained to, for example, a left- to right signal flow orientation. Balanced availability of logic function-implementing resources and signal-routing resources was provided to give the FPGA configuring software more degrees of freedom in each of the partitioning, placement, and routing phases. This increased the likelihood that congestion would be avoided during placement and routing because circuit implementation could be more uniformly distributed instead of being concentrated along a particular direction. It also increased the probability that more efficient solutions would be found in the iterative optimization phases because optimization attempts would not be constrained by pre-existing congestions.

U.S. patent application Ser. No. 08/700,616 [Attorney Docket No. AMDI7062DIV12] (hereinafter "'616 application"), entitled "Programmable Logic Device (PLD) Having Direct Connections Between Configurable Logic Blocks (CLBs) and Configurable Input/Output Blocks (IOBs), filed Aug. 15, 1989 by Agrawal et al., disclosed signal-routing resources, and in particular, direct connections between CLBs. Direct connect outputs and inputs were positioned on all four sides of a CLB. A single direct connect output was positioned on each side of a CLB. Similarly, four direct connect inputs were positioned on each side of a CLB. The positioning of direct connect inputs and outputs on a CLB, as well as positioning of the direct connect lines, enables a symmetrically balanced distribution of direct connect signal routing resources.

Further advances in integrated circuit manufacturing technologies have now enabled higher densities of logic function-implementing circuits and higher densities of signal routing resources. This presents opportunities for further-improvements.

SUMMARY OF THE INVENTION

An improved inter-connect network architecture in accordance with the invention features programmably configured connections between a repeating pattern of logic-implementing, Variable Grain Blocks or 'VGBs' and Input/Output blocks 'IOBs'.

In a preferred class of embodiments, plural VGBs are symmetrically arranged and wedged together in a manner similar to slices of a symmetrically-cut pie. The congregated or 'wedged-together' VGBs form a super-VGB structure. Each such super-VGB includes centralized means for merging together the resources of its respective VGBs so that the super-VGB can offer even higher levels of functionality than are provided by each of its constituent VGBs.

In further accordance with the invention, plural super-VGBs are distributed in a matrix across an FPGA device. VGB-to-VGB inter-connect lines extend along sides of the super-VGBs. In a preferred embodiment, there are at least four VGBs in each super-VGB. Each of these four VGBs preferably has an L-shaped (or V-shaped) internal organization that lies adjacent to, or forms a peripheral part of the super-VGB. The L-shaped organization includes two legs. Each leg includes a Configurable Building Block (CBB) for generating a function signal from input signals.

A plurality of IOBs are arranged along the periphery of the matrix distributed super-VGBs. The plurality of IOBs include a set of top (north), right (east), bottom (south), and left (west) IOBs, forming an approximate square perimeter around the periphery of super-VGBs. The plurality of IOBs include corner and non-corner IOBs. In an embodiment, corner IOBs include 12 IOBs forming a corner of the square perimeter. In an embodiment, non-corner IOBs are IOBs not included in corner IOBs which are used to form a side of the square perimeter.

An IOB includes a delay element for timing input signals to VGBs from peripheral devices, such as a bus. The delay is typically used to allow for the input register to have an approximate zero hold time. A global clock signal may not reach the input IOB register before the input signals. In an embodiment, the delay is a chain of inverters with relatively large channel widths for pull down transistors. The IOB also includes an output register/latch which is configurable as either a latch or register (flip-flop mode). The configured output latch may be set or reset in response to appropriate control signals, such as a Global Reset signal or individual Reset signal for a particular IOB. The Global Reset signal may be provided to all the IOBs from the inter-connect network. The IOB also includes a plurality of transistors coupled to a NOR line. The NOR line is connected to a plurality of IOBs. In response to an IOB signal, the NOR line may produce a product term. The NOR line may be used in decoding an address signal provided to the plurality of IOBs from a peripheral device.

In one embodiment, each super-VGB is surrounded by diversified set of inter-connect resources. The inter-connect resources include vertical and horizontal inter-connect channels. The inter-connect channels include a plurality of inter-connect elements such as: general bi-directional inter-connect lines of varying lengths; switchboxes that provide programmable inter-connections between the general bi-directional inter-connect lines; and uni-directional programmably configured direct connect lines. The general bi-directional inter-connect lines include MaxL lines which span essentially the full workable length of the FPGA device along one of its major axes (e.g., the horizontally-extending x axis or the vertically-extending y axis). MaxL lines in horizontal and vertical inter-connect channels adjacent IOBs may be configured to NOR lines.

IOB control multiplexers are positioned adjacent groups of IOBs and coupled to inter-connect channels positioned substantially perpendicular to the group of IOBs. In an embodiment, the IOB control multiplexers are used to provide general and individual control signals to three IOBs. In an embodiment, a first IOB control multiplexer has inputs coupled to two inter-connect channels and outputs coupled to the three IOBs. The IOB control multiplexer provides general CLOCK signals and a COMMON SET/RST signal to the three IOBs from a first inter-connect channel. Individual IOB control signals, such as OUTPUT and INPUT enable signals, are provided to the three IOBs from the IOB multiplexer by way of the second inter-connect channel. The IOB control multiplexers include programmable inter-connect points (PIPs) for programmably configuring AIL lines, SET/RST lines, $V_{CC}$ lines, GND lines and CLOCK lines in the first and second inter-connect channels to multiplexer input lines (MILs) The MIL lines are either connected directly to respective IOB input lines and/or logic which is coupled directly to IOB input lines.

The plurality of IOBs include a plurality of inputs and outputs connected to inter-connect resources. In an embodiment, each IOB has a NOR output connected to a NOR control line. The respective NOR control lines are coupled to a NOR line. A first set of IOB NOR outputs on a first side of a FPGA device is connected to a first NOR line. A second set of IOBs on the first side of the FPGA device is likewise connected to a second NOR line. The first and second NOR lines are coupled to first and second current sources and respective NOR configuration memory bits.

IOB MaxL outputs and inputs are also connected to MaxL lines in horizontal and vertical inter-connect channels. Four bits of data may be input to MaxL lines in an adjacent inter-connect channel from a group of 3 IOBs positioned about a first side of the FPGA device and a fourth IOB positioned on an opposite side. IOBs also have MaxL inputs connected to the MaxL lines in the adjacent inter-connect channels.

Dendrites are positioned in between IOBs and adjacent inter-connect channels. For example, a plurality of dendrites may be positioned between a set of top IOBs and a first horizontal inter-connect channel. The plurality of dendrites are used to route signals between peripheral IOBs without consuming general inter-connect resources. A dendrite includes four I/O switchboxes which are connected by a plurality of dendrite lines. In an embodiment, the dendrite lines are connected to a group of six IOBs. In an embodiment, each IOB in the group of six IOBs has a dendrite output and six dendrite inputs. The first I/O switchbox is coupled to a first inter-connect channel. The second I/O switchbox is coupled to a second inter-connect channel. The third I/O switchbox is coupled to a third inter-connect channel, and the fourth I/O switchbox is coupled to a fourth inter-connect channel. The I/O switchboxes enable programmable routing between inter-connect channels and dendrite lines. A second dendrite may be positioned adjacent to the first group of IOBs. The second dendrite may include four I/O switchboxes wherein a first and second switchbox in the second dendrite is coupled to the first and second inter-connect channel and the third and fourth switchbox in the second dendrite is coupled to a fifth and a sixth inter-connect channel. The second dendrite may likewise be coupled to a second group of six IOBs. This pattern may be repeated around the periphery of the FPGA device.

In an embodiment, the dendrite IOB switchboxes include a plurality of PIPs for programmably configuring connections between dendrite lines and AILs in inter-connect channels. Double, quad, and octal AIL lines in an inter-connect channel may be programmably configured to particular dendrite lines by a dendrite IOB switchbox.

A direct connect architecture between IOBs and VGBs allow for direct connect signals to be transferred to and from IOBs. A set of corner IOBs including 2 legs of 6 IOBs with direct connect outputs connected to respective direct connect lines which are coupled to corner super-VGB. The super-VGB includes a first, second, third and fourth VGB, wherein in each VGB includes a CBB Y, W, Z, and X. The first VGB may receive 8 direct connect input signals from 8 respective IOB direct connect outputs. The second VGB may receive 6 direct connect input signals from 6 respective IOB direct connect outputs. The third VGB may receive 6 direct connect input signals from 6 respective IOB direct connect outputs. The fourth VGB may receive 4 direct connect input signals from 4 respective IOB direct connect outputs.

Non-corner IOBs include a group of 6 IOBs which have a direct connect architecture for providing direct connect signals between non-corner IOBs and an adjacent super-VGB. The group of non-corner IOBs have direct connect outputs connected a non-corner super-VGB which includes a first, second, third, and fourth VGB, wherein each VGB includes a Y, W, Z, and X CBB. The first VGB has four direct connect signals provided by four non-corner IOBs. Likewise, the second VGB has four direct connect input signals provided from four non-corner IOBs. The third and fourth VGB has two direct connect signals provided from two non-corner IOBs.

Direct connect output signals from corner and non-corner super-VGBs, in particular from CBBs Y, W, Z, and X in VGBs are similarly provided to corner and non-corner IOBs.

A direct connect architecture between non-corner IOBs and a next-adjacent super-VGBs also allows the transfer of direct connect signals.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1:
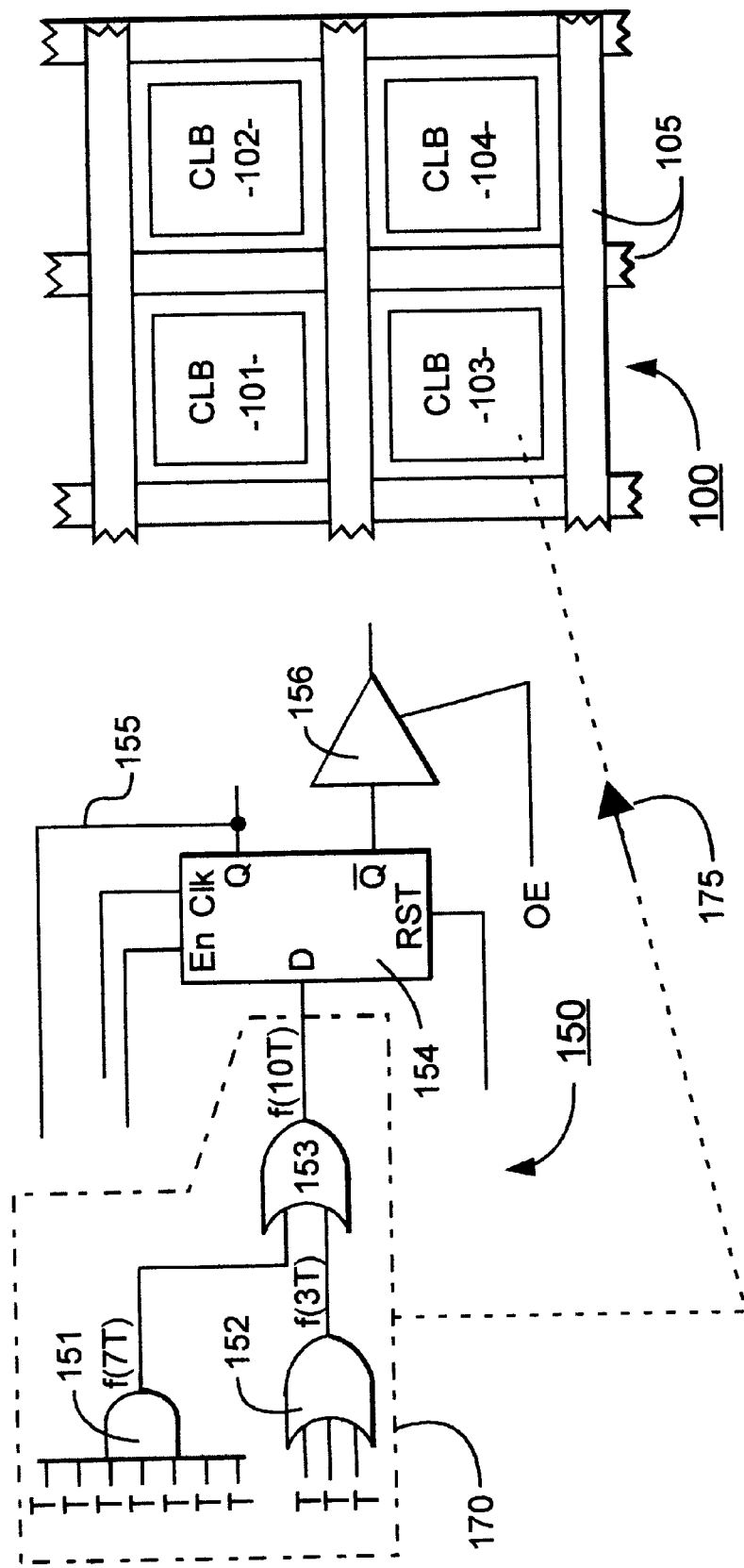
FIG. 1 illustrates an example of partitioning and placement as applied to a generic FPGA device.

FIG. 1 shows at 100 a basic FPGA architecture in which a matrix of configurable logic blocks (CLBs) 101–104 are distributed within an inter-connect mesh 105. This basic FPGA architecture 100 will be used to illustrate some aspects of FPGA design and configuration.

A number of FPGA terms will be used throughout the specification. The term 'CLB' as used herein generally refers to a Boolean function generating block whose structure is essentially repeated throughout the device. Each CLB usually has at least one programmable lookup table (LUT), but may have more LUTs. Each CLB may have other resources such as data-storage elements (e.g., flip flops) and local feedback means for creating sequential state machines.

The term 'inter-connect mesh' as used herein generally refers to a repeated pattern of connection-providing resources which carry signal traffic between CLBs. An analogy can be made to the mesh of public highways (expressways) and public streets that carry vehicle traffic in modern cities. The inter-connect mesh of an FPGA may also include connection-providing resources that can carry signal traffic between CLBs and input/output blocks (IOBs). As used herein, 'IOB' refers to a repeated structure (not shown in FIG. 1) that provides interface between points outside the FPGA device and FPGA-internal components.

The term 'intra-connection' resources (note the 'ra' sequence before the hyphen) is used herein to refer to connection-providing resources that are dedicated to carrying signals essentially only inside a particular entity such as a CLB or an IOB. Such intra-connection resources are to be distinguished from 'inter-connection resources' (note the 'er' sequence before the hyphen). In general, intraconnection is a relative term which should accompany the entity to which it is dedicated. Thus CLB-intraconnection refers to connection resources that are dedicated to carrying signals essentially only inside a particular CLB.

The term 'inter-connection resources' is used herein to refer to connection-providing resources that can carry signals between two or more CLBs and/or between two or more IOBs and/or between a CLB and an IOB.

To distinguish intra-connection resources over inter-connection resources, an analogy can be made to the private driveway of a private house as distinguished from an adjacent public highway (expressway) or an adjacent public street, where the latter generally carries passing-by general traffic as well as private traffic of the private driveway.

Inter-connection resources in the FPGA include both those that provide programmable routing of signals between any desired CLBs and/or IOBs and those that provide fixed routing (hardwired transmission) of signals between specific IOBs and/or specific CLBs. One type of fixed-route interconnect resource is a line that is always (fixedly) driven by a dedicated output but can have its carried signal programmably coupled to one or more inputs. Such unidirectional, fixed-route lines are generally referred to herein as 'direct connect lines'.

Inter-connect resources which provide programmably-definable routing of signals between CLBs and/or IOBs can include 'maximum length' lines (MaxL lines) which span essentially the full workable length of the FPGA device along one of its major axes (e.g., the horizontally-extending x axis or the vertically-extending y axis). MaxL lines are also referred to as 'longlines'.

The programmably-configurable inter-connect resources can further include 'short-haul segments' which extend for lengths significantly less than those of the longlines. Short-haul segments generally terminate on both ends at inter-connect 'switch boxes'. The switch boxes provide programmably-definable inter-connections between terminal ends of short-haul connectors merging into the switch boxes.

Once a specific inter-connect line is 'consumed' for carrying a first signal, that inter-connect resource cannot be used to at the same time carry a second signal. Similarly, once a specific, logic function-providing resource is 'consumed' for carrying out a first logic function, that same logic function-providing resource cannot be used to at the same time carry out a completely different, second logic function.

When an FPGA is used to implement a given, original circuit design, successive portions of the FPGAs inter-connect resources and logic function-providing resources are consumed by corresponding portions of the original circuit design.

Partitioning and Placement Example

FIG. 1 shows at 150 an example of a circuit design portion whose functionality is to be implemented within generic FPGA device 100. Sample circuit section 150 may include a first logic gate 151 (an AND gate) having seven inputs and one output. Each of the input signals is referred to as a Boolean 'term' (T). The output signal of gate 151 is therefore a function of seven terms and this is denoted by the shorthand, 'f(7T)'.

Similarly, a second gate 152 (OR gate) in original design 150 is shown to have three independent input terms and its output function is therefore denoted as f(3T).

A third gate 153 (OR) receives the f(7T) and f(3T) outputs of gates 151 and 152 and produces therefrom an output signal f(10T) which is a Boolean function of all ten input terms.

Element 154 of original design 150 represents a data storage device such as a D-type flip-flop. Storage element 154 includes a data input terminal (D), a stored-data output terminal (Q), an inverted output terminal (Qbar), a reset terminal (RST), a clock input terminal (Clk) and a clock enable terminal (En). Line 155 represents a high speed feedback (FB) connection which couples an output of storage device 154 either to define one of the input terms (T) of gates 151–152 or to define an input of another, not-shown logic gate which closely precedes one of gates 151–152.

Element 156 of original design 150 represents a 3-state output driver (tri-state drive) which outputs a binary signal when enabled and whose output goes into a high impedance state when its output enable (OE) control terminal is deactivated. When not in the high impedance state, the output of driver 156 charges and/or discharges a capacitive load 157. The capacitive load can be in the form of a cable, or a system bus line, and/or a set of further gate inputs.

Dashed box 170 represents a possible first partitioning of original circuit portion 150 into a circuit chunk that is to be placed within, and implemented by, a specific CLB, say the one at 103. Dashed line 175 represents this specific placement.

If the initially assigned CLB 103 contains enough not-yet-consumed resources to implement the first partition 170, the initial placement of partition 170 completes and the same resources of CLB 103 are deemed to be consumed by the now placed, partition 170.

After such successful placement of partition 170 in CLB 103, another partitioned portion of the original design 150 (e.g., flip flop 154) is placed elsewhere, say in CLB 102. Thereafter, the inter-connect resources of inter-connect mesh 105 are consumed to reconnect the partitions. Eventually, a series of further placements and inter-connect routings completes the implementation of circuit 150 in target FPGA 100.

Figure 2:
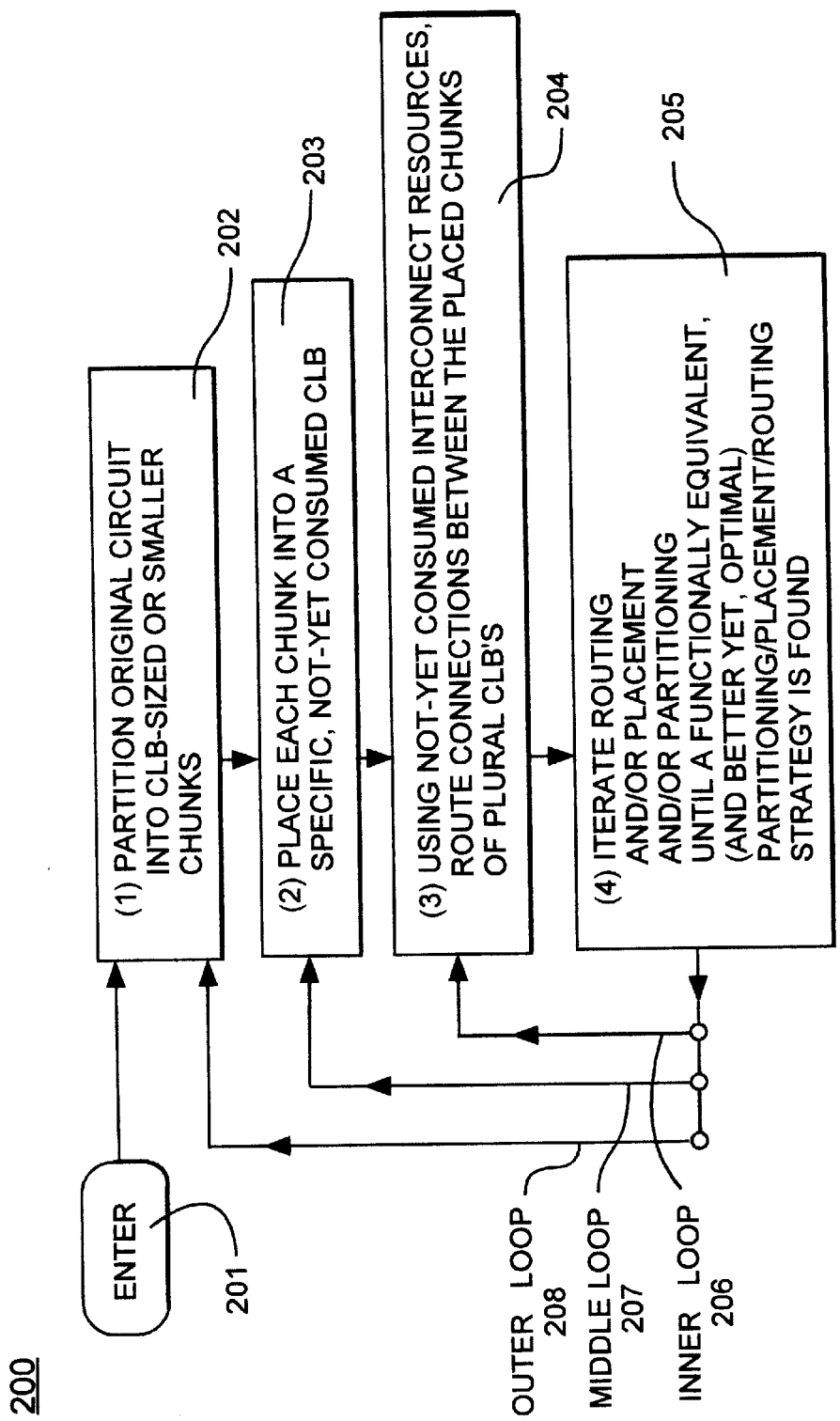
FIG. 2 shows a generalized flow chart for FPGA configuring software.

FIG. 2 outlines the general procedure for an FPGA configuring software module 200. Module 200 receives specifications for an original circuit design such as 150 at entrance point 201. Its task is to configure a designated FPGA such as 100 to implement the functions of the original circuit design 150. This is to be done under the constraints of the finite number of logic function-providing resources 101–104 and inter-connect resources provided in FPGA 100.

At step 202, the FPGA-configuring software module 200 partitions the original circuit design (150) into a plurality of CLB-sized or smaller chunks. A 'CLB-sized chunk', or a smaller chunk, is a partitioned circuit portion that can be fully implemented by the target CLB (e.g., 103). Such implementation includes: (1) timely receipt of all input signals flowing into the partitioned chunk (for example all ten independent input terms or T's of partition 170); (2) timely carrying out of all the data processing functions of the partition (e.g., producing the ten term output, f(10T)); and (3) timely provision of a sufficient number of outputs at sufficient speed and power.

Partitioning and placement are not always successful on first try. Assume by way of example that CLB 103 contains only one, not-yet-consumed, lookup table (LUT) capable of handling up to, but not more than eight input terms (8T). In such a case, partition 170 would not fit into CLB 103 and cannot be placed there. Either the initial partition has to be reduced or another CLB with greater not-yet-consumed resources has to be found.

If the re-partitioning strategy is followed here, the illustrated partition 170 might be shrunk to encompass only the 3-input termed OR gate 152 instead gates 151, 152 and 153. Of course, that would be an inefficient use of the f(8T) function-providing capabilities of CLB 103. The smarter step for the FPGA configuring software 200 would have been to shrink partition 170 to encompass only the 7-input termed AND gate 151. Then gates 152 and 153 would be moved into a different partition. This is just an example of the strategy problems that are encountered by the FPGA configuring software and not indicative of any specific algorithm.

In general, partitioning step 202 tries to adjust its operations to closely match the function-providing resources available within each CLB 101–104 so that the partitioning chunks are neither larger than what can be accommodated nor too small.

As indicated for the following step 203, each partitioned chunk is virtually 'placed' in a specific, not-yet-consumed CLB. Once the partition-implementing resources of a specific CLB (e.g., 103) are consumed by one or more chunks already placed therein, that CLB is no longer available for supporting further chunks. In such a case, for each next chunk, the placement step 203 looks for another CLB with not-yet-consumed resources to support that next chunk.

At subsequent routing step 204, an attempt is made to use the available inter-connect resources 105 to re-establish connections between the partitioned and placed chunks. As indicated, successive ones of not-yet consumed inter-connect resources are consumed in turn in an attempt to route connections between the specifically placed chunks in the various CLBs. The goal is to reconstruct the original design 150.

At step 205, the FPGA-implemented solution that results from the prior partitioning, placement and routing steps 202–204 is examined to see whether a functionally equivalent implementation of the original circuit design 150 has been successfully obtained using the available resources of FPGA 100.

If some connections are still incomplete or are too slow, inner iteration loop 206 may be followed. In loop 206, different routing strategies are tried using the available inter-connect resources 105 of the FPGA to see if a better routing solution can be found.

If the re-routing attempts are not successful by themselves, middle iteration loop 207 may be attempted to try different placement strategies in hopes of obtaining a functional or better implementation.

Finally, if trials with different placements 207 and different routings 206 do not succeed, outer iteration loop 208 may be followed in an attempt to try different partitioning strategies as well.

If the outer most loop 208 fails to provide a functional and acceptable result after a predefined number of attempts, the software module 200 will typically report an inability to implement the original circuit design 150 in the target FPGA 100. The user may be asked to retry with another FPGA having more resources and/or a different architecture.

Suppose that step 205 determines that a functional implementation for the original circuit 150 has been obtained after only one run of each of steps 202–204. Even here, it is often desirable to continue the inner, middle, and even outer iterations loops 206–208 in hopes of finding more optimal implementations of the original circuit design 150. The more optimal implementations may provide higher operating speeds, less power usage, or denser packing within the implementing FPGA 100.

After step 205 obtains a functional final implementation, the inputs of unused gates, if any, are normally configured so as to be tied to a steady logic 1 or logic 0. This is done to avoid having floating inputs that in the presence of switching noise, may cause their respective gate outputs to switch and generate further noise.

Although the partitioning, placement and routing phases have been presented above as being carried out in a specific order (partitioning first, then placement, then routing), there is nothing requisite about this order. Those skilled in the art will appreciate that the phases can be intermixed according to a variety of orderings. For example, during optimization some routings may be defined first and then the effects of different placements may be investigated while the defined routings are temporarily held fixed.

Improvements can and have been made to FPGA configuring software modules such as the one shown in FIG. 2. However, there is a limit to how far such improvements can proceed on the software side. This is so because the FPGA configuring software module 200 is inherently constrained by the quantities, types, granulations, and distribution of resources provided within the target FPGA device 100.

At some point, the design of the FPGA 100 itself must be improved in some substantial way in order to obtain better implementations of the original design 150.

A First Symmetric Architecture

Figure 3A:
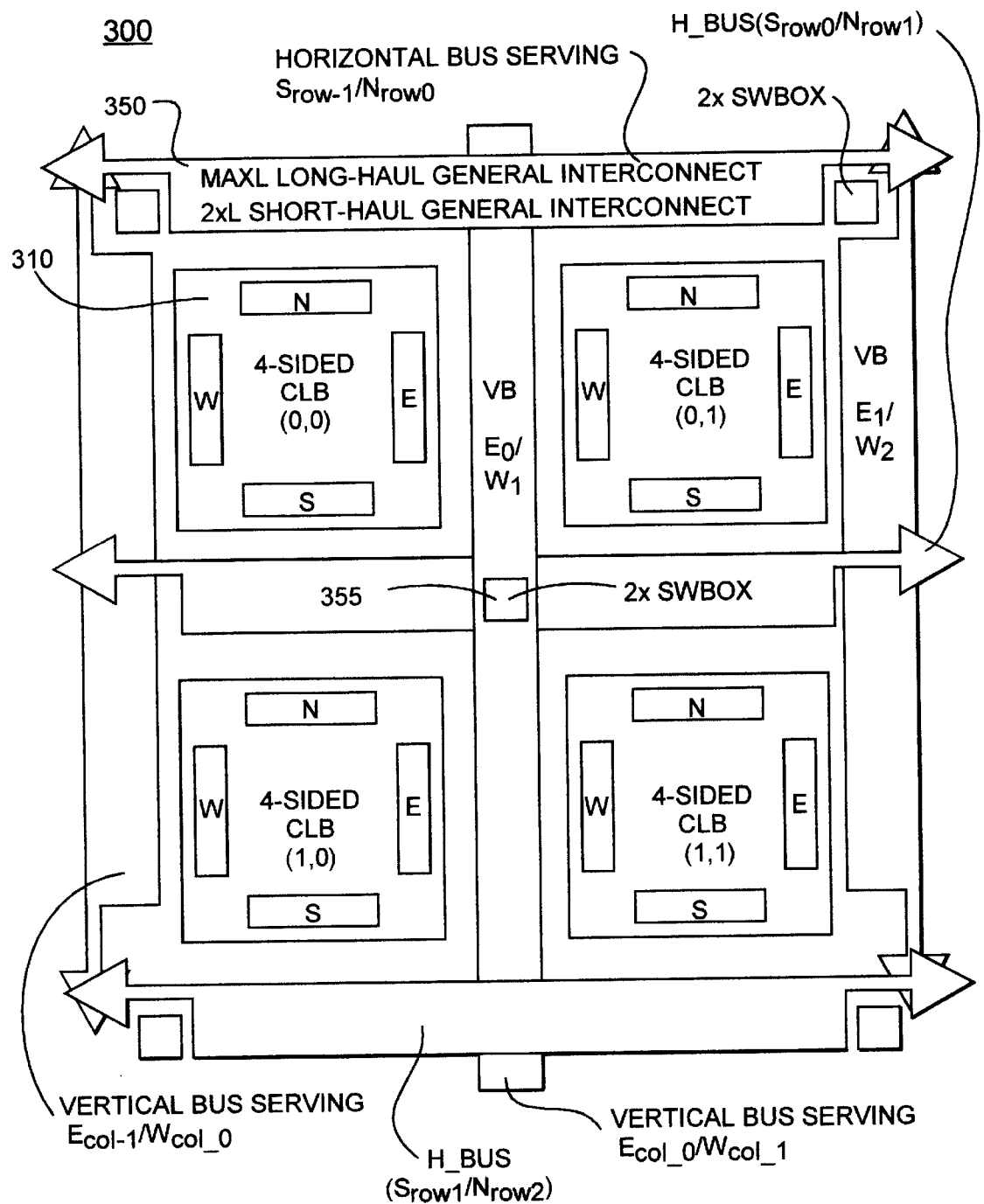
FIG. 3A schematically illustrates a previously suggested symmetric architecture having 4-sided CLBs with function synthesizing cores.

FIG. 3A schematically illustrates a symmetrical organization 300 of a type previously suggested in U.S. Pat. No. 5,212,652. In this architecture 300, each CLB such as 310 is topologically organized as a four-sided symmetrical object. The four illustrated CLBs are identified by relative row and column as (0,0), (0,1), (1,0) and (1,1). Equivalent input/output ports are symmetrically distributed about the periphery of each four-sided CLB. A function synthesizing core is provided at the center of each four-sided CLB.

In FIG. 3A, these four peripheral ports of each CLB are denoted as N, E, S and W according to the points of the compass. Each of the input/output ports (N, E, S, W) has specialized input terminals for respectively receiving direct connect signals, or longline signals, or signals from short-haul general-inter-connect segments.

Some topological observations can be made about the architecture 300 shown in FIG. 3A. The symmetrical arrangement of input and output resources about the periphery of each CLB 310 provides equal degrees of freedom for placement, partitioning and routing. As explained above, this can advantageously help the FPGA configuring software to complete its job. However, because of the central disposition of LUTs, all LUT-input signals invariably flow the full distance from the peripheral ports (N, E, S, W) through a transition layer into the center and all LUT-developed signals invariably flow the full distance back out again from core, through transition layer to a PIE layer, irrespective of whether simpler or more complex functions are being developed, and irrespective of whether the resultant output signals are destined for output onto high-speed direct connect lines or output onto potentially-slower longlines. Moreover in the architecture 300 of FIG. 3A, each of the four peripheral ports (N, E, S, W) has its own longline driving amplifier (e.g., 325), which same amplifier 325 is also used for driving short-haul conductor segments.

Another topological observation to be made respecting architecture 300 (FIG. 3A) is that there is a symmetrical distribution of horizontal and vertical inter-connect buses cutting between the respectively-facing N-S and E-W ports of all immediately adjacent CLBs. This inherently places distance between such counter-facing N-S and E-W ports.

Also, there is a 'sidedness' to each port. If one wishes to cascade functions of the CLB by for example moving a signal output from the N port of a CLB 310 to the E or S port of the same CLB 310 via the inter-connect, the routing algorithm has to generally circumnavigate about the corners of the CLB. This tends to add delay because of signal passage through switch boxes.

The inter-connect resources of architecture 300 are granulated to include so-called double-wide short-haul general inter-connect segments (also identified in FIG. 3A as '2×L' lines) and longlines. Four-way switch boxes are provided in staggered fashion at the intersections of the double-wide lines. This combination of inter-connect resources is schematically illustrated at 350. (Important note: the definition of 2×L as used in FIG. 3A does not apply to higher numbered figures. As will be seen, in FIG. 4 the 2×L lines shown therein each spans four CBBs.)

Note that a first horizontal bus (top of FIG. 3A) services the north side ports of relative row 0 and the south side ports of relative row −1. A second horizontal bus (middle) services the south side ports of relative row 0 and the northern ports of relative row 1. A third horizontal bus (bottom) services the southern ports of relative row 1 and the northern ports of relative row 2. Thus, at least three separate, horizontal buses are needed to service each 2-by-2 matrix of CLBs.

In similar fashion, three vertical buses are similarly called for to service the respective western and eastern ports of relative columns −1 through +2.

Switch boxes such as that at 355 are placed between the neighboring four corners of every set of four CLBs (0,0 through 1,1) in architecture 300. This layout has a tendency to push the 4 CLBs (0,0–1,1) radially apart relative to box 355. Packing density of CLBs may suffer as a result.

Also, vertical and horizontal inter-connect buses cut through each respective quartet of CLBs (0,0–1,1) to cross at switch boxes such as the illustrated 355. The cutting-through of inter-connect buses also has a tendency to push the 4 CLBs (0,0–1,1) radially apart from box 355, particularly if the design is scaled up to give each of the vertical and horizontal inter-connect buses more lines. Such scaling-up also tends to make switch box 355 larger because it will generally have more switches for providing routing between the larger numbers of inter-connect wires.

In summation it is seen that, although the symmetrically-arranged architecture 300 of FIG. 3A enables FPGA configuring software (such as 200 of FIG. 2) to more efficiently configure FPGAs because resources are symmetrically distributed in a balanced way relative to all four points of the compass (N, E, S, W), problems develop as one tries to scale the design to provide for more inter-connect wires per bus.

Figure 3B:
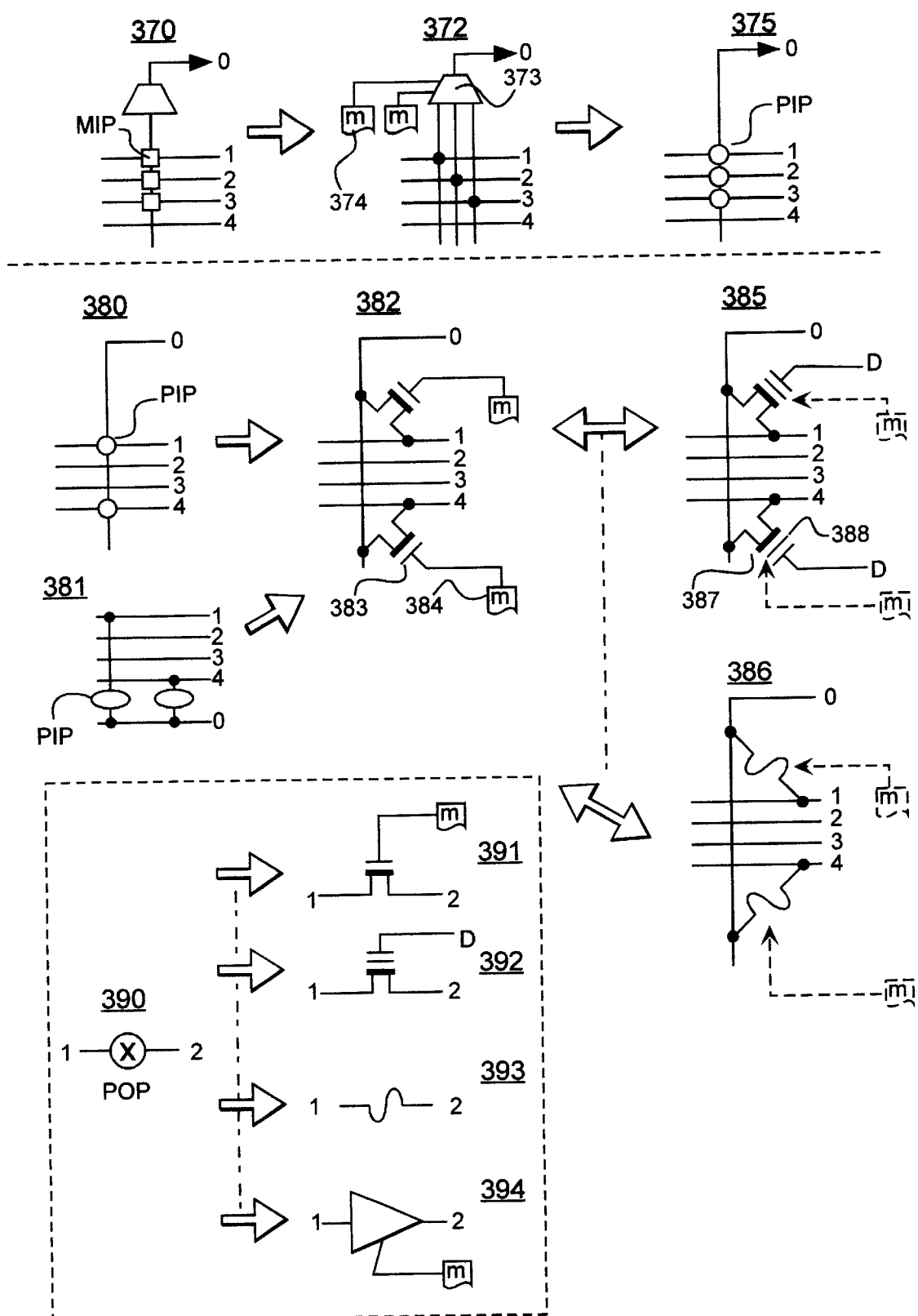
FIG. 3B provides a legend for some schematic symbols used in the present disclosure.

Before exploring details of the new direct connect architecture, the legend of FIG. 3B will be explained. Unless otherwise stated, a single line going into a multiplexer symbol such as shown at 370 of FIG. 3B represents an input bus of plural wires. Each open square box such as the MIP shown at 370 represents a point for user-configurable acquisition of a signal from the crossing line (e.g., 1, 2, 3). One implementation is shown at 372. Multiplexer 373 is controlled by configuration memory bits 374. The number of configuration memory bits 374 can vary depending on the number of MIPs (multiplexer input points) and whether selection decoding is carried out or not. One embodiment that has no selection decoding is shown at 375. Here, a PIP is placed at each MIP occupied intersection of output line 0 with crossing lines 1–4. Each of these PIPs is understood to have a single configuration memory bit controlling its state. In the active state the PIP creates a connection between the crossing lines. In the inactive state the PIP leaves an open between the illustrated crossing lines. Each of the crossing lines remains continuous however in its respective direction (x or y).

PIPs (each of which is represented by a hollow circle covering a crossing of two continuous lines) may be implemented in a variety of manners as is well known in the art. Two PIPs are shown at 380 for programmably creating a coupling between line 0 and respective ones of lines 1 and 4. In one embodiment shown at 382, pass transistors such as MOSFET 383 have their source and drain coupled to the crossing lines while the transistor gate is controlled by a configuration memory bit such as 384. In an alternate embodiment shown at 385, nonvolatilely-programmable floating gate transistors such as 387 have their source and drain coupled to the crossing lines. The charge on the floating gate 388 represents the configuration memory bit. A dynamic signal D or a static turn-on voltage may be applied to the control gate as desired. In yet another alternate embodiment shown at 386, nonvolatilely-programmable fuses or anti-fuses have their ends connected to the crossing lines. Each of examples 382, 385 and 386 demonstrates a bidirectional PIP for which signal flow between the crossing lines (e.g., 0 and 1) can move in either direction. Where desirable, PIPs can also be implemented with unidirectional signal coupling means such as AND gates, tri-state drivers (see 394), and so forth.

An alternate symbol for a PIP is constituted by a hollow ellipse covering a strapping connection between two parallel lines such as shown at 381. The schematic of 381 is an alternate way of representing the circuit of 380.

Another symbol used herein is the POP such as shown at 390. POP stands for 'Programmable Opening Point' and it is represented by a hollow circle with an 'X' inside. Unless otherwise stated, each POP is understood to have a single configuration memory bit controlling its state. In the active state the POP creates an opening between the colinear lines (1,2) entering it. In the inactive state the POP leaves closed an implied connection between the colinear lines (1,2) entering it. Possible implementations of POPs are shown at 391 through 394. In EEPROM implementation 392, the control gate signal D will be typically tied to the channel-inducing state so that the charge on the floating gate controls the POP state exclusively. The tri-state driver implementation of 394 is unidirectional of course. Many other alternatives will be apparent to those skilled in the art.

Figure 3C:
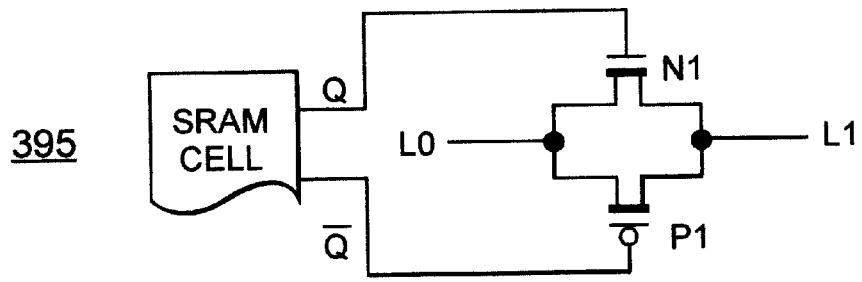
FIGS. 3C and 3D provide schematics for transmission gate type PIPs (programmable inter-connect points) driven by complementary outputs of an SRAM bit.

FIG. 3C shows yet another implementation of a bidirectional PIP at 395. Lines L0 and L1 are the programmably inter-connectable entities. In this particular case, the controlling memory is an SRAM bit (Static Random Access Memory) having opposed Q and Q-bar outputs. The Q output drives the gate of an N-10 channel MOSFET, N1 of the PIP. The Q-bar output drives the gate of an P-channel MOSFET, P_1 of the PIP. In general, transistor P_1 should be made with a larger channel width than that of transistor N_1 to compensate for the lower mobility of carriers in the P-channel of the P_1 device.

Figure 3D:
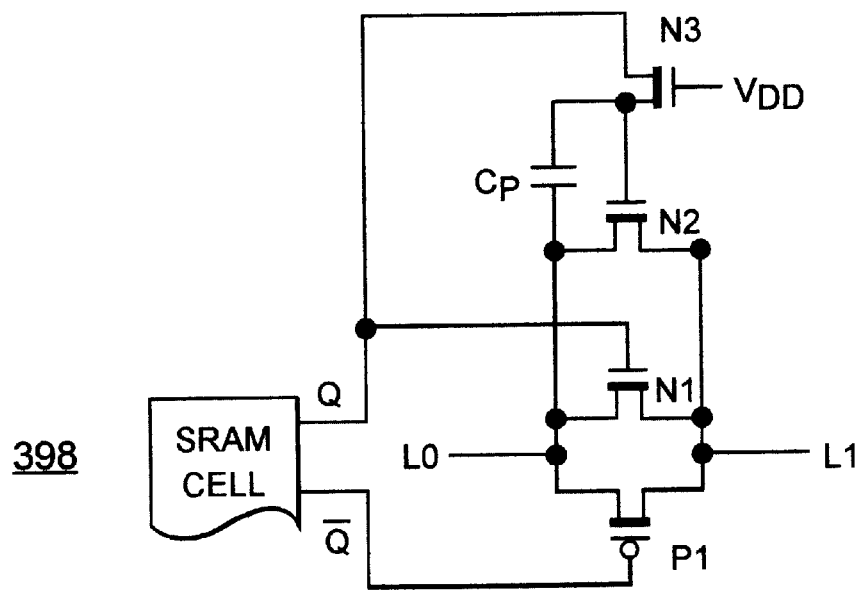

FIG. 3D shows yet another implementation of a bidirectional PIP at 398. Like reference symbols are used where appropriate for elements having like counterparts in FIG. 3C. The PIP shown at 398 may be referred to as a boot-strapped transmission gate. The parasitic gate-to-source capacitance $C_P$ of additional N-transistor N_2 may be used improve the conductivity of the PIP between L0 and L1 when Q is high (and Q-bar is at a lower voltage) and a low-to-high transition appears at L0 for transmission onto L1. Capacitance $C_P$ couples the low-to-high transition to the gate of N_2. N_3 had pre-established a slightly below threshold voltage on the gate of N_2 by virtue of N_3 having its drain coupled to the high Q, the source of N_3 being connected to the gate of N_2, and the gate of N_3 being coupled to $V_{DD}$, the high voltage rail of the device. The capacitively coupled low-to-high transition boosts the voltage of N_2's gate above threshold and turns N_2 on. This assists the normally slower P_1 device with passing the low-to-high transition from L0 to L1. As such P_1 can be made with a channel width that is comparatively smaller than the width used for the PMOS device in the PIP 395 of FIG. 3C.

Figure 4:
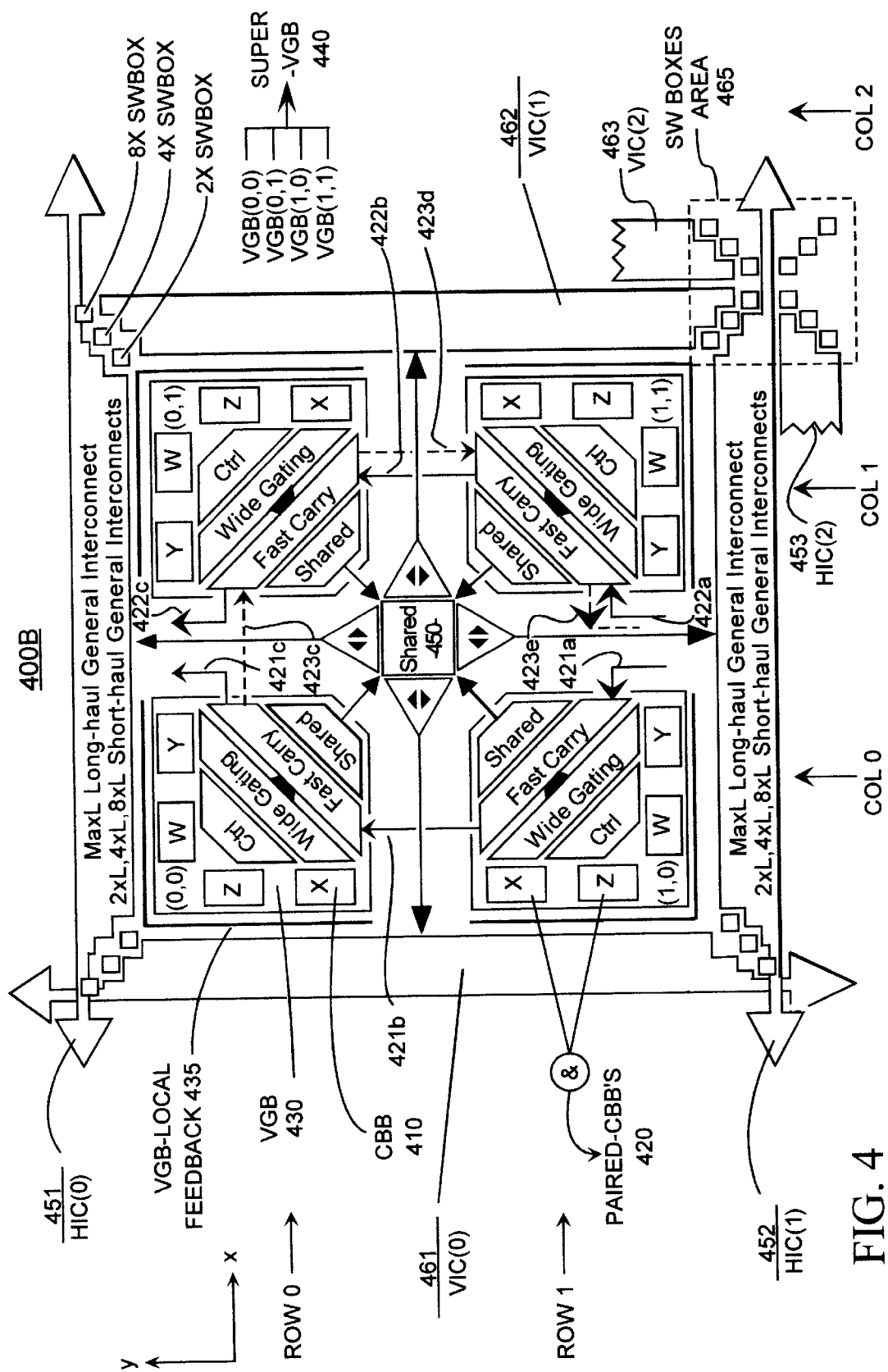
FIG. 4 illustrates more details of an L-organized super-VGB and surrounding inter-connect resources of an FPGA device in accordance with the present invention.

Referring now to FIG. 4, this figure provides a mid-scopic view of a novel, tile-able structure 400B in accordance with the present invention. By 'tile-able' it is meant that structure 400B is capable of being tiled across a plane to define a tightly packed matrix. The mid-scopic view of FIG. 4 is to be understood as being taken at a magnification level that is in between those of more microscopic views (such as that of FIG. 6) and more macroscopic views (such as that of FIG. 7). The more microscopic views reveal greater levels of detail which may not be seen in more macroscopic views. The more microscopic views reveal gross architectural features which may not be seen in more microscopic views. It is to be understood that for each more macroscopic view, there can be many alternate microscopic views and that the illustration herein of a sample microscopic view does not limit the possible embodiments of the macroscopic view.

The mid-scopic view of FIG. 4 shows four VGBs brought tightly together in mirror opposition to one another. The four, so-wedged together VGBs are respectively designated as (0,0), (0,1), (1,0) and (1,1). The four VGBs are also respectively and alternatively designated herein as VGB_A, VGB_B, VGB_C, and VGB_D.

Reference number 430 points to VGB_A which is located at relative row and column position (0,0). Some VGB internal structures such as CBBs Y, W, Z, and X are visible in the mid-scopic view of FIG. 4. Further VGB internal structures such as each VGBs common controls developing (Ctrl) section, each VGBs wide-gating supporting section, each VGBs carry-chaining (Fast Carry) section, and each VGBs coupling to a shared circuit 450 of a corresponding super-structure (superVGB) are also visible in the mid-scopic view of FIG. 4. The darkened connections between the carry-propagating and wide-gating sections indicates that some circuits may be shared in an overlapping manner between the two.

The mid-scopic view of FIG. 4 additional shows four inter-connect channels surrounding VGBs (0,0) through (1,1). The top and bottom, horizontally extending, inter-connect channels (HICs) are respectively identified as 451 and 452. The left and right, vertically extending, inter-connect channels (VICs) are respectively identified as 461 and 462. Two other inter-connect channels that belong to other tiles are partially shown at 453 and 463 so as to better illuminate the contents of switch boxes area 465. Switch boxes area 465 contains an assortment of 2×L switch boxes, 4x switch boxes and 8x switch boxes.

As seen broadly in FIG. 4, the group of four VGBs, (0,0) through (1,1) are organized in mirror image relationship to one another relative to corresponding vertical and horizontal centerlines (not shown) of the group and even to some extent relative to diagonals (not shown) of the same group. Vertical and horizontal inter-connect channels (VICs and HICs) do not cut through this mirror-wise opposed congregation of VGBs. As such, the VGBs may be wedged-together tightly.

VGB(0,1) may be generally formed by flipping a copy of VGB(0,0) horizontally. VGB(1,1) may be similarly formed by flipping a copy of VGB(0,1) vertically. VGB(1,0) may be formed by flipping a copy of VGB(1,1) horizontally, or alternatively, by flipping a copy of VGB(0,0) vertically. The mirror-wise symmetrical packing-together of the four VGBs (0,0 through 1,1) is referred to herein as a 'Super Variable Grain Block' or a super-VGB 440.

In a preferred embodiment, the mirror symmetry about the diagonals of the super-VGB is not perfect For example, there is a Fast Carry section in each VGB that allows VGBs to be chained together to form multi-nibble adders, subtractors or counters. (A nibble is a group of 4 bits. A byte is two nibbles or 8 bits. A counter generally stores and feeds back its result so as to provide cumulative addition or subtraction.) The propagation of rippled-through carry bits for these Fast Carry sections is not mirror wise symmetrical about the diagonals of each super-VGB 440. Instead it is generally unidirectional along columns of VGBs. Thus, CBBs X, Z, W, and Y are not interchangeable for all purposes.

The unidirectional propagation of carry bits is indicated for example by special direct connect lines 421*a*, 421*b* and 421*c* which propagate carry bits upwardly through the Fast Carry portions of VGBs (0,0) and (1,0). The unidirectional propagation is further indicated by special direct connect lines 422*a*, 422*b* and 422*c* which propagate carry bits upwardly through the Fast Carry portions of VGBs (0,1) and (1,1).

Such unidirectional ripple-through of carry bits may continue across the entire FPGA device so as to allow addition, subtraction or count up/down results to form be in bit aligned fashion along respective columns of the FPGA device. Bit aligned results from a first set of one or more columns can be submitted to other columns (or even resubmitted to one or more columns of the first set) for further bit aligned processing.

Consider an example where a plurality of VGBs in column 0 produce a sum or difference result of the form A±B where A is a first binary number that is input to that column 0 and B is a second binary number that is input to column 0. Each VGB holds 4 bits or a nibble's worth of the result signal as will be explained later. Assume that at the same time, plural VGBs of column 2 (not fully shown) are producing a sum or difference result of the form C±D where C is a third binary number and D is a fourth binary number.

In this example, respective bits $A_i$ and B$i$ are added together (or subtracted if the latter operation is instead called for by an operation-controlling input term) in a corresponding row i of VGBs. Respective bits $C_i$ and $D_i$ are added together (or subtracted) in the same row i, but at a different column (e.g., column 2). Then the results of columns 0 and 2 are folded horizontally by direct-connect signal transfer to become inputs of a third column (e.g., column 1). The third column can then be programmed to produce a next level result, such as (A±B)±(C±D) for example, because the significances of all numbers run in the same direction across the FPGA.

In an alternate embodiment, propagation of rippled-through carry bits is zig-zagged through successive columns of VGBs as indicated by the dashed direct connect lines 423*c*, 423*d* and 423*e*. This alternate, zig-zagging design allows large binary numbers (e.g., A, B) to be folded bidirectionally along plural columns of VGBs. In this zig-zagged design, the carry bits ripple up a first column (e.g., col. 0), cross over at the top of the zig-zag (e.g., at 423*c*) to the next successive column (e.g., col. 1), and then ripple down that next successive column. The following sequence of carry-propagation through lines (and of course, through their respective, carry-processing sections) is an example of zig-zagged flow: 421*a*, 421*b*, 423*c*, 423*d* and 423*e*. If desired, the zig-zagging can continue at the bottom of the down-rippling column with a further cross over of carry propagation to another up-rippling column. Cyclical algorithms may also be implemented where the cross over of carry propagation returns to the bottom of the initial up-rippling column after hitting bottom in a last down-rippling column. The zig-zagging path of carry propagation can be fixed (via direct connect lines) or made programmable. The programmable approach is less preferred because it tends to provide slower propagation speed for the forward-rippling carry bits.

Figure 5A:
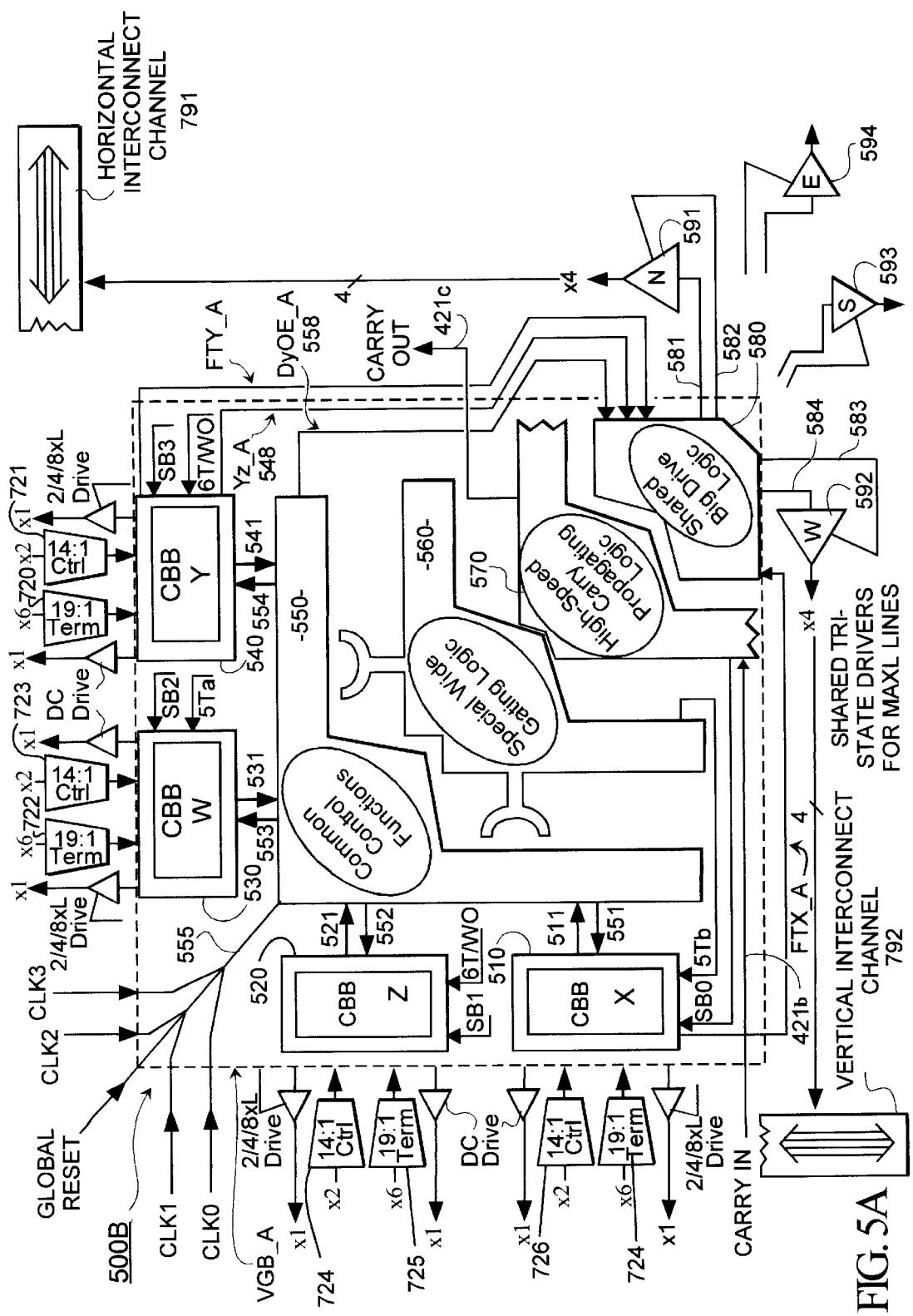
FIG. 5A shows further details of L-organization within a quadrant of an super-VGB structure such as that shown in FIG. 4.

Referring to FIG. 5A, a few more examples of the imperfect symmetry will be gleaned from this more microscopic view before returning to FIG. 4. Note that element 510 (which is also referred to as the X CBB) receives a sum bit SB0 from carry-chaining section 570. This SB0 bit represents the least significant result bit of an addition or subtraction operation that starts in CBB 510 and completes in section 570. Element 520 (the Z CBB) likewise receives a next more significant sum bit SB1 from section 570. Element 530 (the W CBB) receives a yet more significant sum bit SB2 from section 570. And element 540 (the Y CBB) receives the most significant sum bit SB3 of the VGB from section 570. Each of CBBs 510–540 has the capability to output its respectively received sum bit SB0–SB3 to points outside the VGB via direct connect drive amplifiers and also via tri-state drive amplifiers. Given that bits SB0 through SB3 have different significances, it is seen that CBBs 510–540 are not always swappable on a mirror symmetrical basis. The mode wherein CBBs 510–540 are operating as part of an adding or subtracting or counting chain is one example.

It is also seen in FIG. 5A that CBBs 520 and 540 commonly receive a same synthesized signal designated as '6T/WO' while CBBs 510 and 530 respectively receive separate synthesized signals designated as '5Ta' and '5Tb'. This is another example of imperfect mirror symmetry as it applies to a wide-gating functionality. The 6T/WO signal can be a function of as many as 16 input terms of the VGB while each of the 5Ta and 5Tb signals is a function of no more than 5 input terms of the VGB.

Returning to the more macroscopic view of FIG. 4, it is seen that the L-shaped internal structure of each VGB (which structure includes the X, Z, W, and Y Configurable Building Blocks) neighbors an intersection of orthogonally extending inter-connect resources (channels). One example of such an orthogonal intersection is the crossing of HIC(0) —which Horizontal Inter-connect Channel is also referenced as 451—with VIC(0), where the latter Vertical Inter-connect Channel is also referenced as 461. Other such orthogonal intersections occur at the following respective crossings: 451–462, 452–461 and 452–462.

The southeast quadrant of the 451–461 intersection is neighbored by the L-shaped internal structure of VGB(0,0). The southwest quadrant of the 451–462 intersection is neighbored by the L-shaped internal structure of VGB(0,1). The northeast quadrant of the 452–461 intersection is neighbored by the L-shaped internal structure of VGB(1,0). And the northwest quadrant of the 452–462 intersection is neighbored by the L-shaped internal structure of VGB(1,1).

The X and Z CBBs define a vertical first leg of the L-structure of their respective VGB. The W and Y CBBs define a horizontal second leg of the L-structure.

CBBs W and Y are basically the same but do not have to be entirely the same. As explained above, there are some input and output capabilities which the W CBB may have that the Y CBB does not have, and vice versa. For example, in the embodiment of FIG. 5A it is seen that W receives a wide-gated signal, 5Ta, while Y does not. Y receives a wide-gated signal, 6T/WO, while W does not. CBB Y couples by way of so-called feedthrough lines (FTY) to section 580 while CBB W does not.

Note in FIG. 4 that the placement of W and Y is flipped when going from VGB(0,0) to VGB(0,1). The placement of W and Y is similarly flipped when going from VGB(1,0) to VGB(1,1). That places the FTY-possessing, Y CBBs of different VGBs adjacent to one another. Such adjacent Y CBBs may be folded together with the aid of a DyOE control signal.

Just as with W and Y, the X and Z CBBs are basically the same but do not have to be entirely the same. There are some input and output capabilities that X may have which Z does not, and vice versa. See FIG. 5A. One of those differences in the embodiment of FIG. 5A is that the X CBBs couple by way of respective feedthrough lines (FTX) to section 580 while the Z CBBs do not. Mirror opposed symmetry of the VGBs in each super-VGB means that the FTX-possessing, X CBBs of different VGBs are placed adjacent to one another. Such adjacent X CBBs may be folded together with the aid of a DyOE control signal.

Figure 6:
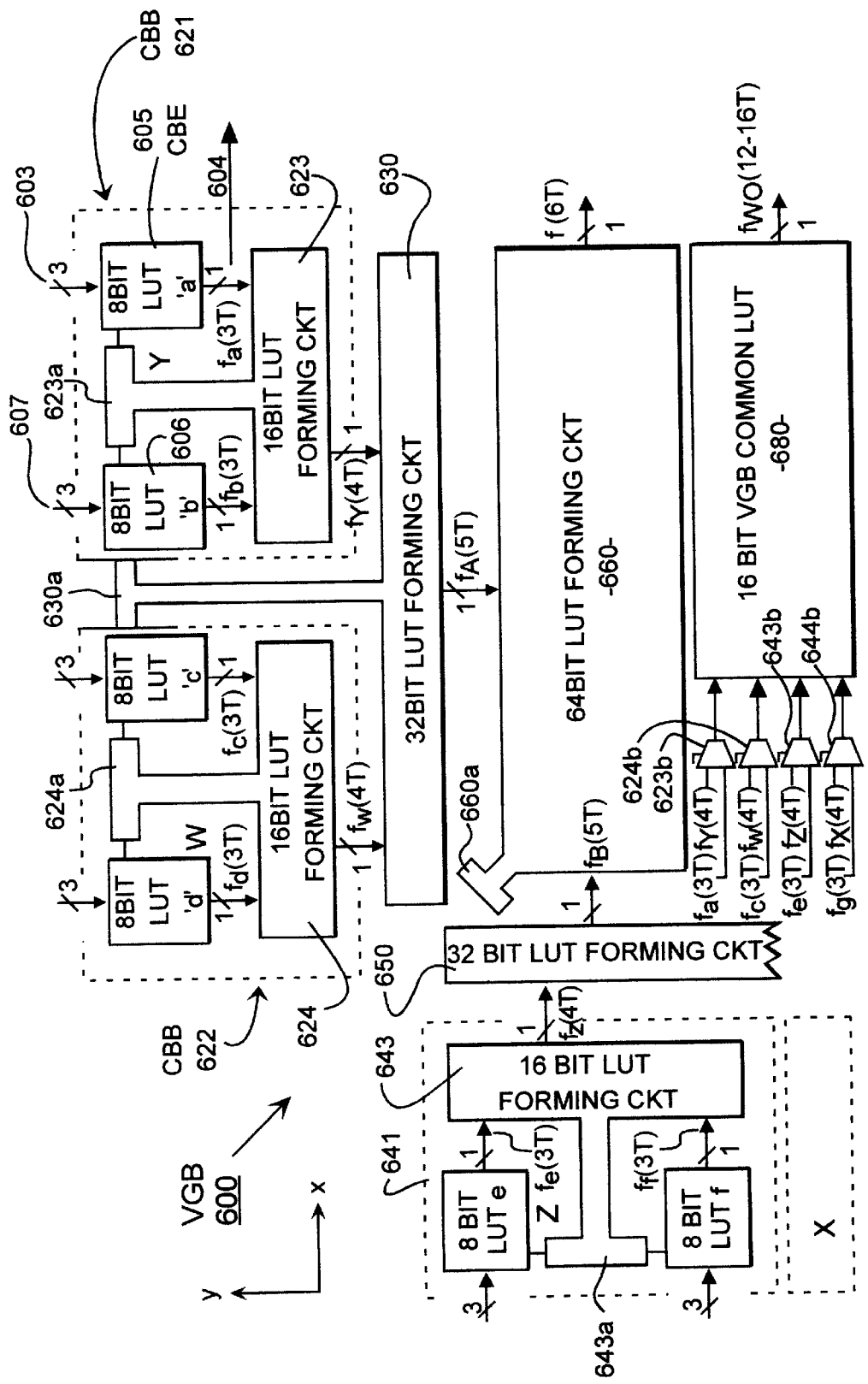
FIG. 6 illustrates how resource folding develops fractally using multiple LUTs of an L-organized, Variable Grain Block (VGB) in accordance with the invention.

Referring to FIG. 6, the illustrated VGB 600 includes four Configurable Building Blocks (CBBs). CBB 621 (Y) is shown to contain two 8-bit LUTs, respectively identified as 'a' on the right and 'b' on the left. The designation, '8-bit LUT' means here that there are eight memory bits each programmable by the user of the FPGA. There a three input terms supplied into the 8-bit LUT for selecting one of the $2^3$ memory bits as the value to be output. The output signal of LUT 'a' is denoted as $f_a(3T)$. This notation indicates that $f_a(\ldots)$ is a function of 3 input terms (3T). The output signal of LUT 'b' is similarly denoted as $f_b(3T)$.

LUT 'a' defines part of a first Configurable Building Element (CBE) 605. The CBE 605 further includes an input term acquiring means 603 for selectively acquiring at least some of its input terms. A more detailed example of such an input term acquiring means is a set of three of the 19-to-one (19:1) input term multiplexers shown in FIGS. 5A and 9. Three such 19:1 multiplexers can be used to selectively connect to as many as 57 adjacent inter-connect lines (AIL#). In one embodiment, however selective connectivity is provided to 56 AIL# with two of the multiplexers offering redundant connectivity to one of the 56 AIL#. See FIG. 9.

CBE 605 of FIG. 6 is shown to be connectable to an output exporting means 604 for transmitting a result signal $f_a(3T)$ derived from its LUT 'a' out of the VGB. A more detailed example of such an output exporting means is the Configurable Sequential Element (CSE) shown in FIG. 5B, to be discussed later.

Figure 5B:
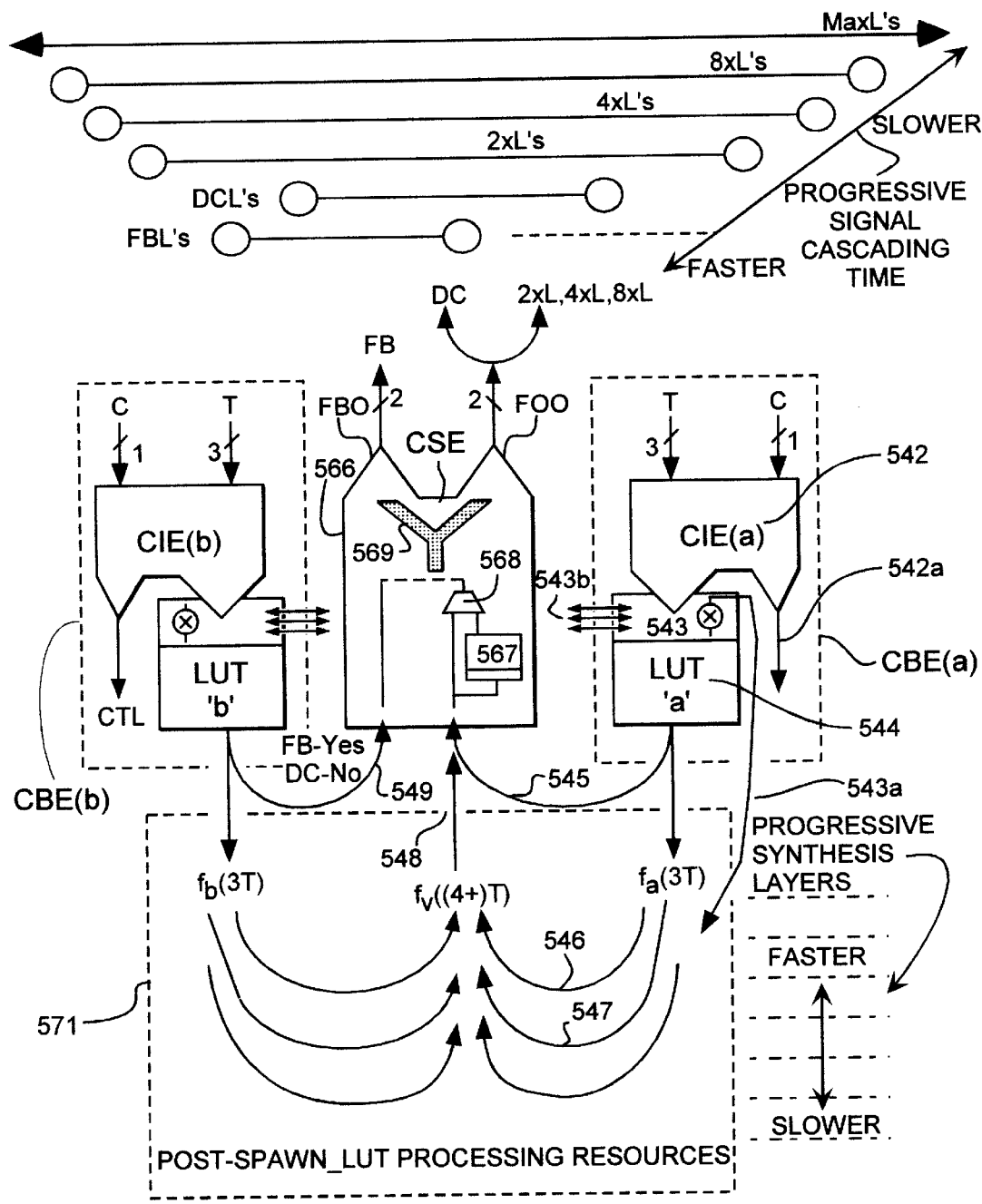
FIG. 5B illustrates selected parts of a CBB, and selected parts of its encompassed pair of CBEs, and schematics for surrounding function synthesizing structures and immediately neighboring inter-connect lines.

Further in FIG. 6, the second LUT 'b' is understood to similarly define part of a second CBE 606. The second CBE 606 has its own input term acquisition means 607. However, second CBE 606 is connectable to the output exporting means 604 for transmitting its result signal $f_b(3T)$ derived from LUT 'b' out of the VGB. Thus, output exporting means 604 is a resource that is shared by CBEs 605 and 606. FIG. 5B shows one embodiment of such sharing of a Configurable Sequential Element(CSE) between two CBEs.

CBB 622 (W) of FIG. 6 is shown to also have two 8-bit LUTs like those of CBB 621. The LUTs of the W CBB are respectively identified as 'c' on the right and 'd' on the left. The output signal of LUT 'c' is denoted as $f_c(3T)$ while the output signal of LUT 'd' is denoted as $f_d(3T)$.

A first combining circuit 623 is provided within CBB 621 (Y) for selectively folding together the resources of 8-bit LUTs 'a' and 'b' and thereby allowing the Y CBB to behave as if it contained a 16-bit LUT instead of just two 8-bit LUTs. The output signal of this emulated 16-bit LUT is denoted as $f_Y(4T)$.

Similarly, a second combining circuit 624 is provided within CBB 622 (W) for selectively folding the resources of 8-bit LUTs 'c' and 'd' and thereby allowing the W CBB to behave as if it contained a 16-bit LUT. The output signal of this emulated 16-bit LUT is denoted as $f_W(4T)$.

Although it is not explicitly shown in FIG. 6 —except for the example at 604—each of the LUT output signals, $f_a(3T)$, $f_b(3T)$, $f_c(3T)$, $f_d(3T)$, $f_Y(4T)$ and $f_W(4T)$ may be selectively output from the VGB 600 or such signals may used for feedback purposes within the VGB. VGB local feedback buses such as the L-shaped structure shown at 435 in FIG. 4 allow for high-speed transmission from one CBE/CBB to a next within a same VGB, of the LUT output signals $f_a(3T)/f_Y(4T)$ produced by each CBE/CBB. FIG. 5B indicates how each CSE can drive the local feedback lines (FBLs) of its respective VGB and also drive adjacent direct connect lines (DCLs) and further drive bidirectional interconnect lines of assorted lengths (2×L's, 4×L's and 8×L's) that are immediately adjacent to the CSE. Once a CSE sourced signal is placed on the local feedback lines (FBLs) of its VGB, the so-directed signal can be quickly propagated for cascading into a next CBE and/or CBB of the same VGB.

The soon described, other function output signals of FIG. 6, namely: $f_e(3T)$, $f_f(3T)$, $f_g(3T)$, $f_h(3T)$, $f_Z(4T)$, $f_X(4T)$ $f_A(5T)$, $f_B(5T)$, $f(6T)$, and $f_{WO}(12-16T)$ may also be so selectively output from the VGB for coupling to adjacent FBLs, DCLs, 2×L's, 4×L's and 8×L's.

Each of combining circuits 623 and 624 has a pre-LUT decoding section and a post-LUT processing section. The pre-LUT decoding sections are used to selectively perform a certain amount of input signal decoding which is needed to make the smaller-sized LUTs a/b and c/d combine to behave as larger-sized LUTs. Accordingly, each of combining circuits 623 and 624 is shown to have a respective, pre-LUT decoding section, 623a and 624a, which extends to intercept and decode the 3 input signals of each CBE. When they are not intercepted, the 3 input bits of each CBE flow into their respective LUT (a, b, c or d). However, when selectively-activated interception occurs, 3 input terms of one 8-bit LUT in the a/b or c/d pairs are copied as inputs to the other LUT. At the same time, two others of the original 6 input terms that are respectively submitted to the a/b or c/d pair are ignored. The sixth input term is used for selecting the output of one or the other LUT in each of the a/b or c/d pair so that the resultant 16-bit LUT appropriately responds to four of the six (=3+3) original input bits. A circuit for carrying out such a decoding scheme is seen at 1023 of FIG. 9.

The post-LUT processing section of each of combining circuits 623 and 624 includes a multiplexer that receives $f_a(3T)$ and $f_b(3T)$ {or $f_c(3T)$ and $f_d(3T)$} as its inputs and selects one of these for its output in response to the intercepted, sixth input bit. The sixth input bit thereby functions as the most significant address bit of the emulated 4-input LUT in this mode.

The joining together of two 8-bit LUTs to emulate a 16-bit LUT defines a first level of resource folding or function synthesis. At the next level of resource folding, a third combining circuit 630 is provided to combine the operations of the Y CBB 621 and W CBB 622 such that the four 8-bit LUTs of the combined CBBs 621–622 behave as a single, 32-bit LUT. Again, some input decoding is needed to emulate this behavior and hence, the third combining circuit 630 is shown to have a pre-LUT decoding section 630a extending up to selectively intercept and manipulate the 12 input bits of LUTs 'a' through 'd'. The post-LUT processing section of combining circuits 630 includes a multiplexer that receives $f_Y(4T)$ and $f_W(4T)$ as its inputs and selects one of them for its output. The output signal of the emulated 32-bit LUT is denoted as $f_A(5T)$.

When the third combining circuit 630 is used to emulate the 32-bit LUT operation, each of the four 8-bit LUTs in the Y-W duet (621-622) is 'consumed' and thus not available at the same time for different duties. This is an example of a folding operation that combines and consumes the available resources along a single leg of the L-organized VGB (the horizontal leg in the instance of the just discussed Y-W duet).

Just as the resources of Y-W duet can be folded to provide operations emulating that of a 32-bit LUT or that of two 16-bit LUTs, the resources of the X and Z CBBs can also be selectively folded together to provide such CBB and paired-CBBs operations.

FIG. 6 shows only the Z CBB 641 including a 16-bit LUT forming circuit 643 coupled to the two 8-bit LUTs, 'e' and 'f' within Z. It is understood that a like-structured, X CBB (partially shown) is placed below the Z CBB in FIG. 6 with similar resources including two 8-bit LUTs, 'g' and 'h'. A 32-bit LUT forming circuit 650 (partially shown) combines the operations of the Z and X CBBs to generate the illustrated five-term function signal, $f_B(5T)$.

It should now be understood that each of the 32-bit LUT forming circuits, 630 and 650, fractally repeats the resource folding operations of its respective 16-bit LUT forming circuits. This process of fractal folding is repeated yet again by a 64-bit LUT forming circuit 660 that is provided within each VGB. Circuit 660 can selectively fold together the resources of the Y-W duet and the resources of the X-Z duet to emulate a 64-bit LUT. Again, some input decoding is needed to emulate this behavior and hence, combining circuit 660 is shown to have a pre-LUT decoding section 660a extending diagonally out to selectively intercept and manipulate the 24 input bits of LUTs 'a' through 'h'. The post-LUT processing section of combining circuits 660 includes a multiplexer that receives $f_A(5T)$ and $f_B(5T)$ as its inputs and dynamically selects one of them for its output. The output signal of the emulated 32-bit LUT is denoted as $f(6T)$. This $f(6T)$ signal can be any Boolean function of up to 6 independent input term signals. (When used herein, the phrase 'dynamically select' indicates run-time selection within an operating FPGA as opposed to the static, configuration-time selection that occurs when the configuration memory of a blank FPGA is being configured by FPGA configuring software.)

The 64-bit LUT forming operation of combining circuit 660 constitutes one example of how the resources of each of the legs in the L-organization of a VGB are merged, first leg by leg, and thereafter centrally, to provide more complex levels of functionality.

Merged functionality within each VGB can also include a cascading of outputs from one or more of the peripheral lookup tables 'a' through 'h' to a centrally-located LUT 680. Such an LUT is shown as 16-bit VGB common LUT 680 within VGB 600. A selectable four of the following signals may be fed into the 4 inputs of the 16-bit VGB common LUT 680: $f_a(3T)$, $f_c(3T)$, $f_e(3T)$, $f_g(3T)$, $f_Y(4T)$, $f_W(4T)$, $f_Z(4T)$ and $f_X(4T)$. In response, the VGB common LUT 680 produces a higher-ordered function signal denoted as $f_{WO}$ (12–16T). The number of input terms that contribute to $f_{WO}(12-16T)$ can be as large as 16 terms when the four higher ordered signals, $f_Y(4T)$, $f_W(4T)$, $f_Z(4T)$ and $f_X(4T)$ are selected. Signal $f_{WO}(12-16T)$ is also referred to herein as the special wide output (WO) signal. Unlike $f(6T)$, the $f_{WO}$ (12–16T) signal can represent only a partial subset of all Boolean functions of the corresponding 12 to 16 input term signals.

In the illustrated embodiment, multiplexer 623b selects one of signals $f_a(3T)$ and $f_Y(4T)$ as a first input for LUT 680. Multiplexer 624b selects one of signals $f_c(3T)$ and $f_W(4T)$ as a second input for LUT 680. Multiplexer 643*b* selects one of signals f$_e$(3T) and f$_z$(4T) as a third input for LUT 680. Multiplexer 644*b* selects one of signals f$_g$(3T) and f$_x$(4T) as a fourth input for LUT 680. The respective select controls for multiplexers 623*b*, 624*b*, 643*b* and 644*b* can be driven by configuration memory bits (fuses) or by dynamic signals or by both.

In one embodiment, multiplexers 623*b*, 624*b*, 643*b*, 644*b* each define the f(4T) generating multiplexer of respective combining circuits 623, 624, 643 and 644 (the last one understood to be in CBB X which is not shown). In that embodiment, multiplexer 623*b* receives signals f$_a$(3T) and f$_b$(3T) at its inputs instead of the illustrated f$_a$(3T) and f$_X$(4T). When the select control of 623 is driven by a dynamic signal, the output of 623 corresponds to f$_X$(4T). When the select control of 623 in that embodiment is instead overriding-wise driven by a fuse (a configuration memory bit), the dynamic signal is blocked and the output of 623 consistently (statically) represents f$_a$(3T). The select controls of remaining multiplexers 624*b*, 643*b* and 644*b* are similarly driven by a combination dynamic signal and fuse in that embodiment.

From the above, it is seen that the VGB 600 of FIG. 6 offers a wide spectrum of output choices spanning from that of outputting many low-termed function signals such as f$_a$(3T) through f$_h$(3T) to that of outputting a high-termed function signal such as f(6T) or f$_{WO}$(12–16T). VGB 600 also offers a wide spectrum of inputting choices because functions of same complexity can be synthesized from input term signals that are acquired either from a first side (north) of VGB 600, or from a second side (west) of VGB 600, or from a combination of input term signals that are acquired from both the first and second sides (NW) of VGB 600.

FIG. 5A shows various details of a first Variable Grain Block 500B (also referred to as VGB_A) at a more microscopic viewing level than that of FIG. 4. It is understood that the other VGBs, namely, _B, _C and _D of each super-VGB have similar resources arranged in respective mirror-opposed symmetry with those of the illustrated VGB_A.

The common controls developing section 550 collects a first plurality of control signals 511, 521, 531 and 541 from respective CBBs 510 (X), 520 (Z), 530 (W), and 540 (Y). These control signals are acquired by way of respective, controls input multiplexers (14:1 Ctrl) of the respective CBBs X,Z,W,Y. There are two such controls input multiplexers (14:1 Ctrl) dedicated to each CBB. Each pair of controls input multiplexers may be considered part of the CBB to which they are dedicated as are the dedicated direct-connect (DC) drive amplifier, the 2/4/8×L drive amplifier, and the six 19:1 terms input multiplexers (19:1 Term) of each CBB. In FIG. 5B, each CIE such as 542 is shown to be responsible for acquiring one control signal and 3 input term signals from the adjacent inter-connect and/or VGB intraconnect resources.

The common controls developing section 550 of FIG. 5A further collects a second plurality of control signals 555 directly from the adjacent horizontal and vertical inter-connect channels (HIC and VIC) without using the signal selecting resources of the surrounding CBBs. Signals 555 include GR, CLK0, CLK1, CLK2 and CLK3. CLK0 and CLK1 are clock signals that come directly off the vertical inter-connect channel. CLK2 and CLK3 are clock signals that come directly off the horizontal inter-connect channel. GR is a Global Rest signal that is universally available to all VGBs and therefore has no directional constraints. It is accordingly shown as coming in diagonally into the VGB. Such diagonal disbursement of the GR signal is not generally the best way to distribute GR. It can be alternatively carried in one or both of the vertical or horizontal inter-connect channels. In one embodiment, the GR signal is carried by a dedicated GR longline provided in each of the VICs.

Common controls developing section 550 processes the collected signals 511, 521, 531, 541, and 555, and then returns corresponding common control signals back to the CBBs as indicated by return paths 551 through 554. In one embodiment, individual return paths 551–554 are replaced by a common return bus that transmits the same returned control signals to all the CBBs of the VGB 500B.

Common controls developing section 550 of VGB_A also produces a 'for-sharing' dynamic control signal 558 (DyOE_A) which signal is forwarded to the super-VGBs shared logic section 580. A portion of this shared logic section 580 is seen in FIG. 5A. It is understood that the common controls sections of the other VGBs within the subsuming super-VGB, namely VGBs: _B, _C, and _D, respectively supply additional for-sharing, dynamic control signals DyOE_B, DyOE_C and DyOE_D (not shown) to shared logic section 580.

Each CBB also directs at least one of its respective output signals to shared logic section 580. Line 548 which feeds signal Yz_A to 580 is an example. It is understood that the remaining CBBs, namely, X, Z, and W of the same VGB_A respectively feed signals Xz_A, Zz_A, and Wz_A to 580. It is further understood that the CBBs of the other VGBs within the subsuming super-VGB, namely VGBs: _B, _C, and _D, respectively supply additional signals of like designations, Xz_J, Zz_J, Wz_J, and Yz_J to their respective sections 580, where _J designates here the respective one of VGBs _B, _C, and _D.

The designation 'DyOE' for signals such as 558 is intended to imply here that such a signal performs an output enabling function and that such a signal additionally performs a dynamic selection function as will be seen later. The designation 'Yz_A' for signals such as 548 is intended to imply here that such a signal may be output by a tri-state amplifier (or another like device having a high-Z/high output-impedance state) such as the illustrated quartet of northern HIC-driving amplifiers 591 and/or such as the illustrated quartet of western VIC-driving amplifiers 592.

Selected ones of the Xz_J, Zz_J, Wz_J, and Yz_J signals may be routed to respective ones of input terminals (e.g., 581 and 584) of the longline driving amplifiers 591 through 594. At the same time, selected ones of the DyOE signals may be routed to respective ones of the output-enable control terminals (e.g., 582 and 583) of the longline driving amplifiers 591 through 594. Shared resources 591 through 594 may thus be used by any of the CBBs for outputting a result signal onto VGB-adjacent longlines. Although FIG. 5A only shows the programmable configurations of the respective northern quartet 591 and western quartet 592 of driving amplifiers to the north HIC and west VIC, it is understood that the southern quartet 593 and eastern quartet 594 of driving amplifiers similarly connect to a respectively adjacent, south HIC and east VIC.

FIG. 5A illustrates multiplexers 720–727 which cross with the locally-adjacent horizontal inter-connect channel 791 (HIC) and locally-adjacent vertical inter-connect channel 792 (VIC) in a partially populated manner. See FIG. 9.

By 'partially populating', it is meant here that, for example, HIC 791 contains more inter-connect lines than are connected to by any one of multiplexers 720 and 721. Each of multiplexers 720 and 721 contains a unique subset of programmable-inter-connect-points (PIPs) that form a partially-filled crossbar with HIC 791 rather than a fully-populated crossbar with HIC 791. Use of such partially-populated crossbars in place of fully-populated crossbars is known in the art. The advantage is reduced capacitive loading on the inter-connect lines. The disadvantage is reduced flexibility in choosing which inter-connect lines (of HIC 791) will serve as a source for an acquired control signal.

In the illustrated example, HIC 791 (the horizontal inter-connect channel) contains the following resources: eight double-length (2×L) lines, four quad-length (4×L) lines, four octal-length (8×L) lines, sixteen full-length (MaxL) lines, sixteen direct-connect (DC) lines, eight feedback (FB) lines and two dedicated clock (CLK) lines.

Figure 9:
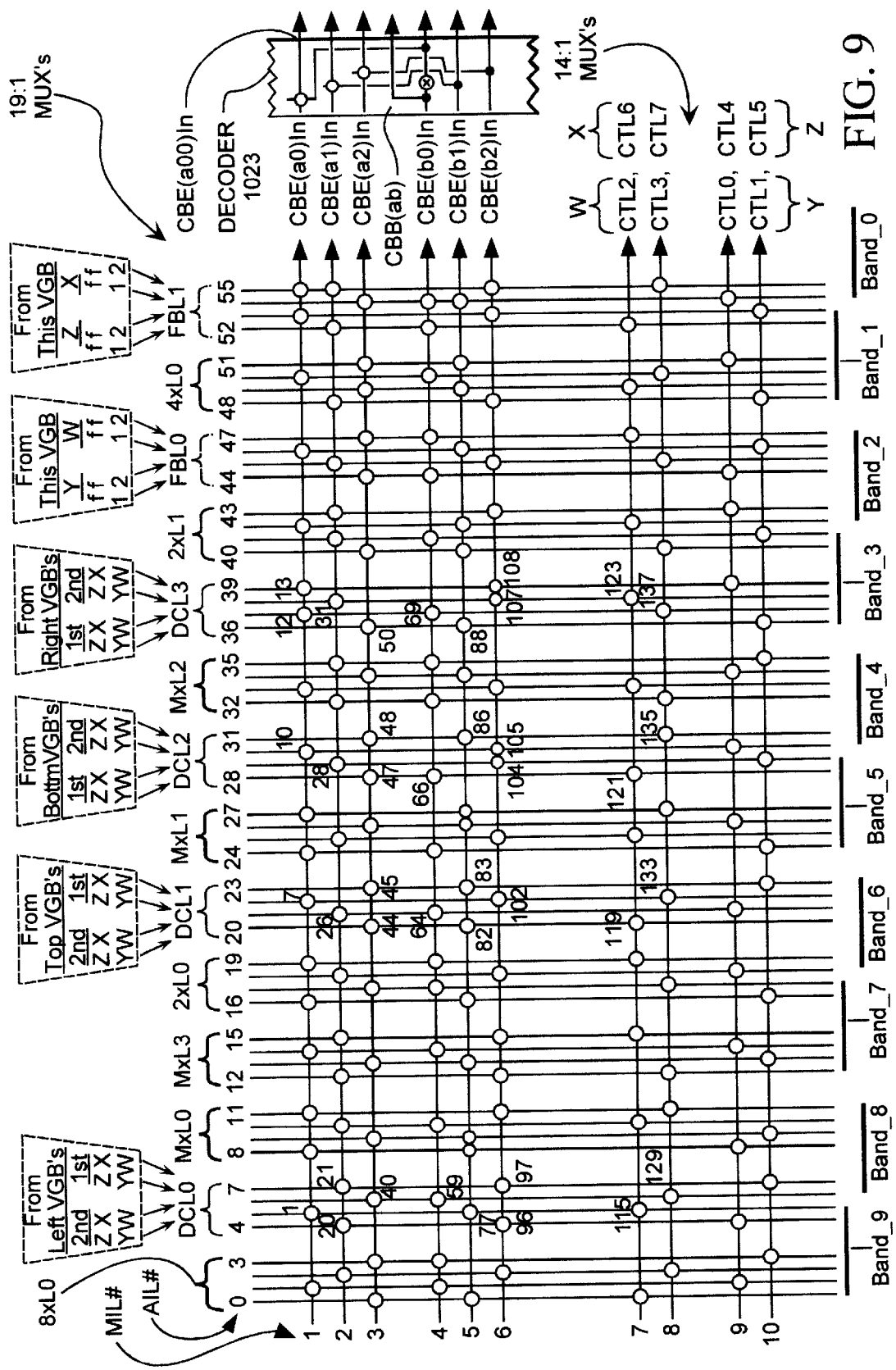
FIG. 9 illustrates a partial-populating scheme for the input-term and control-signal acquiring multiplexers of the respective X, Z, W, Y Configurable Building Blocks.

FIG. 9 illustrates one partial-populating scheme in accordance with the invention for the 56 lines of each HIC or VIC. It is within the contemplation of the invention to use other partial populating patterns. It is also within the contemplation of the invention to have overlap between acquirable line sets by using control acquiring multiplexers with more MIPs if desired, but of course that also increases space utilization within the integrated circuit.

Returning to FIG. 5B, there are further consequences that follow from the provision of function spawning resources (e.g., CBEs) at the periphery of the L-organized section of each VGB and from the progressive synthesis of more complex functions as one moves deeper into the VGB. More specifically, the signal propagation times that are associated with the steps of: (a) acquiring input-term signals from a first subset of inter-connect lines, (b) passing the acquired signals through one or more LUTs, and (c) returning LUT-derived result signals to other inter-connect lines, can vary depending on how much routing or other processing occurs before an input term is delivered to an LUT and how much further routing or other processing occurs after the LUT produces its result.

In FIG. 5B, the delay of input-term acquisition for a first CBE(a) is represented by CIE section 542. The delay of pre-LUT decoding is represented by section 543. (Section 543 includes a POP for blocking an intercepted input term signal 543*a* and forwarding that intercepted signal 543*a* to deeper synthesis layers. Section 543 further includes an inputs sharing means 543 which allows sharing of acquired input term signals between CBEs. These items are shown in FIG. 9.)

The delay of passing acquired input term signals through the respective LUT 'a' is represented by section 544 of FIG. 5B. Path 545 represents the quickest return path for directing the LUTs immediate-result signal $f_a(3T)$ back to a corresponding Configurable Sequential Element (CSE) 566.

Within the CSE 566, the signal carried by path 545 can then flow through a CSE-internal flip flop 567 or it can bypass the flip flop by way of multiplexer 568. The output of multiplexer 568 splits as indicated by Y-structure 569 for output to two feedback lines (FBLs) or for feedout (FOO) to a direct connect (DC) line or for feedout to assorted other inter-connect resources (the 2×L, 4×L and 8×L lines).

FIG. 5B shows the immediately-adjacent inter-connect and VGB-intraconnect resources arranged hierarchically according to relative transmission speeds. The generally fastest and/or shortest types of lines are drawn closest to the output ports (FBO/FOO) of the Configurable Sequential Element (CSE) while the generally slower and/or longer types of lines are drawn progressively further away. It is to be understood that signal transmission speed can be a function of drive power as well as line loading. Thus, the mere fact that a particular inter-connect line is shorter than another does not guarantee that the first will allow signals to get to their intended destinations faster than the second.

As seen in FIG. 5B, the VGBs local feedback lines (FBLs) typically define the shortest and least capacitively loaded inter-connect lines by way of which a result signal derived from one of the CBEs and/or CBBs can be cascaded to another CBE and/or CBB of the same Variable Grain Block. Because they generally have the lowest capacitive loading, the VGBs local feedback lines (FBLs) may be driven by a low fan-out output port of the CSE. This output port is designated as FBO. If speed is important, an LUT result signal may be cascaded via path 545 to a next such LUT (in the same VGB) by way of the FBO output port and by way of the corresponding, local feedback lines (FBLs) of the VGB.

The so-called direct connect lines (DCLs) are generally longer and/or more capacitively loaded than the FBLs. At the same time, the DCLs are generally shorter and/or less capacitively loaded than other inter-connect lines such as the illustrated 2×L lines, 4×L lines and 8×L lines. Because of this, a separate, appropriately-powered, line driving amplifier (see DC Drive in FIG. 5A) is provided within the feedout output port (FOO) for driving the DCLs. If the LUT result signal of short path 545 has to reach a point outside the local VGB but within reach of an immediately adjacent DCL, such forwarding of the signal via the DCLs is preferred when speed is of the essence. In one embodiment, each DC Drive amplifier is tuned so that CBE to CBE delay is essentially the same when routed either by way of the feedback lines (FBLs) or by way of the direct connect lines (DCLs).

The so-called bidirectional general inter-connect lines in the 2×L through 8×L categories are generally shorter and/or less capacitively loaded than the MaxL lines. Because of this, a separate, appropriately-powered, line drive amplifier (see 2/4/8×L Drive in FIG. 5A) is provided within the feedout output port (FOO) for driving the 2×L through 8×L categories of immediately adjacent lines. Each 2/4/8×L Drive amplifier is differently powered than a corresponding one of the DC Drive amplifiers.

The FPGAs maximum-length longlines or MaxL lines are the longest, and therefor generally most capacitively loaded of the inter-connect lines. Because of this, separate, appropriately-powered, line drive amplifiers (see 591–594 in FIG. 5A) are provided within the shared core of the super-VGB for driving the MaxL lines category of immediately adjacent lines. Each MaxL Drive amplifier is generally more powerful than a corresponding one of the 2/4/8×L Drive amplifiers.

FIG. 5B also shows the relative delay time of the progressive function synthesizing layers within the VGB. As indicated, the fastest turn around time is generally realized by routing the LUTs immediate-result signal $f_a(3T)$ immediately to the CSE 566 via path 545. If the LUTs immediate-result signal $f_a(3T)$ is to be further compounded with result signals derived from other LUTs in a post-LUT processing section 571, then the return of the correspondingly synthesized result signal, $f_x((4+)T)$ by way of path 548 can take longer.

Signal $f_x((4+)T)$ represents any one of earlier discussed, progressively synthesized signals such as $f_y(4T)$, or $f_A(5T)$ or $f(6T)$ or $f_{WO}(12-16T)$. The delay associated with the first level of post-LUT synthesis is represented by 546. The greater delay associated with more progressive levels of synthesis is represented by 547. The $f_x((4+)T)$ signal returned by path 548 can then flow through the CSEs flip flop 567 or bypass the flip flop by way of multiplexer 568 to reach output fanout section 569. Output fanout section 569 then forwards the synthesis result signal (545–547,549) for output from the CBB. The choice of subsequent forwarding lines (FBLs, DCLs, 2×L's, 4×L's, 8×L's, or MaxL's) that are used to further carry the signal forwarded by fanout section 569 is dependent on the progressive time delay factors described above for the $f_a(3T)$ signal.

In the particular embodiment of FIG. 5B, the 'b' CBE is not fully equivalent to the 'a' CBE. The fastest return path 549 of CBE(b) bypasses elements 567 and 568, goes directly to output structure 569. Signals returned by path 549 of this embodiment cannot feedout to a direct connect (DC) line although they can connect to an FB line or to one of the 2×L through 8×L lines.

It is within the contemplation of the invention however to alternatively have an arrangement wherein CBE(a) and CBE(b) do have identical access to all the output sequencing resources of the Configurable Sequential Element (566). In such alternative embodiments, a second flip flop such as 567 and a second bypass multiplexer such as 568 are provided for servicing CBE(b). The trade-off, of course is increased area utilization within the integrated circuit, which could lead to larger sized dies, and possibly lower yields in mass production.

Although not shown in FIG. 5B, signals returned by either of the 'a' or 'b' LUTs on respective paths 545, 549 or the $f_x((4+)T)$ signal of path 548 can be fed to the longest length inter-connect lines (MaxL lines) via the super-VGB shared drives.

Figure 7:
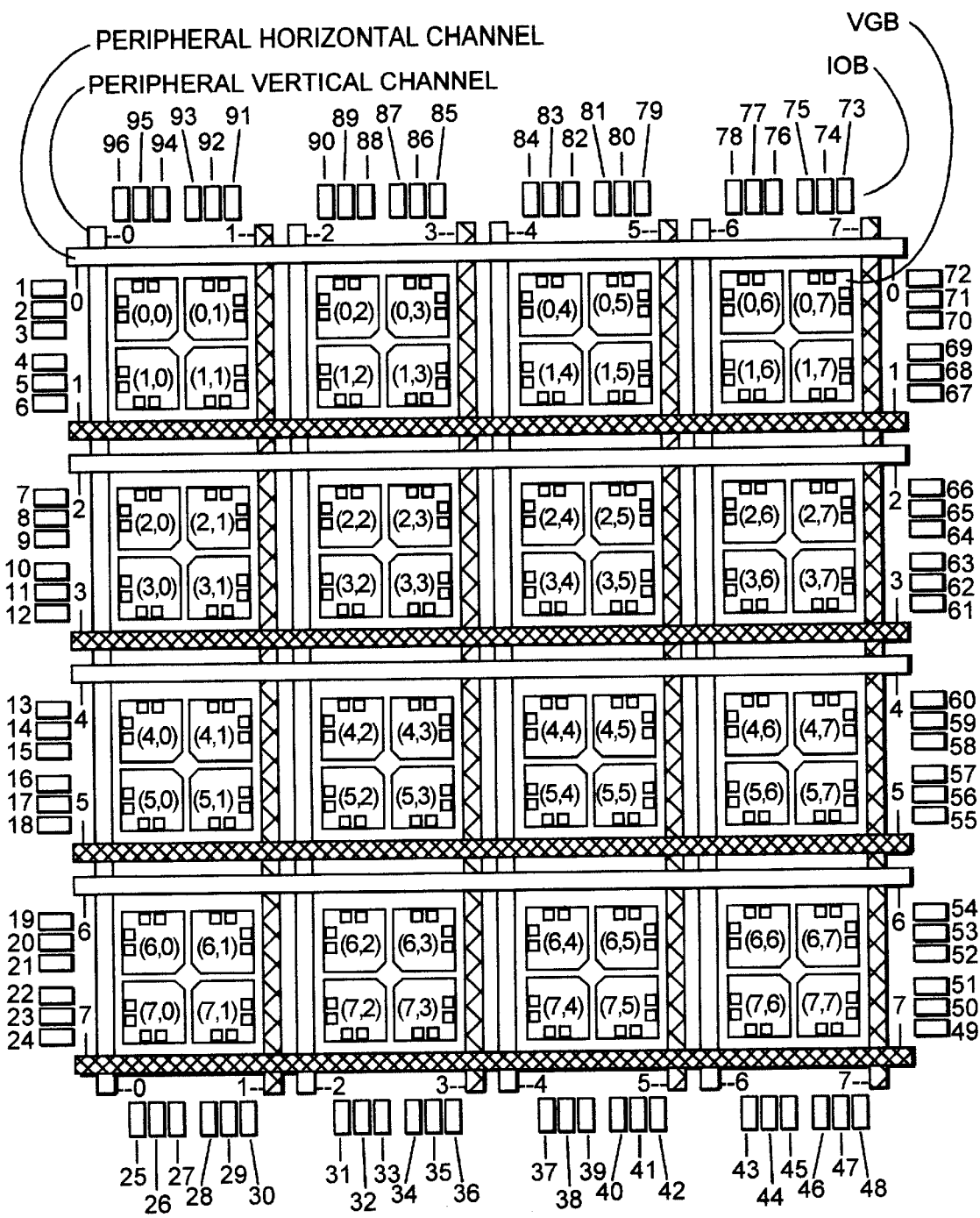
FIG. 7 illustrates a first FPGA in accordance with the invention having an 8×8 matrix of VGBs (a 4×4 tiled matrix of super-VGBs and surrounding inter-connect resources)

FIG. 7 shows a macroscopic view of an FPGA device 800 in accordance with the invention. The illustrated structure is formed on a monolithic integrated circuit. In one embodiment having a matrix of 20-by-20 VGBs, the integrated circuit is formed on a semiconductor die having an area of about 120,000 mils$^2$ or less. The integrated circuit includes at least five metal layers for forming inter-connect. The direct connect lines and longlines of the inter-connect are preferably implemented entirely by the metal layers so as to provide for low resistance pathways and thus relatively small RC time constants on such inter-connect lines. Logic-implementing transistors of the integrated circuit have channel lengths of 0.35 microns or less. Amplifier output transistors and transistors used for interfacing the device to external signals may be larger, however.

FPGA device 800 is defined as a regular matrix. In the illustrated embodiment there are four super-VGBs in each row and also four super-VGBs in each column. Each super-VGB contains four VGBs. Each super-VGB is bounded by two horizontal and two vertical inter-connect channels (HICs and VICs). This combination of super-VGB and surrounding inter-connect resources is tiled as seen. The tiling provides adjacent pairs of inter-connect channels within the core of the device 800. Peripheral channels (HIC0, HIC7, VIC0, VIC7) are not paired. Switch matrix boxes (not shown, see FIG. 8) are formed at the intersections at the respective vertical and horizontal inter-connect channels. In one embodiment, the switch matrix boxes use the bootstrapped transmission gate circuit of FIG. 3D for forming programmable configurations through such switch boxes.

At the periphery of the device 800, there are three input/output blocks (IOBs) for each row of VGBs and for each column of VGBs. The IOBs in the illustrated embodiment are shown numbered from 1 to 96. The VGBs are numbered according to their column and row positions. The centrally-shared resources of each super-VGB are represented by the diamond-shaped hollow at the center of each super-VGB. Longline driving amplifiers are understood to occupy these diamond-shaped hollows to have their respective outputs coupling vertically and horizontally to the adjacent HICs and VICs of their respective super-VGBs.

Each super-VGB in FIG. 7 has four CBBs along each of its four sides. The four CBBs of each such inter-connect-adjacent side of the super-VGBs can store a corresponding four bits of data in their respective CSEs so as to define a nibble of data for output onto the adjacent inter-connect lines. Each VGB contains four CBBs which can acquire and process a nibble's worth of data. One of these processes is nibble-wide addition within each VGB. Another of these processes is implementation of a 4:1 multiplexer. The presentation of CBBs in groups of same number (e.g., 4 per side of a super-VGB and 4 within each VGB) provides for a balanced handling of multi-bit data packets along rows and columns of the FPGA matrix. For example, nibbles may be processed in parallel by one column of CBBs and the results may be efficiently transferred in parallel to an adjacent column of CBBs for further processing. One more specific example is formation of a barrel-shifter in one or more columns of CBBs (using implemented 4:1 multiplexers) followed by formation of an adder with self feedback in an adjacent column of VGBs. The combination can define an efficiently packed, binary multiplier. The horizontal inter-connect can carry multiplication results in parallel to further, column oriented circuits as appropriate by way of a diversified set of different-length inter-connect lines.

Figure 8:
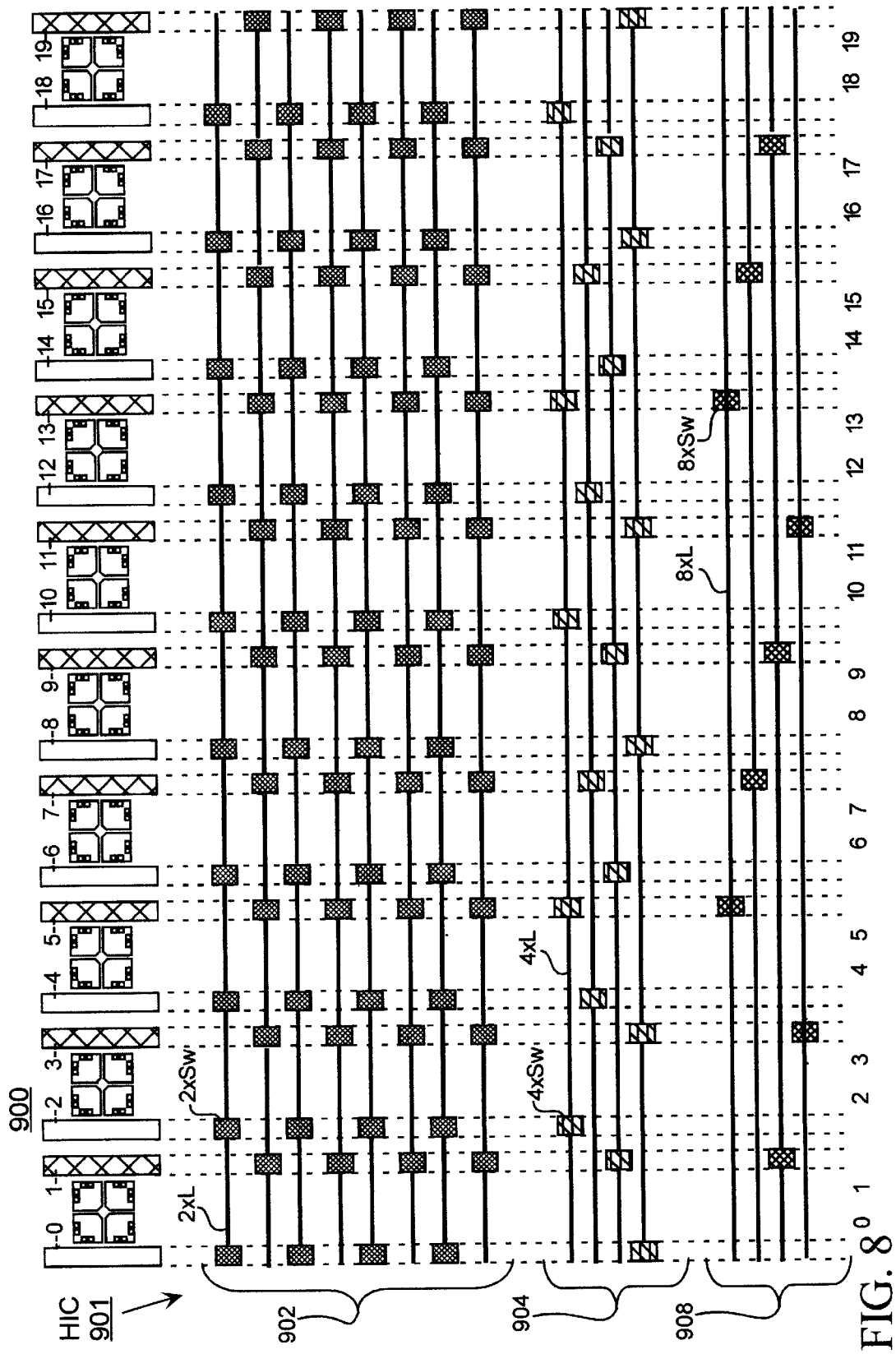
FIG. 8 shows a distribution of different-length horizontal inter-connect lines (2×L, 4×L, 8×L) and associated switch boxes as aligned relative to vertical inter-connect channels in a 20×20 matrix of VGBs (10×10 super-VGBs)

FIG. 8 shows a distribution 900 of different-length horizontal inter-connect lines (2×L, 4×L, 8×L) and associated switch boxes of a single horizontal inter-connect channel (HIC) 901, as aligned relative to vertical inter-connect channels in an FPGA of the invention. This particular FPGA has a 20×20 matrix of VGBs (10×10 super-VGBs). Core channels 1 through 18 are laid out as adjacent pairs of odd and even channels. Peripheral channels 0 and 19 run alone along side IOBs (See FIG. 7).

HIC 901 is understood to have 58 lines. However, only the eight 2×L lines, the four 4×L lines, and the four 8×L lines of HIC 901 are shown in FIG. 8.

Group 902 represents the 2×L lines of HIC 901 and their corresponding switch boxes. All 2×L lines span the distance of essentially two adjacent VGBs. Most 2×L lines terminate at both ends into corresponding 2× switch boxes (2xSw's). The terminating 2xSw boxes are either both in even-numbered channels or both in odd-numbered channels. Exceptions occur at the periphery where either an odd or even-numbered channel is nonexistent. As seen in embodiment 900, inter-connections can be made via switch boxes from the 2×L lines of HIC 900 to any of the odd and even-numbered vertical inter-connect channels (VICs) 0–19. 2×L lines may be used by adjacent quadruplets of CBBs for carrying out a through-the-AIL strapping function which is described below.

Group 904 represents the 4×L lines of HIC 901 and their corresponding switch boxes. Most 4×L lines span the distance of essentially four, linearly-adjacent VGBs and terminate at both ends into corresponding 4× switch boxes (4xSw's). The terminating 4xSw boxes are either both in even-numbered channels or both in odd-numbered channels. As seen in embodiment 900, inter-connections connections can be made via switch boxes from the 4×L lines of HIC 900 to any of the odd and even-numbered vertical inter-connect channels (VICs) 0–19.

Group 908 represents the 8×L lines of HIC 901 and their corresponding switch boxes. Most 8×L lines (7 out of 12) span the distance of essentially eight, linearly-adjacent VGBs. A fair number of other 8×L lines (5 out of 12) span distances less than that of eight, linearly-adjacent VGBs. Each 8×L line terminates at least one end into a corresponding 8× switch box (8xSw). The terminating 8xSw boxes are available in this embodiment only in the core odd-numbered channels (1, 3, 5, 7, 9, 11, 13, 15 and 17). Thus, in embodiment 900, inter-connections can be made via switch boxes from the 8×L lines of HIC 900 to any of the nonperipheral, odd-numbered vertical inter-connect channels (VICs).

Each VGB can be viewed as corresponding to 2 bits of produced data when considered one side (2 CBBs) at a time. Under this view, the 2×L lines can each supply a control or input term signal for producing nibble-wide (4-bits wide) result signals. Further under this view, the 4×L lines can each supply a control or input term signal for producing byte-wide (8-bits wide) result signals. And yet further under this view, the 8×L lines can each supply a control or input term signal for producing word-wide (16-bits wide) result signals.

Each VGB can be alternatively viewed as corresponding to 4 bits (one nibble) of produced data when considered two sides (4 CBBs) at a time. Under this alternate view, the 2×L lines can each supply a control or input term signal for producing byte-wide result signals. Further under this alternate view, the 4×L lines can each supply a control or input term signal for producing word-wide result signals. And yet further under this alternate view, the 8×L lines can each supply a control or input term signal for producing doubleword-wide (32-bits wide) result signals.

FIG. 9 illustrates a partial-populating scheme for the input-term and control-signal acquiring multiplexers of the respective X, Z, W, and Y Configurable Building Blocks of one embodiment in accordance with the invention The adjacent inter-connect lines (AIL) are respectively numbered as 0 through 55. The two dedicated CLK lines of each inter-connect channel and the additional GR line in each VIC are not included in this count. In one embodiment, AILs #0–55 represent inter-connect lines in the most immediately adjacent channel for each of CBBs X, Z, W, and Y.

In an alternate embodiment, AILs #0–55 represent inter-connect lines in the most immediately adjacent channel for each of CBBs X and Y while for the other CBBs, Z and W, the AILs #0–55 of FIG. 9 represent the inter-connect lines of the next adjacent channel. The exception is at the periphery of the matrix (see FIG. 7) where there is no next adjacent channel, in which case AILs #0–55 represent inter-connect lines in the most immediately adjacent channel also for CBBs Z and W. This alternate configuration allows each VGB to acquire input term signals and control signals from both the even-numbered and odd-numbered inter-connect channels that surround it. It is of course within the contemplation of the invention to have other configurations, such as for example wherein the CBBs that reach the most immediately adjacent channel are X and W rather than X and Y; and such as wherein the CBBs that reach the next adjacent channel are X and Y rather than Z and W.

Multiplexer input lines (MIL) are numbered in FIG. 9 as 1 through 10. MILs #1–3 correspond to the three 19:1 input term acquiring multiplexers of a first CBE (e.g., 'a') in each of the X, Z, W, Y CBBs. MILs #4–6 correspond to the three 19:1 input term acquiring multiplexers of a second CBE (e.g., 'b') in each of the X, Z, W, Y CBBs. MILs #7–8 correspond to the two 14:1 control signal acquiring multiplexers of each of the W and X CBBs. MILs #9–10 correspond to the two 14:1 control signal acquiring multiplexers of each of the Y and Z CBBs.

The illustrated partially-populated distribution of PIPs over the intersections of AILs #0–55 and MILs #1–10 should be self-explanatory in view of the legend shown in FIG. 3B.

AILs #0–3 represent the four 8×L lines in each inter-connect channel. AILs #4–7 represent a first group (DCL0) of four of the 16 direct connect lines in each inter-connect channel. The remaining DCLs are represented by the 20–23 (DCL1), 28–31 (DCL2) and 36–39 (DCL3) sets of AIL. AILs #8–11 represent a first group (M×L0) of four of the 16 MaxL lines in each inter-connect channel. The remaining M×Ls are represented by the 24–27 (M×L1), 32–35 (M×L2) and 12–15 (M×L3) sets of AIL.

AILs #16–19 represent a first group (2×L0) of four of the 8 2×L lines in each inter-connect channel. The other four 2×L lines are represented by the 40–43 (2×L1) group. AILs #44–47 represent a first group (FBL0) of four of the 8 feedback lines in each inter-connect channel. The other four feedback lines are represented by the 52–55 (FBL1) group. AILs #48–51 represent the four 4×L lines in each inter-connect channel.

Signal sources for the direct connect lines and the feedback lines are indicated respectively above corresponding AIL groups. In group DCL0 for example, AIL 7 is driven by either the X or the W DC driver of the neighboring VGB that is immediately to the left of the current VGB. AIL 6 is driven by either the Z or the Y DC driver of the neighboring VGB that is immediately to the left of the current VGB. AIL 5 is driven by either the X or the W DC driver of the next-adjacent VGB that is to the left of the current VGB. AIL 4 is driven by either the Z or the Y DC driver of the next-adjacent VGB that is to the left of the current VGB.

Each of MILs #0–6 is loaded by essentially the same number of 19 PIPs that form the corresponding 19:1 multiplexer. As such, there is roughly a same amount of signal propagation delay in going through each such multiplexer to the corresponding LUT. There is some additional delay or loading from PIPs and POPs that form the intervening decoder layer. A representative part of that layer is shown at 1023.

Note that for each of AILs #0–55 there are at least two PIP connections to two different MILs, one of which is placed in the MILs #1–3 set and another of which is in general, differently placed in the MILs #4–6 set. In other words, there are at least two possible MILs which can be used to acquire an input term signal moving along a given AIL and feed the acquired signal to one or the other of two possible LUTs ('a' or 'b'). Thus if one of the two 19:1 multiplexers that can couple to a given AIL is already consumed, or the corresponding LUT is already consumed, the FPGA configuring software has the possibility of alternatively using the other multiplexer and/or LUT for implementing a circuit chunk that requires a particular input term signal moving along the given AIL.

Each of AILs #54 and 55 have at least three PIP programmably configured connections to a respective three different MILs. Feedback signals from the f1 and f2 lines of the X CSE therefore have 3 possible ways of being transmitted into the respective MILs #1–6 inputs of any one of the X, Z, W, and Y Configurable Building Blocks of the same VGB. These MILs #1–6 inputs are alternatively named as CBE (a0)In, CBE(a1)In, CBE(a2)In, CBE(b0)In, CBE(b1)In, and CBE(b2)In in FIG. 9. Note that CBE(b0)In is different from the others in that a POP (Programmable Opening Point) is provided for it in decoder section 1023. CBB(ab) represents an intercepted signal that may be used for compounding or folding together the 'a' and 'b' parts of the corresponding CBB.

Note also that in the case where the PIPs of the signal-acquiring multiplexers of FIG. 9 are of the bidirectional type (e.g., FIGS. 3C or 3D), simultaneous activation of two or more PIPs on a same AIL (during FPGA configuration time), creates a bidirectional strapping inter-connection between the corresponding MIL of those PIPs. Such a use of the PIPs of the signal-acquiring multiplexers of FIG. 9 falls herein under the description, 'through-the-AIL strapping'. Not every embodiment however can use this kind of through-the-AIL strapping in a generic way to strap from one MIL to a next a signal that had been generically sourced onto a line other than the strapping AIL. One of the requirements is that the PIPs in the signal-acquiring multiplexers of FIG. 9 be conductive enough (large enough) to get signals through within the system-specified time. If these PIPs are too small, such use of through-the-AIL strapping should be avoided. On the other hand, if the signal that is being strapped onto the two MIL was sourced onto the strapping AIL from an appropriate AIL drive amplifier, the size of the PIPs of the signal-acquiring multiplexers of FIG. 9 should not be an impediment to carrying on through-the-AIL strapping because the drive amplifier is designed to drive the signal in timely fashion through those loads.

Note further that in the case where the PIPs of the signal-acquiring multiplexers of FIG. 9 are again of the bidirectional type (e.g., FIGS. 3C or 3D), simultaneous activation during FPGA configuration time of two or more PIPs on a same MIL (multiplexer input line), can create a bidirectional strapping inter-connection between the corresponding AIL of those PIPs. Such a use of the PIPs of the signal-acquiring multiplexers of FIG. 9 is referred to herein as 'through-the-MIL strapping'. The latter function may be particularly useful when a signal is being acquired via a direct connect line (DCL) from another VGB and it is desirable to simultaneously couple such a DCL-carried signal to another kind of AIL within the inter-connect channel, say to a vertical 2xL line when the direct connect source was a horizontally displaced VGB. Again, not every embodiment can use through-the-MIL strapping. If the PIPs of the signal-acquiring multiplexers are too small, and the DC drive amplifiers are not powerful enough to drive the added load, the through-the-MIL strapping function should be avoided and other means should be used for routing signals.

Figure 10:
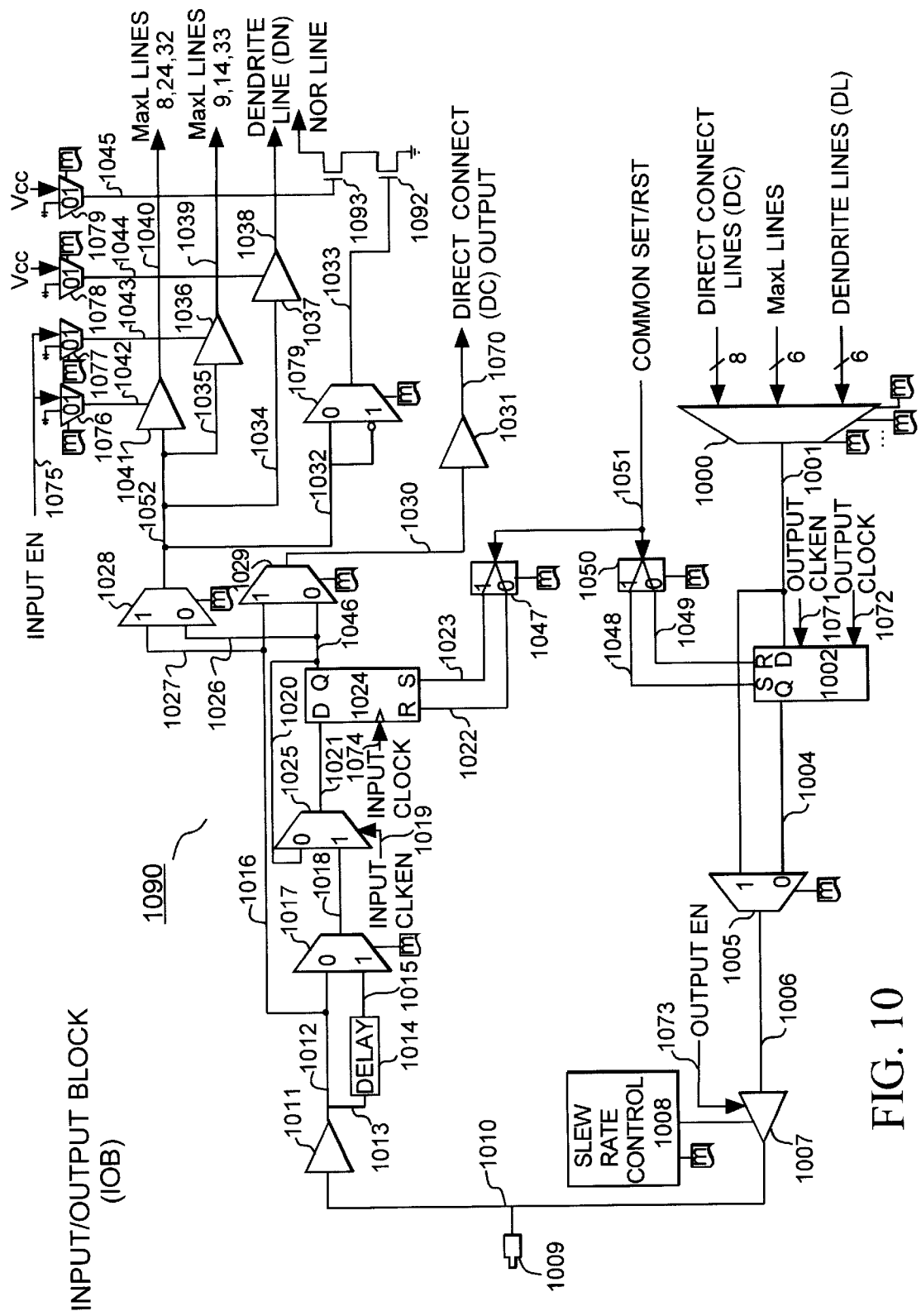
FIG. 10 illustrates an IOB architecture.

FIG. 10 illustrates an IOB 1090 corresponding to one of the 96 IOBs positioned on the periphery of FPGA device 800 illustrated in FIG. 8.

IOB 1090 provides a configurable inter-connection between the input/output pin 1009 and the inter-connect resources. The inter-connect resources may supply signals as inputs to IOB 1090. In particular, the inter-connect resources connected to input multiplexer 1000 include 8 direct connect (DC) lines, 6 MaxL lines, and 6 (DN) dendrite lines. The inter-connect resources connected to IOB outputs include two MaxL lines, one dendrite (DN) line, one NOR line, and one direct connect (DC) line. Line 1040 and 1039 are connected to MaxL lines. Line 1038 is connected to a dendrite (DN) line. Line 1033 controls a NOR line. Line 1070 is connected to a direct connect (DC) line.

Figure 13:
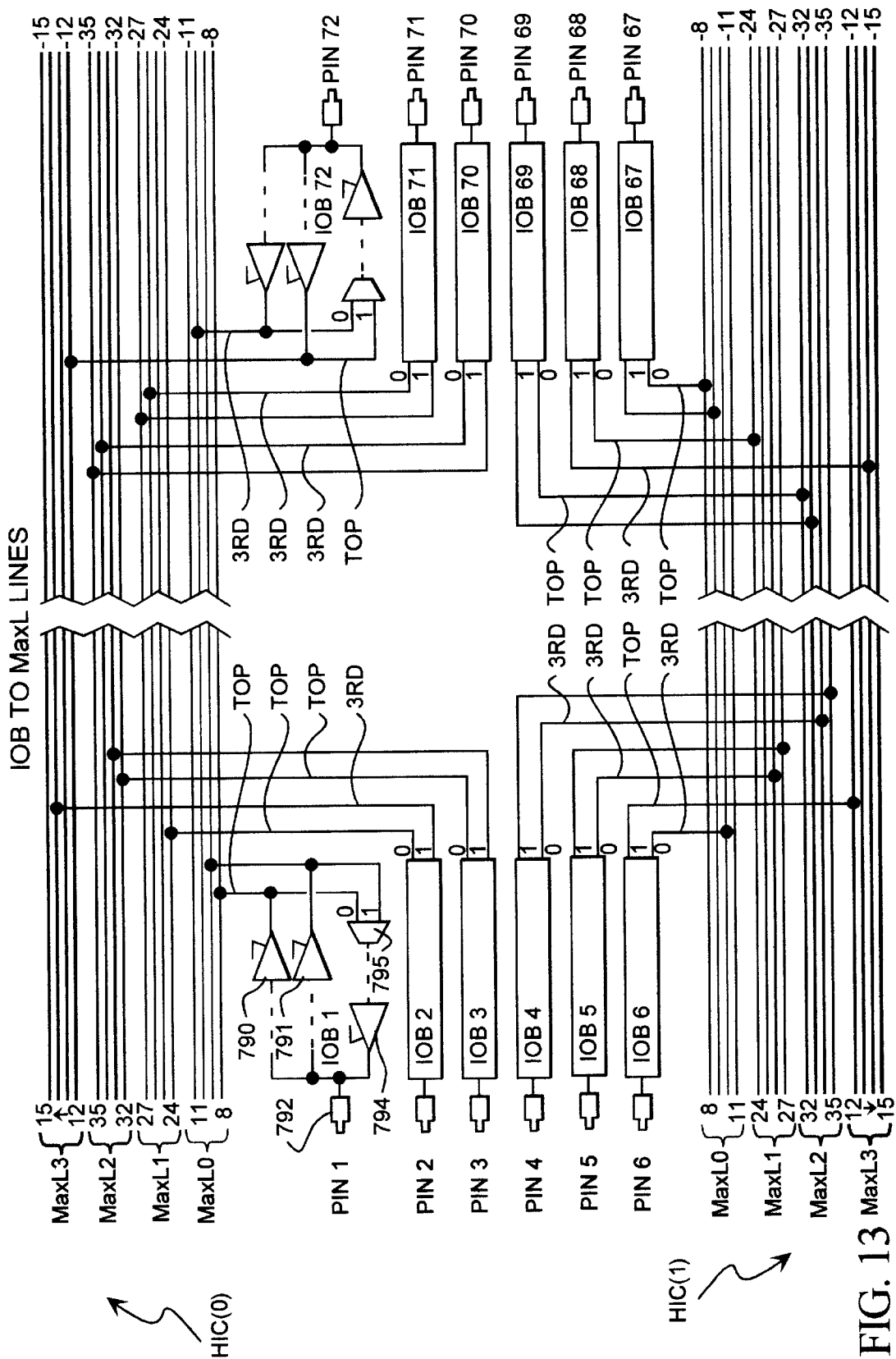
FIG. 13 illustrates connections between IOB outputs and MaxL lines.

Control input signals to IOB 1090 includes INPUT EN, INPUT CLOCK, INPUT CLKEN, OUTPUT EN, OUTPUT CLOCK, OUTPUT CLKEN and COMMON SET/RST signals. These control signals are obtained by IOB control multiplexers illustrated in FIGS. 11A–11E and described below. An INPUT EN signal is input on line 1075 to multiplexers 1076 and 1077, which in turn generates signals on lines 1042 and 1043 enabling output drive amplifiers 1041 and 1036 to output signals on MaxL lines. In an embodiment, drivers 1041 and 1036 are tri-state drivers. The specific IOB outputs to MaxL line connections are illustrated in FIG. 13 and described in detail below. An INPUT CLOCK signal is input on line 1074 to input register/latch 1024 and is used to clock a configurable input register/latch 1024. A CLKEN signal is input on line 1019 to multiplexer 1025. A COMMON SET/RST signal is input on line 1051 to decoder 1047 and 1050 in order to set or reset configurable register/latch 1024. An OUTPUT CLOCK signal is input to output register 1002 on line 1072 in order to clock register 1002. A CLKEN signal is also input to register 1002 on line 1071. An OUTPUT EN signal is input on line 1073 to amplifier 1007 in order to enable signals output from amplifier 1007.

As illustrated in FIG. 10, many of the multiplexer and decoder outputs are selected by programmable memory bits in a configuration memory.

The input signals to IOB 1090 from inter-connect resources and dendrites are input to multiplexer 1000 which generates signals on line 1001 to output register 1002. Output register 1002 is clocked by an OUTPUT CLOCK signal on line 1072. The set and reset function of output register 1002 is selected by signals on lines 1048 and 1049, respectively. The COMMON SET/RST signal is input on line 1051 to decoder 1050, which then outputs a SET or RST signal on lines 1048 or 1049 in response to configuration memory programmed for decoder 1050 and COMMON SET/RST signal. The output of output register 1002 is supplied to line 1004. Line 1004 and line 1001 are connected to multiplexer 1005. The output of multiplexer 1005 is coupled to amplifier 1007 by line 1006. The amplifier 1007 has a slew rate control circuit 1008 as known in the art. The slew rate control circuit 1008 allows the output to either have a fast or slow rise time subject to the state of the memory bit controlling that function. Likewise, the amplifier 1007 has the OUTPUT EN signal supplied on line 1073.

The output of amplifier 1007 is connected to pin 1009 by line 1010.

An input signal to IOB 1090 may be received from pin 1009 and passed to amplifier 1011 on line 1010. The output of a signal from amplifier 1011 is input to multiplexer 1017 on line 1012 or to delay element 1014 on line 1013. In an embodiment, delay element 1014 is a chain of inverters with large channel lengths for pull down transistors. Delay element 1014 is used to delay incoming signals which may be generated by a peripheral device coupled to pin 1009. The delay may be necessary in order to provide approximately zero hold time for register/latch 1024. A global clock may be used as an INPUT CLOCK signal for register/latch 1024. The global clock signal may not reach register/latch 1024 before a data signal is provided to the D input of register/latch 1024. For example, the global clock may take approximately 2.3 nanoseconds to be provided to register/latch 1024 where a data signal from pin 1009 to register/latch 1024 may take approximately 0.7 nanoseconds. Thus, a variable delay 1014 is used to set up or time the data signal to register/latch 1024 when using a global clock. If the INPUT CLOCK is obtained externally or from an adjacent IOB, delay element 1014 may be bypassed. Likewise, if the input signal is intended to be a direct connect signal output on line 1070, delay element 1014 may be bypassed. Further, the use of Phase-Lock-Loop (PLL) and clock tree would eliminate the delay associated with a global clock signal and allow delay 1014 to be bypassed.

Signals from delay element 1014 are input to multiplexer 1017 on line 1015. The output of amplifier 1011 is also output on line 1016 to multiplexer 1029. The output of multiplexer 1017 is input to multiplexer 1025 on line 1018. A feedback signal may be provided as an input to multiplexer 1025 from configurable input register/latch 1024 on line 1020. Multiplexer 1025 is controlled by a CLKEN signal. The output of multiplexer 1025 is input to configurable input register/latch 1024 on line 1021.

Configurable input register/latch 1024, as with register 1002, is controlled by a SET and RST signal on lines 1023 and 1022, respectively. The input of configurable input register/latch 1024 is clocked by an INPUT CLOCK signal on line 1074. A COMMON SET/RST signal and predetermined configuration memory bit setting determining whether a signal is generated on line 1023 or line 1022.

Configurable input register/latch 1024 can be configured to operate either as a latch or a register, in response to a memory bit setting in configuration memory. When the input register/latch 1024 operates as a register, data at the input D is transferred to the output Q on the rising edge of the OUTPUT CLOCK signal on line 1072 or INPUT CLOCK signal on line 1074. When the input register/latch 1024 operates as a latch, any data change at D is seen at Q while the signal on line 1074 is high. When the signal on line 1074 returns to the low state, the output Q is frozen in the present state, and any change on D will not affect the condition of Q. A COMMON SET/RST signal may be generated from a VGB to all IOBs or to a set of IOBs in order to set or reset latch 1024. A COMMON SET/RST signal may also be generated by peripheral device coupled to the FPGA device.

The output of register/latch 1024 is input to multiplexer 1029 by line 1046. Multiplexer 1028 also has inputs from lines 1027 and 1026.

The IOB outputs to inter-connect resources are supplied on line 1052 from multiplexer 1028 and on line 1030 from multiplexer 1029. A NOR line may also be controlled by generating a signal on line 1032. MaxL, DN, or NOR output signals to predetermined inter-connect lines are determined by signals from multiplexers 1076, 1077, and 1078, and 1079. Configuration memories coupled to multiplexers 1076, 1077, and 1078 and the multiplexers inputs determine whether signals generated on lines 1042–45 enable output drive amplifiers 1041, 1036, and 1038. For example, an IOB output signal may be supplied to either MaxL lines 8, 24 or 32 on line 1040 from output drive amplifier 1041 in response to an inputted signal on line 1052 and a control signal on line 1042. Line 1042 is connected to the output of multiplexer 1076. Ground and line 1075 which may carry an INPUT EN signal are connected to multiplexer 1076 inputs An IOB output signal may likewise be generated on either MaxL lines 9, 14, or 33, from output drive amplifier 1036. Output drive amplifier 1036 outputs a signal in response to a control signal on line 1043 and an input on line 1035. Likewise, control signals generated on line 1043 to output drive amplifier 1036 are generated by multiplexer 1077 which has two inputs, ground and an INPUT EN signal on line 1075.

An IOB output signal to a dendrite line is supplied from output drive amplifier 1037 on line 1038. Amplifier 1037 is enabled based on a control signal on line 1044. Line 1044 is coupled to drive amplifier 1037 and multiplexer 1078. The inputs of multiplexer 1078 include ground and a $V_{CC}$.

In an embodiment, amplifiers 1041 and 1036 are tri-state drivers sized to drive MaxL lines. Amplifiers 1038 and 1031 are also sized to drive a dendrite and a direct connect line, respectively.

An IOB output signal controls an adjacent NOR line by generating a signal on line 1032 to multiplexer 1079. The output of multiplexer 1079 is output to line 1033 which is coupled to a means for providing a ground path for current on the adjacent NOR line. In an embodiment, the means for providing a ground path includes transistors 1093 and 1092.

Figure 12:
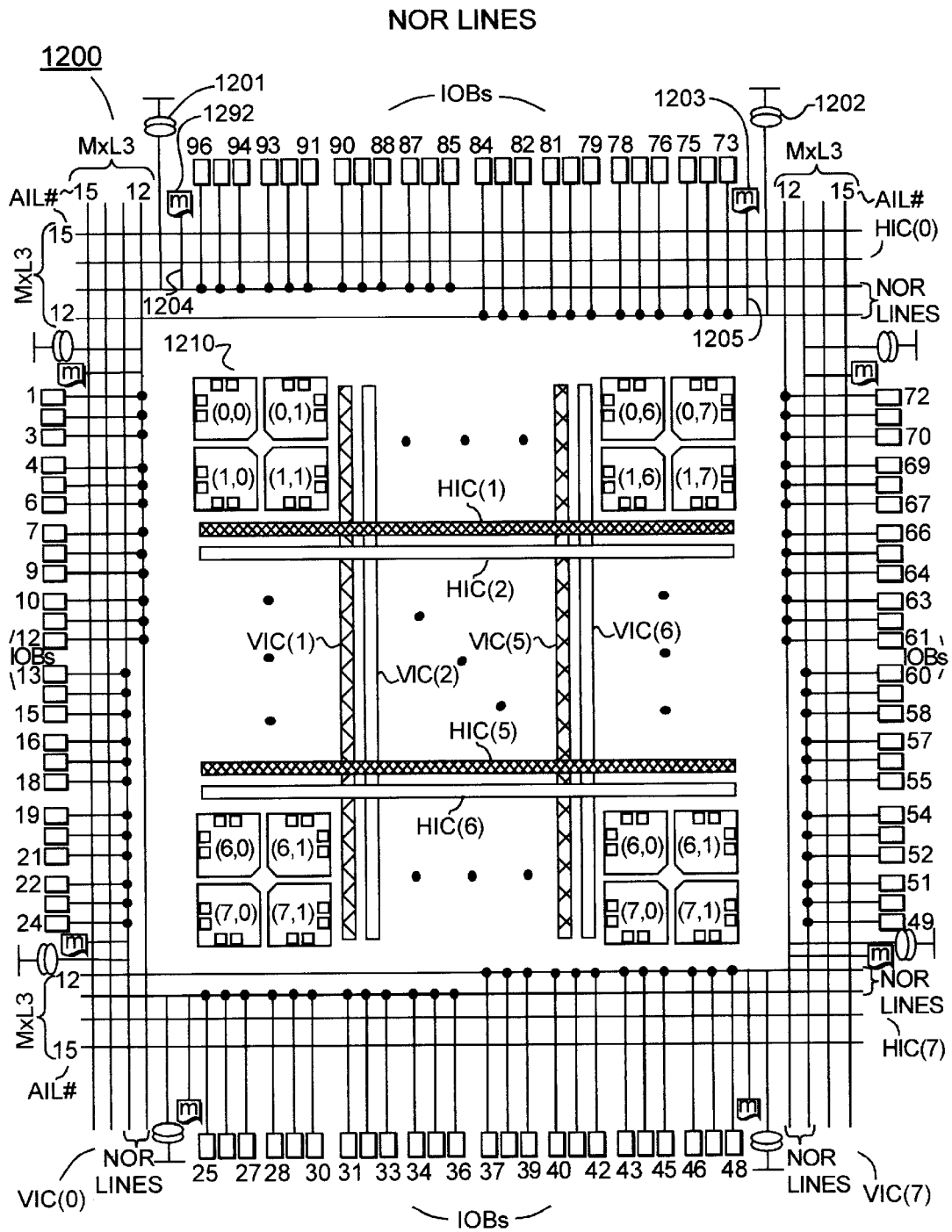
FIG. 12 illustrates IOB connections to NOR lines.

Line 1033 is coupled to a the gate of transistor 1092. The drain of transistor 1092 is coupled to ground. The drain of transistor 1093 is coupled to the source of transistor 1092. The source of transistor 1093 is coupled to a NOR line. The gate of transistor 1093 is coupled to line 1045. Multiplexer 1079 supplies a control signal to line 1045 responses to inputs (ground, $V_{CC}$) and a configuration memory bit. A NOR line is illustrated in FIG. 12 and a detailed description of a NOR line operation is discussed in detail below.

A direct connect output from IOB 1090 is generated on line 1070 from amplifier 1031. Amplifier 1031 is connected to multiplexer 1029 by line 1030.

Figure 11A:
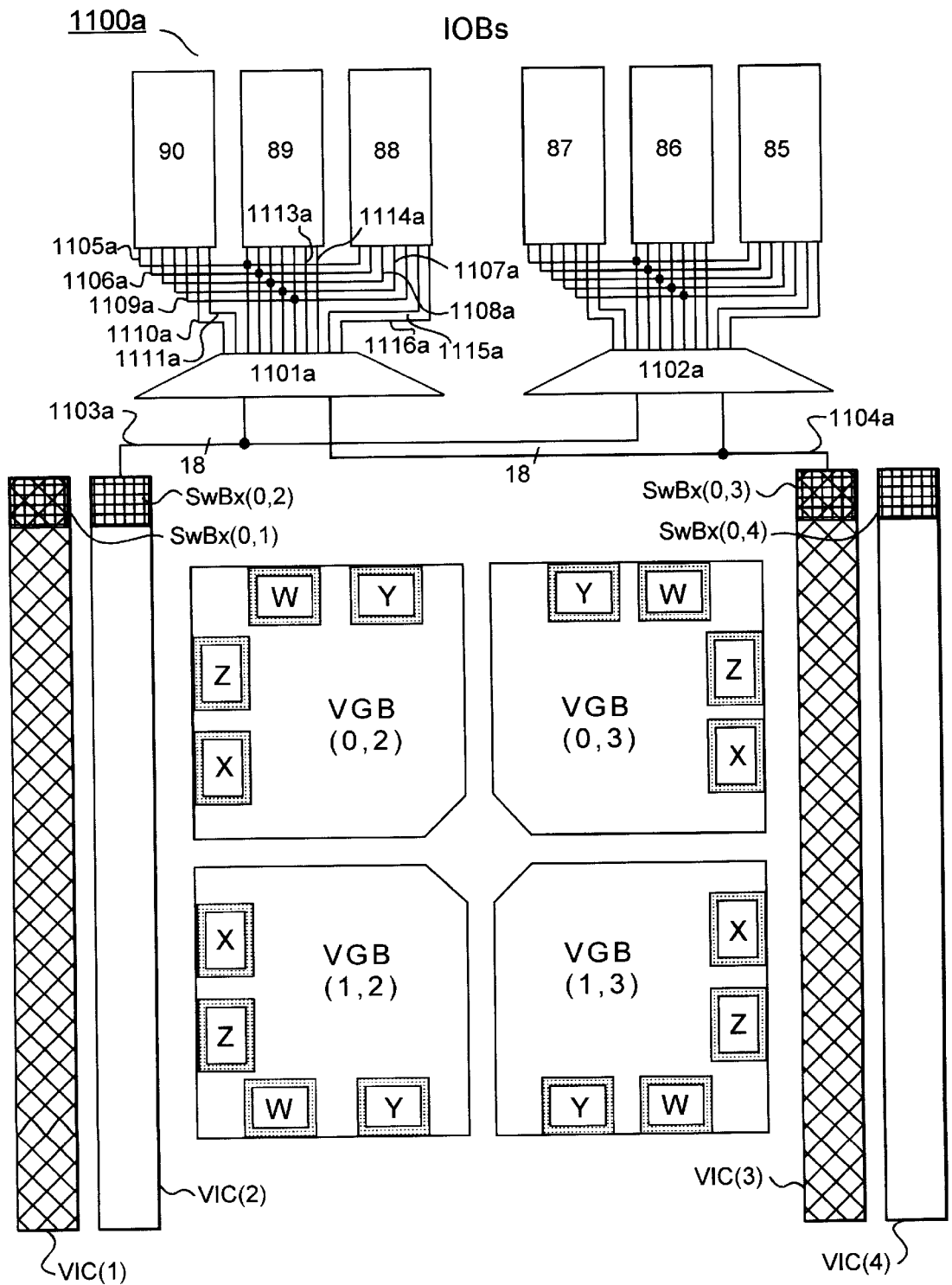
FIG. 11A illustrates an IOB control multiplexer.

FIG. 11A illustrates IOB control multiplexer architecture 1100*a* used to supply control signals to IOBs as illustrated in FIG. 10. FIG. 11A illustrates a microscopic view of FIG. 8 and shows the positioning of IOB control multiplexers 1101*a*. As can be seen in FIG. 11A, IOB control multiplexers 1101*a* and 1102*a* are associated with pairs of 3 IOBs. FIG. 11A illustrates IOB control multiplexer 1101*a* associated with IOBs 90, 89, and 88. Likewise, IOB control multiplexer 1102*a* is associated with IOBs 87, 86, and 85. IOB control multiplexers 1101*a* and 1102*a* are used to supply common and individual control signals to IOBs. Inputs to IOB control multiplexers 1101*a* and 1102*a* are supplied from left and right vertical inter-connect channels. It should be understood that a similar positioning of IOB control multiplexers for groups of 3 IOBs are repeated about the right, bottom and left side of FPGA device 800. In this embodiment, the left vertical inter-connect channel illustrated in FIG. 11A is VIC(2). Likewise, the right vertical inter-connect channel illustrated in FIG. 11A is VIC(3). Inputs to IOB control multiplexers 1101*a* and 1102*a* include 18 lines from associated SwBx (0,2) and 18 lines from associated SwBx (0,3). The 18 lines from SwBx (0,2) is represented by reference line 1103*a* while the 18 lines from SwBx (0,3) is represented by reference line 1104*a*. FIGS. 11B–E illustrate the particular 18 lines input from an associated switchbox to IOB control multiplexers 1101*a* and 1102*a*. FIGS. 11B–E also illustrates the PIP and POP locations for connecting the 18 lines from an associated switchbox to particular MILs in a control multiplexer positioned about the top, right, bottom or left side of FPGA device 800.

Figure 11B:
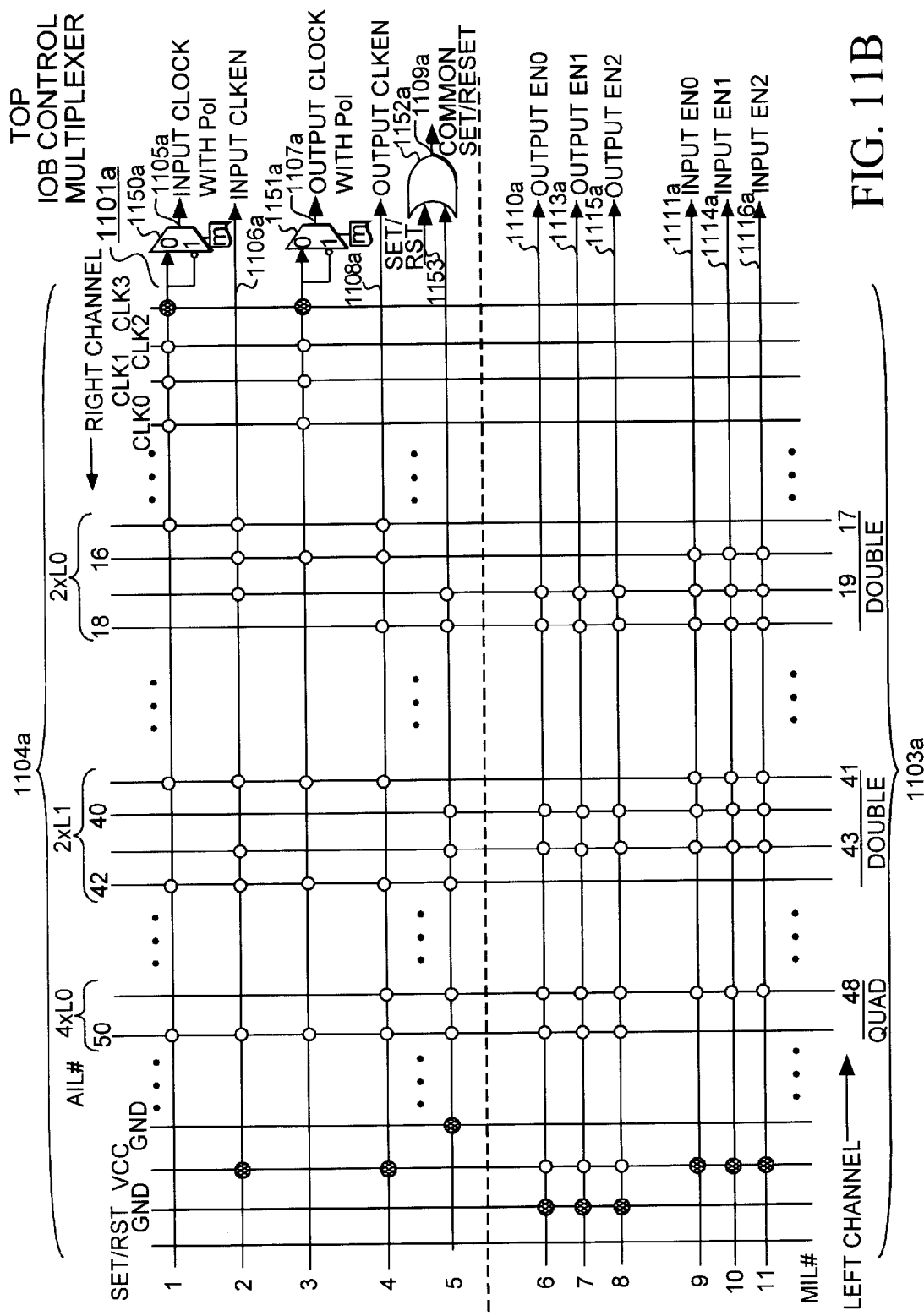
FIG. 11B illustrates a top IOB control multiplexer.

FIG. 11B illustrates a detailed representation of a control multiplexer positioned about the top of FPGA device 800, such as top control multiplexer 1101*a* as illustrated in FIG. 11A. IOB control multiplexer 1101*a* is used to configurably connect vertical inter-connect resources to top IOBs, such as IOBs 90–88. The upper portion of FIG. 11B (above the dashed line) illustrates programmably connections between vertical inter-connect lines in a right channel, such as VIC(3), and MILs in top control multiplexer 1101*a*. The bottom half (under the dashed line) illustrates connections between vertical inter-connect lines in a left channel, such as VIC(2) and MILs in top control multiplexer 1101*a*. In particular, top IOBs may be selectively connected to a SET/RST line, two GND lines, and a $V_{CC}$ line. Further, the top IOBs may be selectively coupled to quad (4×Lo) and double lines (2×L1 and 2×Lo) in a left channel, such as VIC(1), (3), (5). Also, the top IOBs may be selectively coupled to CLK 0–3 lines.

IOB control multiplexers 1101*a* includes MILs #1–11, PIPs, POPs, and Logic (multiplexers, NOR gate). MIL #1 and a complimentary line is connected to multiplexer 1150*a*. Multiplexer 1150*a* is also coupled to configuration memory bit. Multiplexer 1150*a* outputs an INPUT CLOCK signal on line 1105*a* which is coupled to top IOBs 90–88 as illustrated in FIG. 11A. MIL #2 is used for inputting an INPUT CLKEN signal on line 1106a which is coupled to top IOBs 90–88. MIL #3 and its complimentary line, like MIL #1, is coupled to multiplexer 1151a. The output of multiplexer 1151a is then used to supply an OUTPUT CLOCK signal to top IOBs 90–88 on line 1107a. MIL #4 is used to carry an OUTPUT CLKEN signal to top IOBs 90–88 on line 1108a. MIL #5 is connected to NOR gate 1152a along with line 1153. Line 1153 carries a SET/RST signal. The output of NOR gate 1152 is coupled to the top IOBs 90–88 and is used to carry a COMMON SET/RST signal on line 1109a.

AILs #50, 42, 39, 15 and CLK 0–3 are programmably configurable to MIL #1 by respective PIPs and a POP. $V_{CC}$ line, AILs #50, 42, 41, 39, 17, 16, 15 may also be programmably configured to MIL #2. AILs #50, 42, 39, and 16 and CLK 0–3 may be programmably configured to MIL #3. $V_{CC}$ line, AILs #50, 49, 42, 39, 18, 16, 15 may be programmably configured to MIL #4. GND line, AILs #50, 49, 42, 41, 40, 18, and 17 may be programmably configured to MIL #5.

The lower portion of FIG. 11B illustrates connections between inter-connect lines in a left channel, or in particular VIC(2), in top IOB control multiplexers 1101a. In particular, MIL #6, 7, and 8 are used to output individual IOB control signals OUTPUT EN0, OUTPUT EN1, OUTPUT EN2 to a first, second, third and top IOB, for example IOBs 90, 89, and 88 as illustrated in FIGS. 11A and B. MILs #9, 10, 11 are used to output individual IOB control signals INPUT EN0, INPUT EN1, INPUT EN2 to a first, second, and third top IOB, for example IOB 90, 89, and 88 as illustrated in FIGS. 11A and B. PIPs and a POP connect GND line, $V_{CC}$ line, AILs #50–49, 41–40, and 18 to MIL #6. Line 1110a connects MIL #6 to IOB 90. PIPs and a POP connect GND line, $V_{CC}$ line, AILs #50, 49, 41, 40, 18 and to MIL #7. Line 1113a connects HIC(7) to IOB 89. PIPs and a POP connect GND line, $V_{CC}$ line, AILs #50–49, 41–40, and 18 to MIL #8. Line 1115a connects MIL #8 to IOB 88. PIPs and a POP connect $V_{CC}$, AILs #49, 41, 40, 39, 18, 17 and 16 to MIL #9. Line 1111a connects MIL #9 to IOB 90. PIPs and a POP connect $V_{CC}$, AILs #49, 41, 40, 39, 18, 17 and 16 to MIL #10. Line 1114a connects MIL #10 to IOB 89. PIPs and a POP connect $V_{CC}$, AILs #49, 41, 40, 39, 18, 17 and 16 to MIL #11. Line 1116a connects MIL #11 to IOB 88.

Figure 11C:
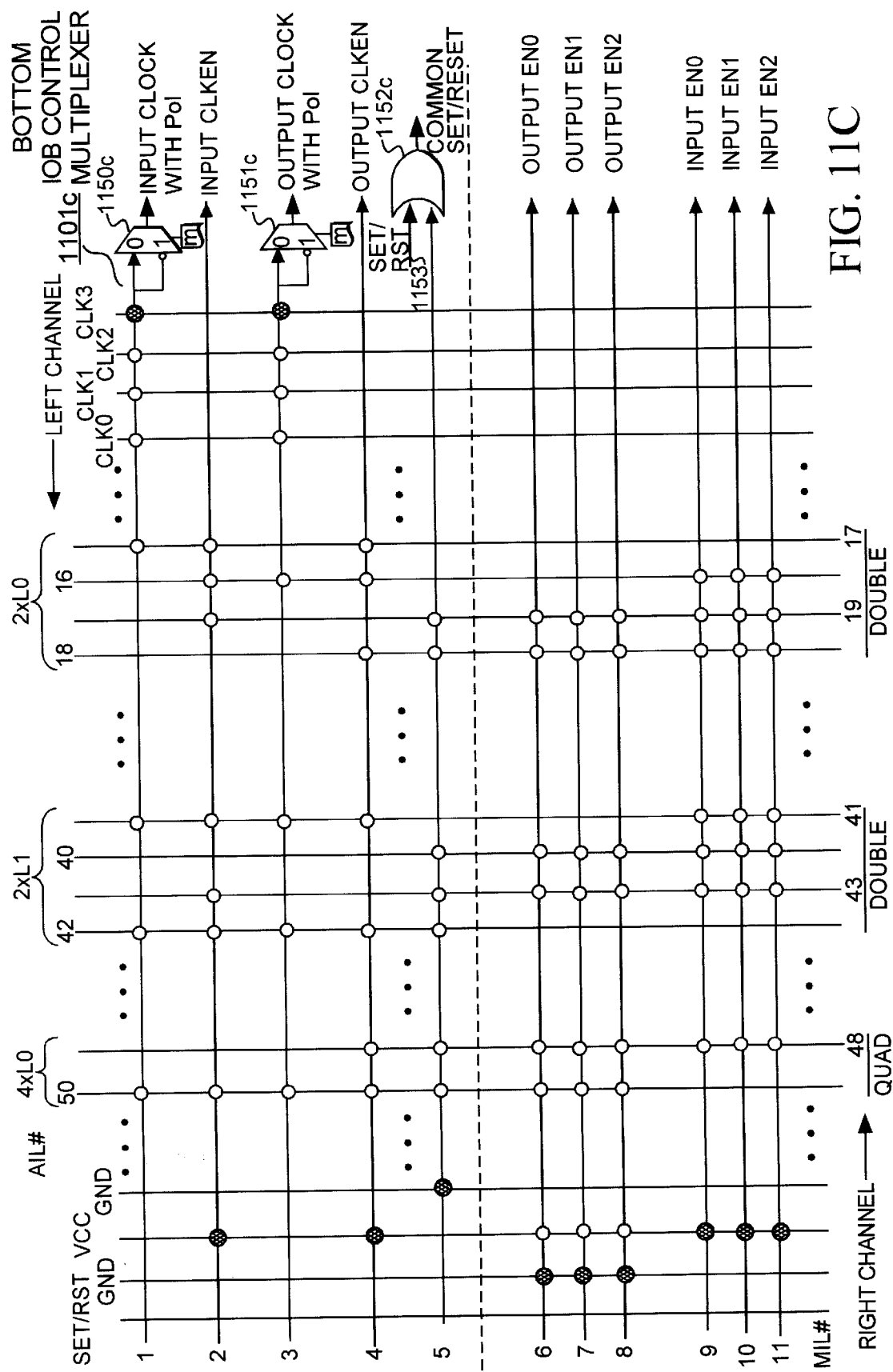
FIG. 11C illustrates a bottom IOB control multiplexer.

FIG. 11C illustrates a control multiplexer adjacent bottom IOBs, such as IOBs 31–33 illustrated in FIG. 8. In this embodiment, the left channel corresponds to VIC(2) and the right channel corresponds to VIC(3). Lines in the right and left inter-connect channels are similarly programmably configured to MILs by PIPs and POPs to output individual and common control signals to bottom IOBs.

Figure 11D:
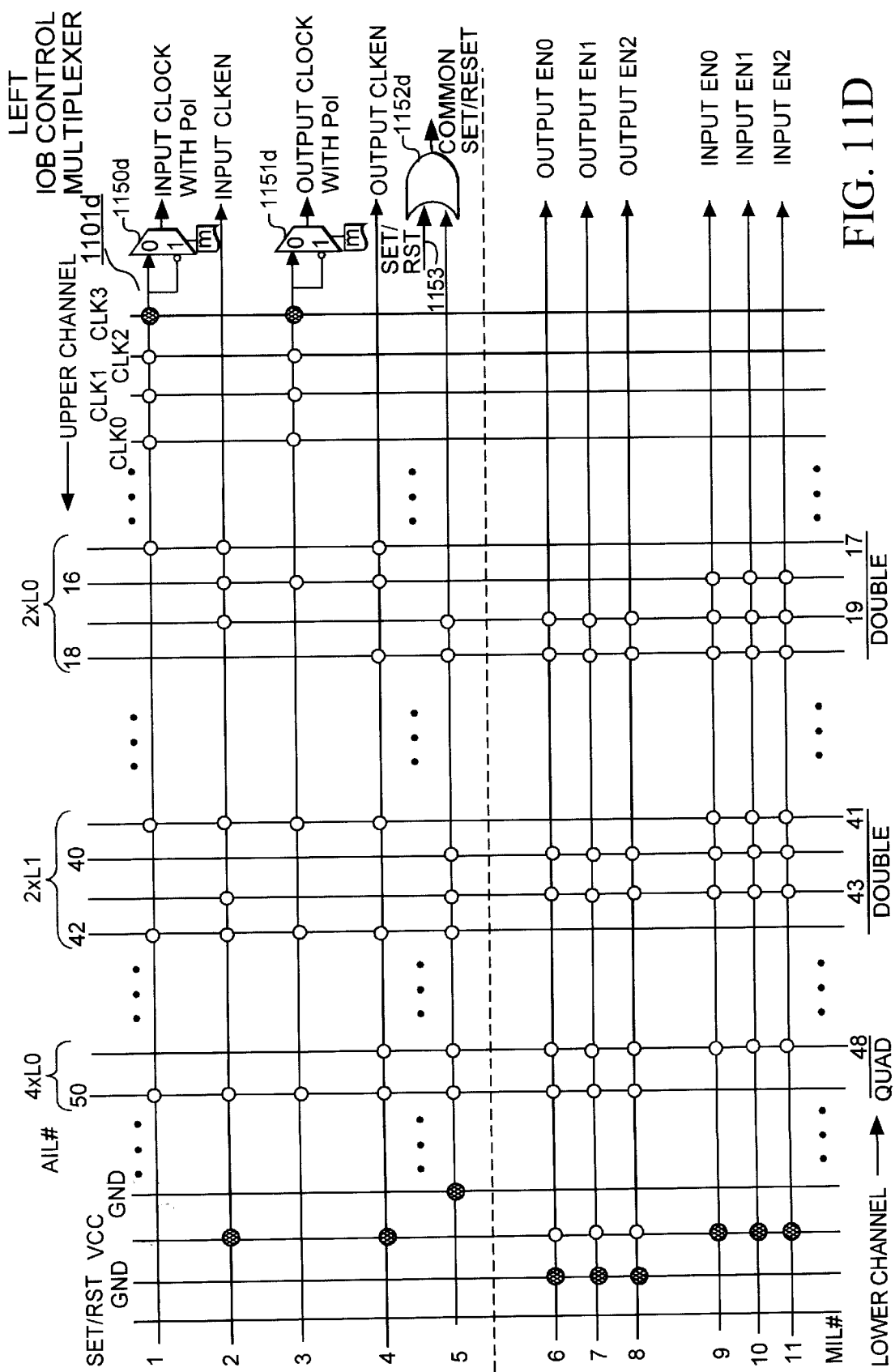
FIG. 11D illustrates a left IOB control multiplexer.

FIG. 11D illustrates a control multiplexer adjacent IOBs positioned about the left side of FPGA device 800 illustrated in FIG. 8, such as IOBs 7–9. In this embodiment, the upper channel corresponds to HIC(2) and the lower channel corresponds to HIC(3). Lines in the upper and lower channels are similarly programmably configured to MILs to output individual and common control signals to left IOB.

Figure 11E:
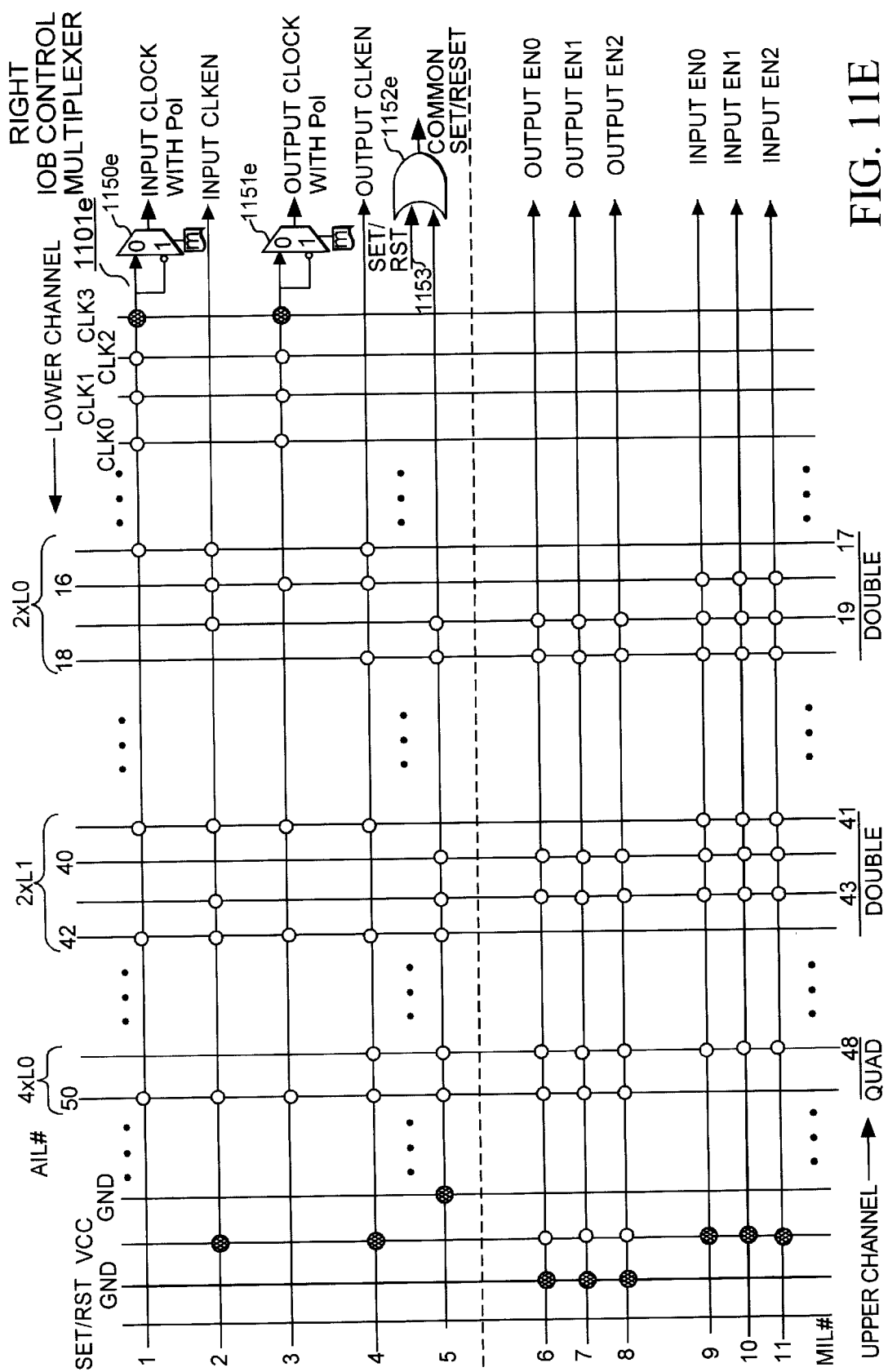
FIG. 11E illustrates a right IOB control multiplexer.

FIG. 11E illustrates a control multiplexer adjacent IOBs positioned about the right side of FPGA device 800 illustrated in FIG. 8, such as IOBs 66–64. In this embodiment, the lower channel corresponds to HIC(3) and the upper channel corresponds to HIC(2). Lines in the upper and lower channels are similarly programmably configured to MILs to output individual and common control signals to right IOBs.

FIG. 12 illustrates a NOR line architecture FIG. 12, as in FIG. 8, illustrates IOBs 1–96 arranged around the periphery of a plurality of VGBs and inter-connect resources 1210. Selected AIL lines in HIC(0), HIC(7), VIC(0), and VIC(7) are connected to respective IOBs as illustrated in FIG. 12.

M×L lines in vertical or horizontal inter-connect channels adjacent to the IOBs are used as NOR lines. NOR lines are used to generate product terms. One application of a NOR line includes decoding an address generated from an external data/address bus coupled to I/O pins as described below. Two M×L3 lines are connected to IOB NOR line outputs. Specifically, IOBs 1–12 have NOR output lines connected to AIL #13 in VIC(0). Similarly, IOBs 13–24 have their NOR output lines connected to AIL #12 in VIC(0).

IOBs 25–36 have respective NOR output lines connected to AIL #13. IOBs 37–48 have NOR output lines connected to AIL #12 in HIC(7). IOBs 49–60 have NOR output lines connected to AIL #12. IOBs 61–72 have NOR output lines connected to AIL #13 in VIC(7). IOBs 73–84 have NOR output lines connected to AIL #12. IOBs 85–96 have NOR output lines connected to AIL #13 in HIC(0).

AILs #12 and 13 in HIC(0), HIC(7), VIC(0), and VIC(7) are M×L3 lines which may be used as dedicated NOR lines. Current sources, such as current sources 1201 and 1292 are coupled to AIL #13 and AIL #12 respectively. Other current sources are coupled NOR lines in VIC(0), HIC(7) and VIC(7). A NOR control line is associated with each NOR line. For example, control line 1204 is coupled to a NOR line (AIL #13) and a NOR line configuration memory bit 1202. Likewise, NOR control line 1205 is coupled to a NOR line (AIL #12) and a NOR control configuration memory bit 1203. If the NOR control line configuration memory bit is cleared, the NOR control line associated with that configuration memory bit is high and the associated NOR line behaves like a M×L line. If the configuration memory bit is programmed, the NOR control line goes low and a current source such as current source 1201 or 1202 is connected to the respective NOR line. The NOR line then behaves like a NOR gate, for example, the NOR line is pulled high if none of the transistors (such as transistors 1093 and 1092 illustrated in FIG. 10) connected to the NOR line are on and thus pull the NOR line low. Thus, a set of IOBs, such as IOBs 1–12, may be coupled to an external peripheral address/data bus. An address may be generated on the pins associated with IOBs 1–12. The IOBs thus may turn on respective IOB transistor gates 1092 depending upon the signal generated on line 1033 and associated configuring memory bit settings illustrated in FIG. 10.

The NOR lines are positioned in an inter-connect channel adjacent to the IOBs in order to reduce signal propagation delays which may occur if the NOR lines were positioned further away from the IOBs. Also, using two separate NOR lines per side of IOBs, for example IOBs 1–12 and 13–24, also reduces capacitance associated with a NOR line and thus further reduces signal propagation delays. MaxL lines were also selected for NOR lines because the MaxL lines do not have to travel through capacitive loaded switchboxes.

An embodiment for controlling a current source, such as current source 1201, coupled to a NOR line which provides reduced power consumption (zero power) is described in the above-identified patent application entitled, "MULTIPLE INPUT ZERO POWER AND/NOR GATE FOR USE WITH A FIELD PROGRAMMABLE GATE ARRAY (FPGA)", incorporated by reference herein.

FIG. 13 illustrates the programmably configured connections between IOB outputs and inter-connect channel M×L lines. FIG. 13, as in FIG. 12, illustrates a portion of the AILS associated with horizontal inter-connect channels. Two sets of 6 IOBs corresponding to IOBs 1–6 and 72–67 shown in FIG. 8 is illustrated in FIG. 13. FIG. 13 illustrates how IOB's interface with the MaxL lines, and in particular the TOP set of AIL's #8, #24, #32 and #12; and the 3RD set of AIL's #10, #26, #34 and #14.

As seen in FIG. 13, each IOB such as IOB 1 (at the top, left) includes two longline tri-state drivers 790 and 791 (corresponding to amplifiers 1041 and 1033 illustrated in FIG. 10) for driving a respective pair of MaxL lines. The illustrated tristate drivers 790 and 791 for example, respectively drive TOP AIL #8 and 2ND AIL #9. Input signals of the respective two longline driving tristate drivers, 790 and 791, may be configurably derived from a number of sources including external I/O pin 1 of the FPGA device 800. (Other sources include one or both of two bypassable and serially-coupled configurable registers/latches as illustrated in FIG. 10 within each IOB.)

Each IOB such as IOB 1 further includes a pin-driving tri-state driver (with configurably-variable slew rate) such as shown at 794 (corresponding to amplifier 1007 in FIG. 10). Input signals of the pin-driving tristate driver 794 may be configurably derived from a number of sources including from user-configurable multiplexer 795 (corresponding to multiplexer 1000 in FIG. 10). Two of the selectable inputs of multiplexer 795 are coupled to the same two longlines driven by that same IOB. In the case of IOB 1 for example, that would be TOP AIL #8 and 2ND AIL #9.

The remaining IOB's shown in FIG. 13 have similar internal structures as illustrated in FIG. 10 and described above. As seen, at the left side of the FPGA device 800 between even-numbered HIC(0) and odd-numbered HIC(1), there are provided six IOB's respectively identified as IOB 1 through IOB 6. At the right side of the FPGA device 800 there are further provided six more IOB's respectively identified as IOB 72 through IOB 67. The external I/O pins are similarly identified as PIN 72 through PIN 67 on the right side and as PIN 1 through PIN 6 on the left side. The same connection pattern repeats between every successive set of even and odd-numbered HIC's. FIG. 13 may be rotated ninety degrees to thereby illustrate the IOB-to-MaxL lines connectivity pattern for the VIC's as well. (References to horizontal lines will of course be changed to vertical and references to left and right IOB's will of course be changed to top and bottom.)

On the left side, IOB 1, IOB 2 and IOB 3 collectively provide bidirectional coupling at least to 3 TOP longlines (AIL's #8, #24, #32) and 1 3RD longline (AIL #14) in the adjacent even-numbered HIC(0). On the right side, IOB 72, IOB 71 and IOB 70 collectively provide bidirectional coupling at least to 3 3RD longlines (AIL's #10, #26, #34) and 1 TOP longline (AIL #12) in the adjacent and same even-numbered HIC(0). The combination of the six IOB's of HIC(0) therefore allow for bidirectional coupling of nibble-wide data either to the TOP set ((AIL's #8, #24, #32 and #12) and/or to the 3RD set (AIL's #10, #26, #34 and #14).

As seen in the bottom half of FIG. 13, on the left side, IOB 4, IOB 5 and IOB 6 collectively provide bidirectional coupling at least to 3 3RD longlines (AIL's #10, #26, #34) and 1 TOP longline (AIL #12) in the adjacent odd-numbered HIC(1). On the right side, IOB 67, IOB 68 and IOB 69 collectively provide bidirectional coupling at least to 3 TOP longlines (AIL's #8, #24, #32) and 1 3RD longline (AIL #14) in the same odd-numbered HIC(1). The combination of the six IOB's of HIC(1) therefore allow for bidirectional coupling of nibble-wide data either to the TOP set (AIL's #8, #24, #32 and #12) and/or to the 3RD set (AIL's #10, #26, #34 and #14) of the odd-numbered, adjacent HIC.

This IOB-to-MaxL line architecture enables multiple FPGA devices to be coupled to form a bus including the multiple sets of MaxL lines. A first set of MaxL lines of a first FPGA device may be coupled through IOBs to a second FPGA device having a second set of MaxL lines. The first FPGA may be configured to act as a bus controller or master.

In addition to the above-described couplings between the IOBs and the MaxL lines of the interconnect mesh, IOBs also couple by way of direct connect wires to peripheral ones of the super-VGBs for both input and output. More specifically, there are direct connect wires connecting the left-side IOBs (IOB 1 through IOB 6) to adjacent super-VGBs of super column number 0. See FIGS. 25 and 27 regarding IOB/super-VGB direct connects. FIG. 13 indicates that these super column 0 super-VGBs can drive the same TOP set of longlines (AILs #8, #24, #32 and #12) that may be driven by the IOBs.

There are further direct connect wires connecting the right-side IOBs (IOB 67 through IOB 72) to adjacent super-VGBs of the rightmost super column. The column number of the rightmost super column is preferably (but not necessarily) equal to an even integer that is not a multiple of four. In other words, it is equal to 4m+2 where m=1, 2, 3, etc. and the leftmost super column is numbered 0. That means there are a total of 4m+3 super-VGBs per row. The latter implies that square super-VGB matrices will be organized for example as 11×11, 13×13, 19×19, 23×23 super-VGBs and so on. (If the same organizations are given in terms of VGBs, they become 22×22, 26×26, 38×38, 46×46 VGBs and so on.) In such cases, the rightmost super-VGB, number (4m+2) will drive the longlines of the adjacent HIC. The same rightmost super-VGB number(4m+2) connects by way of direct connect wires to the right-side IOBs. FIG. 13 indicates that these super column number 4m+2 super-VGBs can drive the same 3RD set of longlines (AILs #10, #26, #34 and #14) that may be driven by the IOBs.

In alternate embodiments, the extent of direct connect between IOBs to adjacent columns of super-VGBs is increased from extending to just the most adjacent super column to extending to at least the first two or three nearest super columns. This allows the right-side IOBs to reach the super-VGBs that drive the 3RD longline set with direct connections.

Aside from direct connect wires, IOBs may be further coupled to the super-VGBs of the device by 2×L, 4×L, 8×L lines of the adjacent HICs. Coupling between the IOBs and the 2×L, 4×L, 8×L lines of adjacent HICs may be provided through a configurable dendrite structure described below.

Figure 14:
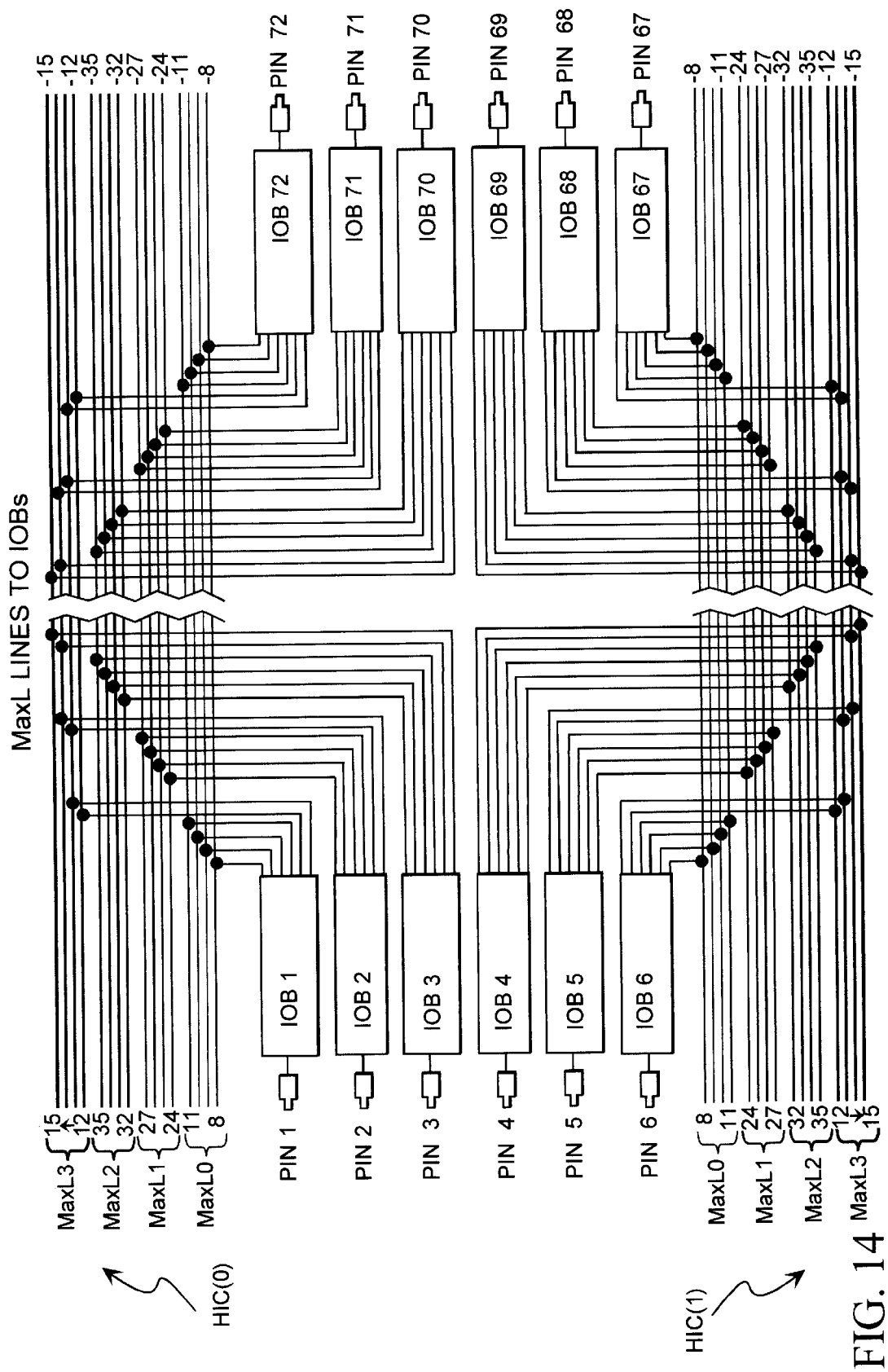
FIG. 14 illustrates connections between IOB inputs and MaxL lines.

FIG. 14 illustrates connections between inputs and interconnect channel M×L lines. FIG. 14, similar to FIG. 13, illustrates connections between IOB 1–6 and 67–72 inputs and AILs in adjacent horizontal inter-connect channels. For example, AILs #8, 9, 10, 11, 12, and 13 in HIC(0) are connected to MaxL lines inputs for IOB 1. AILs #24, 25, 26, 27, 13, and 14 in HIC(0) are connected to MaxL lines inputs for IOB 2. AILs #32, 33, 34, 35, 14, and 15 in HIC(0) are connected to MaxL lines inputs for IOB 3.

The connection for MaxL lines inputs to IOBs 72–70 are likewise configured.

AILs #8, 9, 10, 11, 12, and 13 in HIC(1) are connected to MaxL lines inputs for IOB 6. AILs #24, 25, 26, 27, 13, and 14 in HIC(1) are connected to MaxL lines inputs for IOB 5. AILs #32, 33, 34, 35, 14, and 15 in HIC(1) are connected to MaxL lines inputs for IOB 4.

The connections to MaxL lines inputs of IOBs 67–69 are likewise configured.

The same connection pattern repeats between every successive set of even and odd HIC(s). Further, FIG. 14 may be rotated 90° to thereby illustrate the MaxL-to-IOB lines connectivity pattern for the VIC(s) as well. (References to horizontal lines will of course be changed to vertical in reference to left and right IOBs will of course be changed to top and bottom.)

In an embodiment, each IOB in FPGA device 800 is connected to drive (write) and read a predetermined MaxL line.

Figure 15:
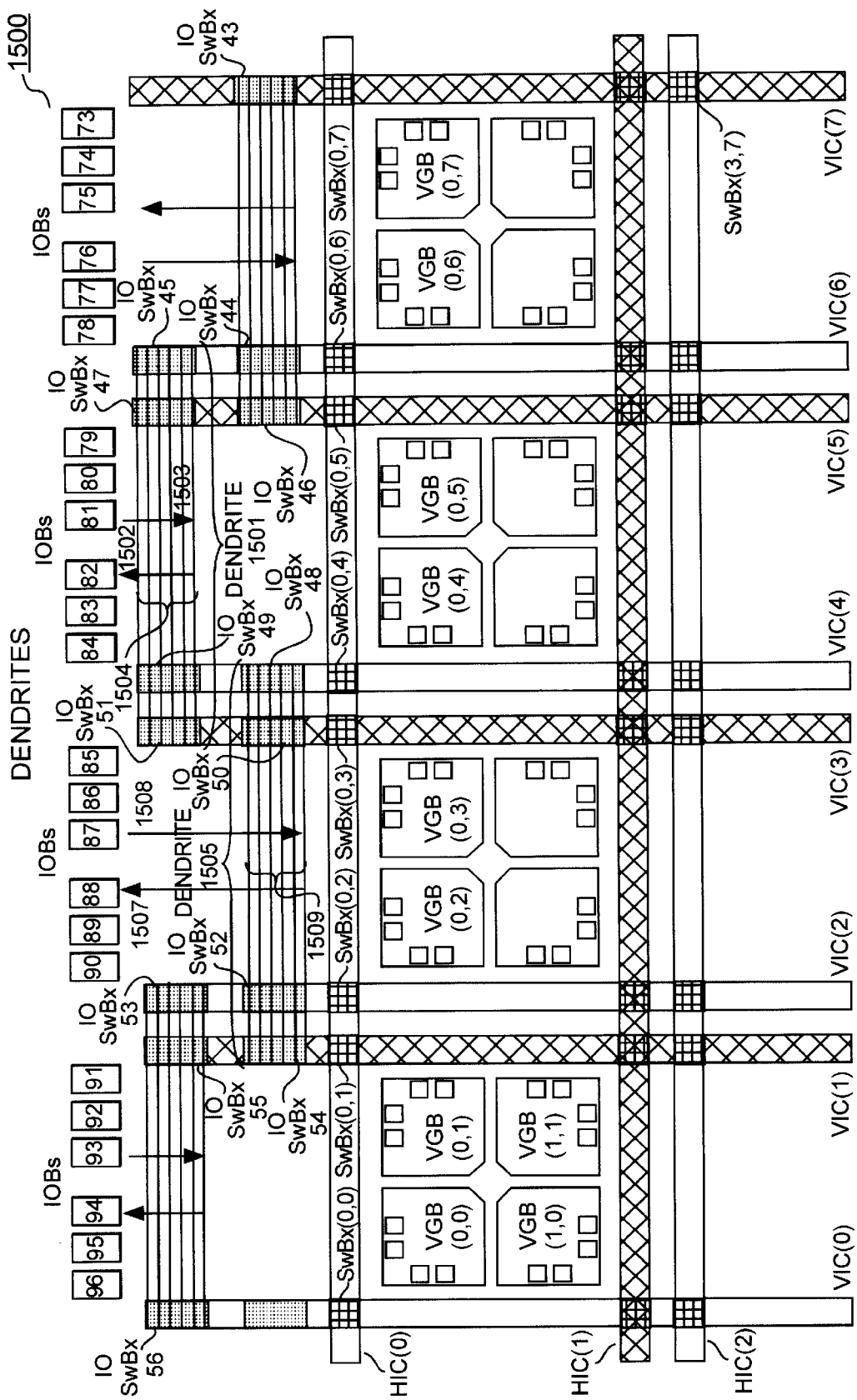
FIG. 15 illustrates a dendrite architecture.
Figure 15A:
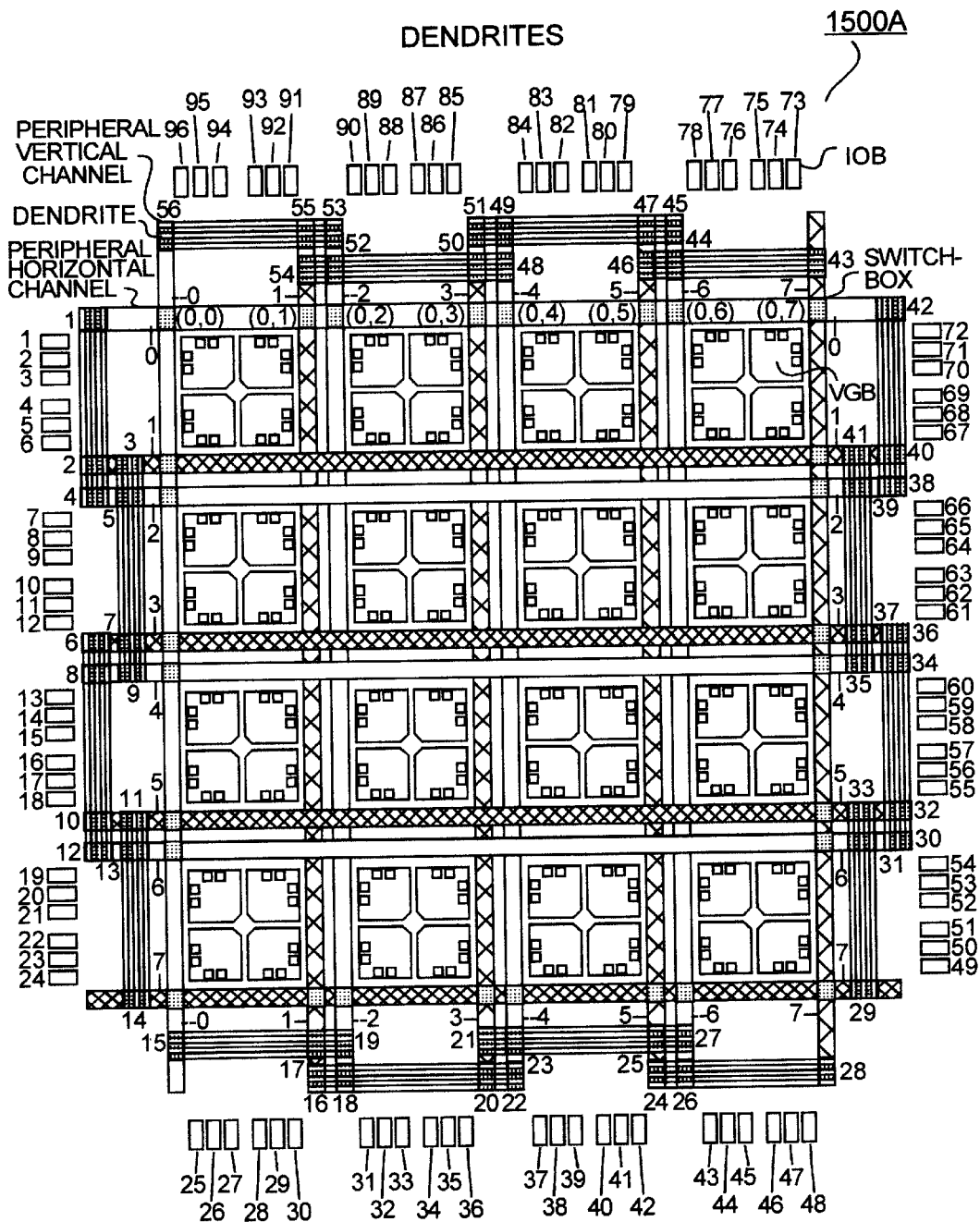
FIG. 15A illustrates a dendrite overview architecture in a FPGA device as illustrated in FIG. 8.

A dendrite architecture 1500A is positioned between IOBs 1–96 and inter-connect channels HIC(0), HIC(7), VIC(0), and VIC(7) as illustrated in FIG. 15A. The dendrite architecture 1500A includes 56 I/O switchboxes positioned between IOBs and VGBs. The 56 I/O switchboxes are coupled to dendrite lines and are coupled to the inter-connect channels to form dendrites. FIG. 15A also illustrates switchboxes, such as SwBxs (0,0), (0,1), (0,2), (0,3), (0,4), (0,5), (0,6) on HIC(1).

The dendrite architecture advantageously routes signals between IOBs without utilizing general inter-connect resources. For example, without the use of dendrites, a signal transferred from a first IOB to a second IOB may have to be routed through a general inter-connect resource, such as a HIC, to a VGB, then back out through general inter-connect resources to the second IOB. This signal routing scheme consumes general inter-connect resources and VGB input/outputs which could be otherwise used.

Further, this routing scheme increases signal propagation times. The signal would have to travel through capacitance loaded switchboxes and VGBs increasing signal propagation times.

Another advantage of the dendrites architecture includes enhanced flexibility for the FPGA configured software. The dendrite architecture allows the FPGA configured software to reroute I/O signals from fixed pins to a collection of circuit chunks placed in VGBs. Without the dendrite architecture, the FPGA configuring software may have to reposition circuit chunks to different VGBs in the FPGA device in order to accommodate the I/O signals from fixed pins.

Dendrite architecture 1500 illustrated in FIG. 15 includes a series of dendrites. For example, dendrite 1501 includes I/O switchboxes I/O SwBx 51, I/O SwBx 49, I/O SwBx 47 and I/O SwBx 45, six dendrite lines identified as reference number 1504 and dendrite input and output lines to IOBs illustrated as arrows 1502 and 1503. I/O SwBx 51 is coupled to VIC(3) and I/O SwBx 49 is coupled to VIC(4). Similarly, I/O SwBx 47 is coupled to VIC(5) and I/O SwBx 45 is coupled to VIC(6). Dendrite lines 1504 are programmably configured to I/O SwBx 51, I/O SwBx 49, I/O SwBx 47, and I/O SwBx 45. Input and output dendrite lines of IOBs 84–79, illustrated as arrows 1502 and 1503, are connected to dendrite lines 1504. FIGS. 16–19 illustrate the connections between the dendrite lines and respective IOBs on the left, bottom, right, and top side of FPGA device 800 illustrated in FIGS. 8 and 15A. FIGS. 20–23 illustrated the I/O SwBx architecture for I/O switchboxes on the left, bottom, right, and top side of FPGA device 800 illustrated in FIGS. 8 and 15A.

An adjacent dendrite 1505 to dendrite 1501 is connected to dendrite input and output lines of IOBs 85–90. Dendrite 1505 is shifted toward the VGBs relative to dendrite 1501. Dendrite 1505 includes I/O SwBxs 54, 52, 50 and 48, dendrite lines 1509, and dendrite input and output lines represented by arrows 1507 and 1508. I/O SwBx 50 is coupled to VIC(3). I/O SwBx 48 is coupled to VIC(4). Similarly, I/O SwBxs 54 and 52 are coupled to VIC(1) and (2), respectively. Dendrites 1501 and 1505 may be similarly positioned along the periphery of FPGA device 800 as illustrated in FIG. 15A.

FIGS. 16A–B, 17A–B, 18A–B, and 19A–B illustrate particular dendrites positioned next to top, right, bottom, and left IOBs as illustrated in FIGS. 8 and 15A.

Figure 16A:
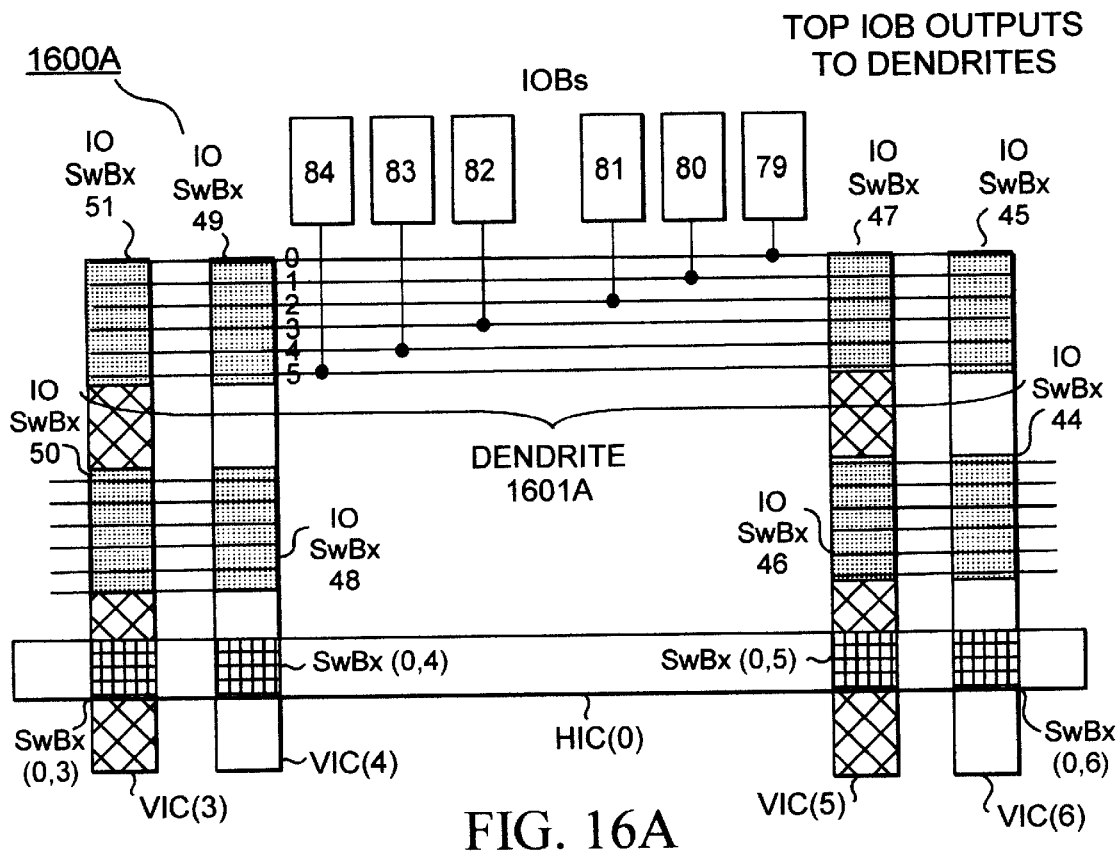
FIGS. 16A and B illustrate connections between top and bottom IOB inputs and dendrite lines.
Figure 16B:
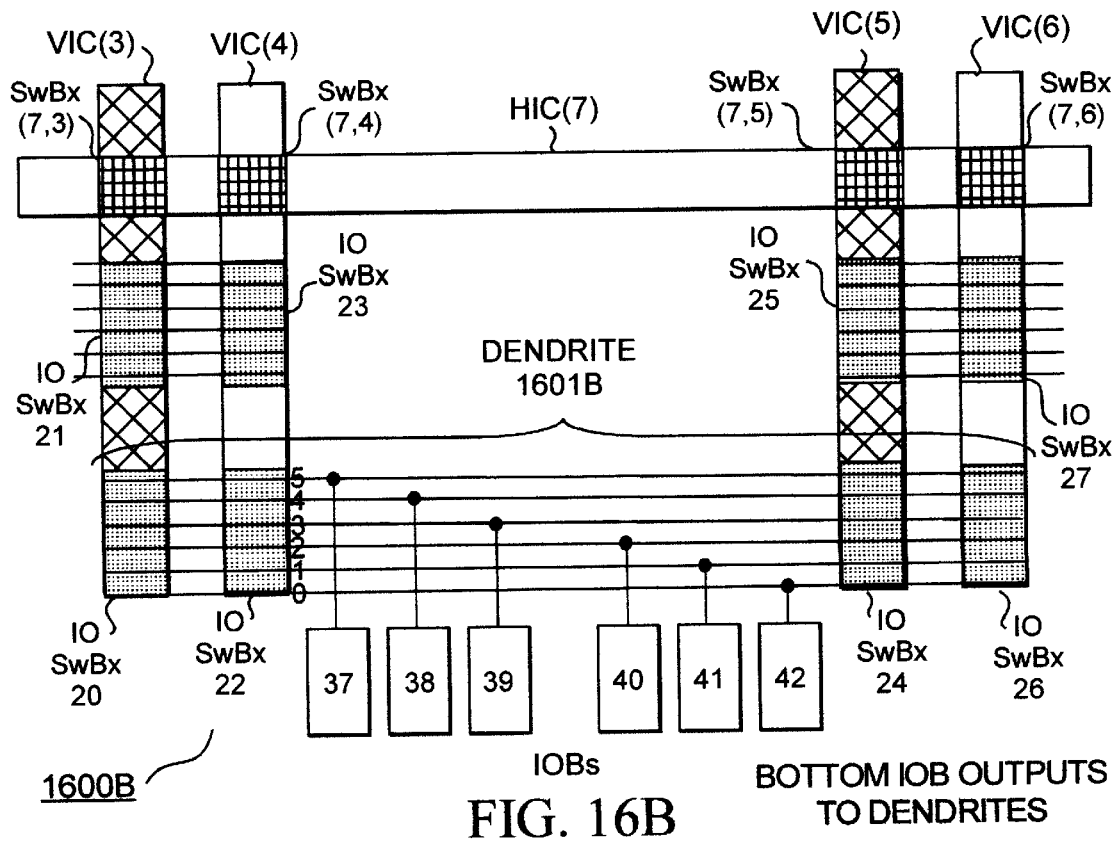

FIGS. 16A–B illustrate connections between top and bottom IOB dendrite outputs and dendrite lines.

Figure 17B:
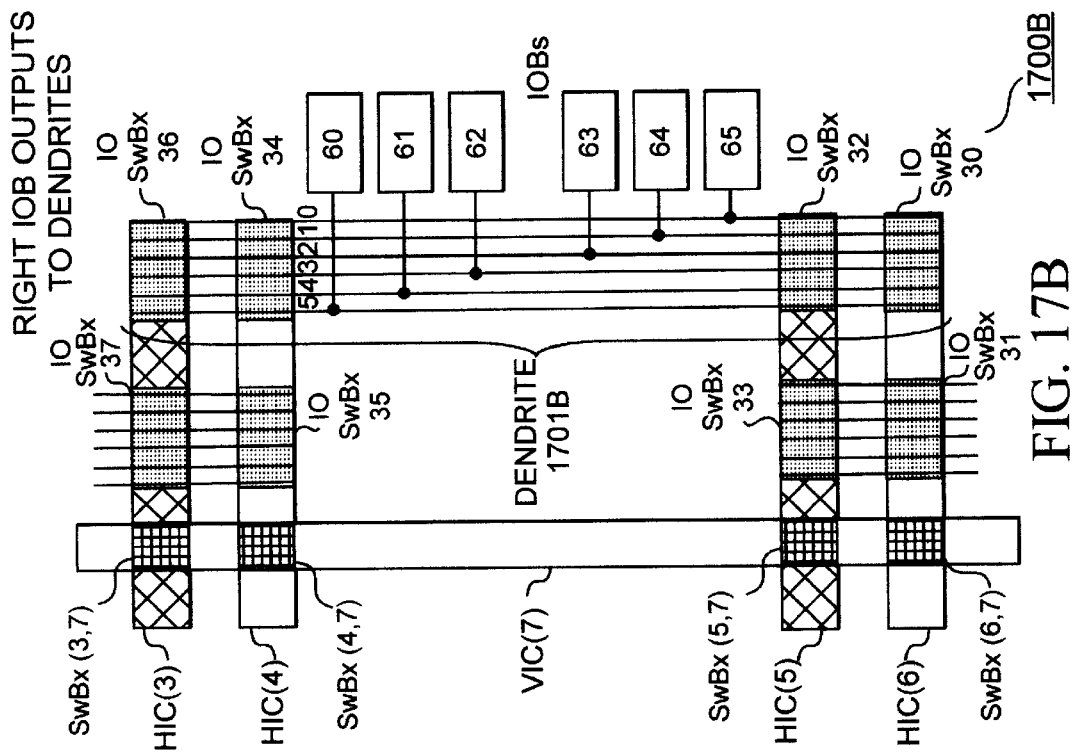
FIGS. 17A and B illustrate connections between left and right IOB inputs and dendrite lines.
Figure 17A:
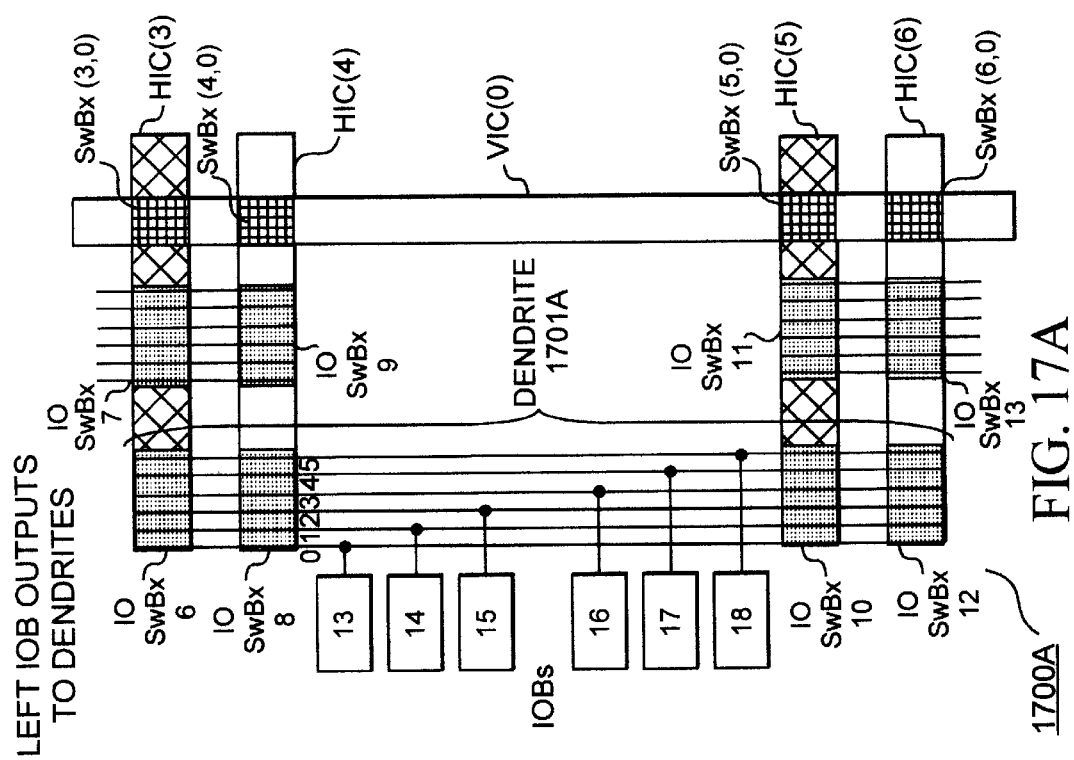

FIGS. 17A–B illustrate connections between left and right IOB dendrite outputs and dendrite lines.

Figure 18A:
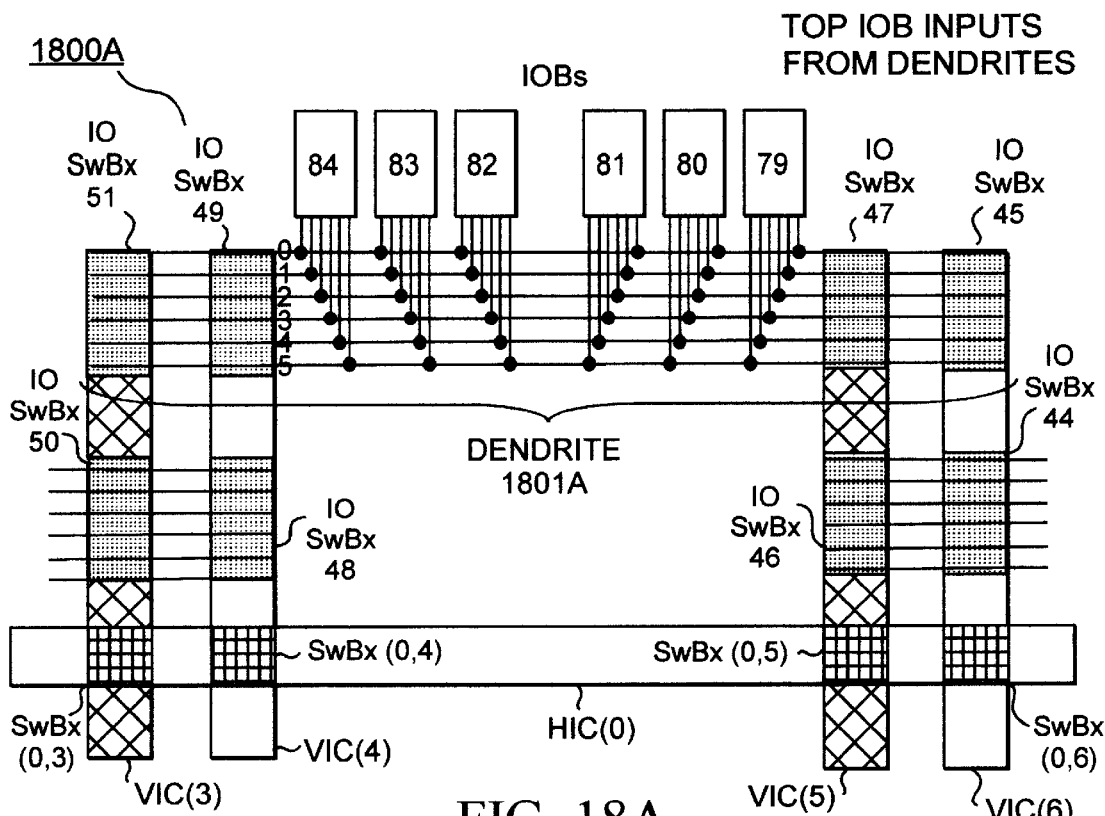
FIGS. 18A and B illustrate connections between top and bottom IOB outputs and dendrite lines.
Figure 18B:
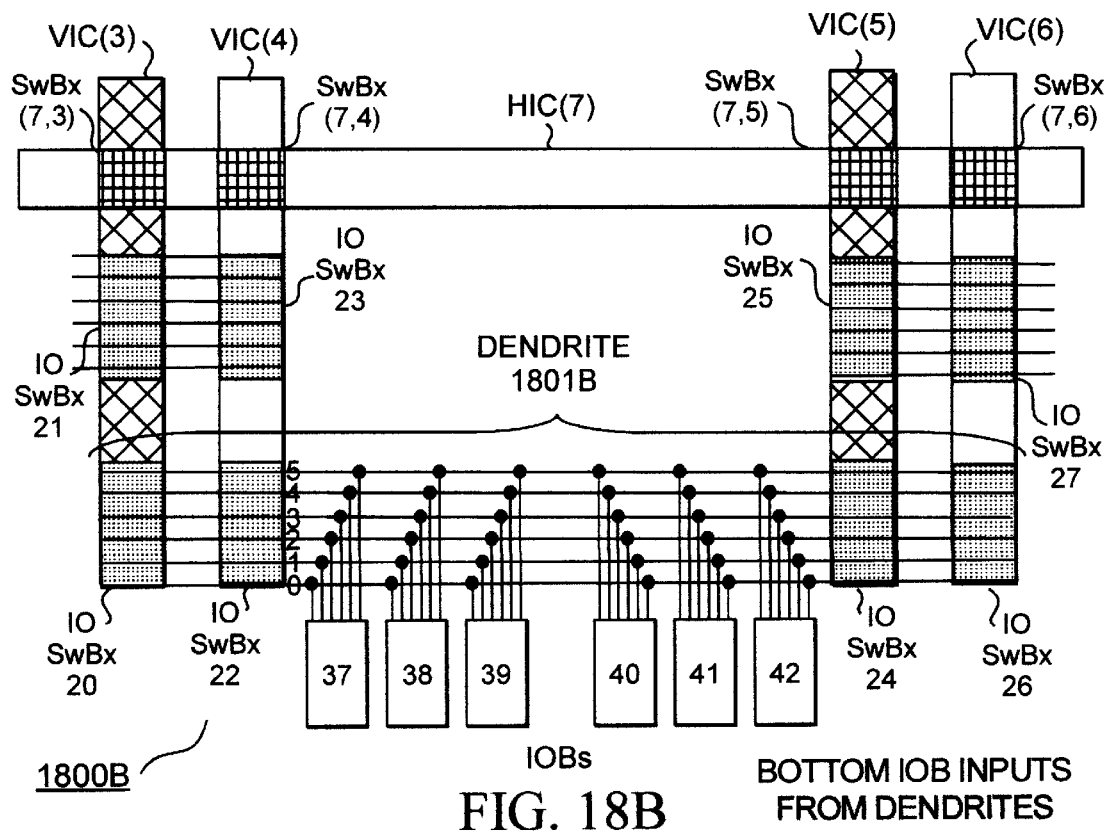

FIGS. 18A–B illustrate connections between top and bottom IOB dendrite inputs and dendrite lines.

Figures 19A, 19B:
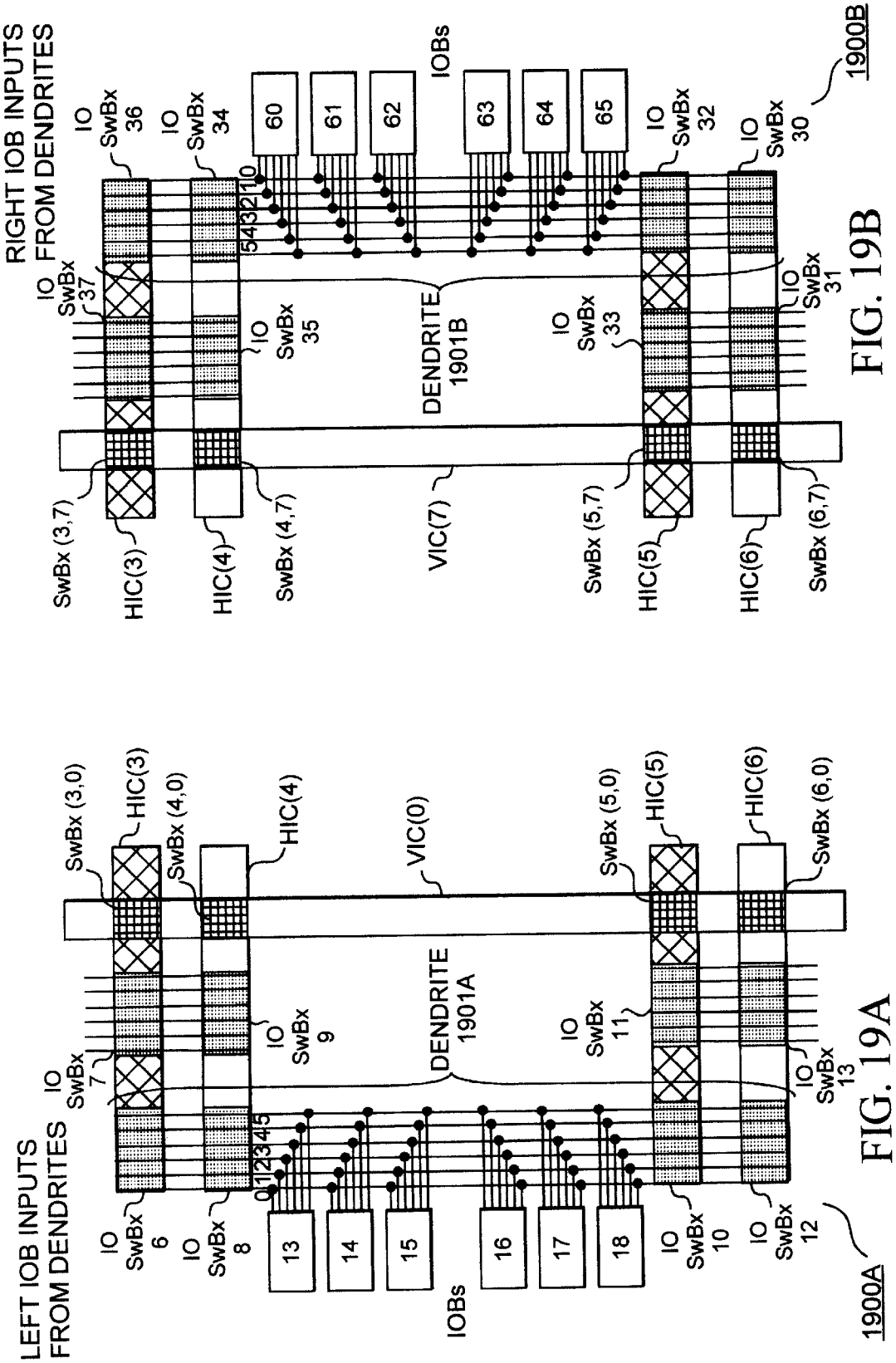
FIGS. 19A and B illustrate connections between left and right IOB outputs and dendrite lines.

FIGS. 19A–B illustrate connections between left and right IOB dendrite inputs and dendrite lines.

FIG. 16A illustrates the connections between top IOB dendrite outputs and dendrite lines 0–5 in dendrite 1601A. Dendrite 1601A includes I/O SwBx 51, I/O SwBx 49, I/O SwBx 47, and I/O SwBx 45. I/O switchboxes are illustrated in detail in FIGS. 20–23 and described in detail below. I/O SwBx 51 is coupled to VIC(3). I/O SwBx 49 is coupled to VIC(4). I/O SwBx 47 is coupled to VIC(5). I/O SwBx 45 is coupled to VIC(6). Dendrite lines 0–5 are programmably configured to I/O SwBx 51, I/O SwBx 49, I/O SwBx 47 and I/O SwBx 45. A dendrite output line for IOB 84 is connected to dendrite line 5. A dendrite output line for IOB 83 is connected to dendrite line 4. A dendrite output line for IOB 82 is connected to dendrite line 3. A dendrite output line for IOB 81 is connected to dendrite line 2. A dendrite output line for IOB 80 is connected to dendrite line 1. A dendrite output line for IOB 79 is connected to dendrite line 0. Portions of adjacent dendrites are also illustrated in FIG. 16A. In particular, a portion of left adjacent dendrite including I/O SwBxs 50 and 48 is illustrated as well as a right adjacent dendrite including I/O SwBxs 46 and 44. Switchboxes SwBx (0,3), SwBx (0,4), SwBx (0,5), and SwBx (0,6) are coupled to HIC(0) in order to route signals between HIC(0) and VIC(3), VIC(4), VIC(5), and VIC(6).

FIG. 16B illustrates the connections between bottom IOB dendrite outputs and dendrite lines 0–5 in dendrite 1601B. Dendrite 1601B includes I/O SwBx 20, I/O SwBx 22, I/O SwBx 24, and I/O SwBx 26. I/O SwBx 20 is coupled to VIC(3). I/O SwBx 22 is coupled to VIC(4). I/O SwBx 24 is coupled to VIC(5). I/O SwBx 26 is coupled to VIC(6). Dendrite lines 0–5 are programmably configured to I/O SwBx 20, I/O SwBx 22, I/O SwBx 24 and I/O SwBx 26. A dendrite output line for IOB 37 is connected to dendrite line 5. A dendrite output line for IOB 38 is connected to dendrite line 4. A dendrite output line for IOB 39 is connected to dendrite line 3. A dendrite output line for IOB 40 is connected to dendrite line 2. A dendrite output line for IOB 41 is connected to dendrite line 1. A dendrite output line for IOB 42 is connected to dendrite line 0. Portions of adjacent dendrites are also illustrated in FIG. 16B. In particular, a portion of left adjacent dendrite including I/O SwBxs 21 and 23 is illustrated as well as a right adjacent dendrite including I/O SwBxs 25 and 27. Switchboxes SwBx (7,3), SwBx (7,4), SwBx (7,5), and SwBx (7,6) are coupled to HIC(7) in order to route signals between HIC(7) and VIC(3), VIC(4), VIC(5), and VIC(6).

FIG. 17A illustrates the connections between left IOB dendrite output lines and dendrite lines 0–5 in dendrite 1701A. Dendrite 1701A includes I/O SwBx 6, I/O SwBx 8, I/O SwBx 10, and I/O SwBx 12. I/O SwBx 6 is coupled to HIC(3). I/O SwBx 8 is coupled to HIC(4) I/O SwBx 10 is coupled to HIC(5). I/O SwBx 12 is coupled to HIC(6). Dendrite lines 0–5 are programmably configured to I/O SwBx 6, I/O SwBx 8, I/O SwBx 10 and I/O SwBx 12. A dendrite output line for IOB 18 is connected to dendrite line 5. A dendrite output line for IOB 17 is connected to dendrite line 4. A dendrite output line for IOB 16 is connected to dendrite line 3. A dendrite output line for IOB 15 is connected to dendrite line 2. A dendrite output line for IOB 14 is connected to dendrite line 1. A dendrite output line for IOB 13 is connected to dendrite line 0. Portions of adjacent dendrites are also illustrated in FIG. 17A. In particular, a portion of bottom adjacent dendrite includes I/O SwBxs 11 and 13 are illustrated as well as a portion of an upper adjacent dendrite including I/O SwBxs 7 and 9. Switchboxes SwBx (3,0), SwBx (4,0), SwBx (5,0), and SwBx (6,0) are coupled to VIC(0) in order to route signals between VIC(0) and HIC(3), HIC(4), HIC(5), and HIC(6).

FIG. 17B illustrates the connections between right IOB dendrite outputs lines and dendrite lines 0–5 in dendrite 1701B. Dendrite 1701B includes I/O SwBx 36, I/O SwBx 34, I/O SwBx 32, and I/O SwBx 30. I/O SwBx 36 is coupled to HIC(3). I/O SwBx 34 is coupled to HIC(4). I/O SwBx 32 is coupled to HIC(5). I/O SwBx 30 is coupled to HIC(6). Dendrite lines 0–5 are programmably configured to I/O SwBx 36, I/O SwBx 34, I/O SwBx 32 and I/O SwBx 30. A dendrite output line for IOB 60 is connected to dendrite line 5. A dendrite output line for IOB 61 is connected to dendrite line 4. A dendrite output line for IOB 62 is connected to dendrite line 3. A dendrite output line for IOB 63 is connected to dendrite line 2. A dendrite output line for IOB 64 is connected to dendrite line 1. A dendrite output line for IOB 65 is connected to dendrite line 0. Portions of adjacent dendrites are also illustrated in FIG. 17B. In particular, a portion of a top adjacent dendrite including I/O SwBxs 37 and 35 are illustrated as well as a bottom adjacent dendrite including I/O SwBxs 33 and 31. Switchboxes SwBx (3,7), SwBx (4,7), SwBx (5,7), and SwBx (6,7) are coupled to VIC(7) in order to route signals between VIC(7) and HIC(3), HIC(4), HIC(5), and HIC(6).

FIG. 18A illustrates the connections between top IOB dendrite inputs and dendrite lines. Dendrite 1801A includes I/O SwBxs 51, 49, 47 and 45 along with dendrite lines 0–5. The six dendrite inputs to IOB 84 are connected to respective dendrite lines 0–5. Dendrite line outputs to IOBs 83 and 82 are likewise connected from dendrite lines 0–5. Dendrite line outputs to IOB 81 are connected from dendrite lines 0–5. IOBs 80 and 79 have likewise connections between IOB dendrite inputs and dendrite 1801A. Portions of left and right adjacent dendrites are also illustrated in FIG. 18A. As can be seen, I/O SwBx 51, I/O SwBx 50, and SwBx (0,3) are coupled to VIC(3). I/O SwBx 49, I/O SwBx 48, and SwBx (0,4) are likewise coupled to VIC(4). I/O SwBx 47, I/O SwBx 46, and SwBx (0,5) are likewise coupled to VIC(5). I/O SwBx 45, I/O SwBx 44, and SwBx (0,6) are coupled to VIC(6). SwBxs (0,3), (0,4), (0,5), and (0,6) are also coupled to HIC(0) for routing signals between the various inter-connect channels.

FIG. 18B illustrates the connections between bottom IOB dendrite inputs and dendrite lines. Dendrite 1801B includes I/O SwBx 20, 22, 24 and 26 along with dendrite lines 0–5. The six dendrite line outputs to IOB 37 are connected to respective dendrite lines 0–5. Dendrite line outputs to IOBs 38 and 39 are likewise connected to dendrite lines 0–5. Dendrite line outputs for IOB 40 are connected to dendrite lines 0–5. IOBs 41 and 42 have likewise connections between IOB dendrite inputs and dendrite 1801B. Portions of adjacent left and right dendrites are also illustrated in FIG. 18B. I/O SwBx 21, I/O SwBx 20, and SwBx (7,3) are coupled to VIC(3). I/O SwBx 22, I/O SwBx 23, and SwBx (7,4) are likewise coupled to VIC(4). I/O SwBx 24, I/O SwBx 25, and SwBx (7,5) are coupled to VIC(5). I/O SwBx 26, I/O SwBx 27, and SwBx (7,6) are coupled to VIC(6). SwBxs (7,3), (7,4), (7,5), and (7,6) are also coupled to HIC(7) for routing signals between the various inter-connect channels.

FIG. 19A illustrates the connections between left IOB dendrite inputs and dendrite lines. Dendrite 1901A includes I/O SwBxs 6, 8, 10 and 12 along with dendrite lines 0–5. The six dendrite line outputs to IOB 13 are connected to respective dendrite lines 0–5. Dendrite line outputs to IOBs 14 and 15 are likewise connected to dendrite lines 0–5. Dendrite line outputs for IOB 16 are connected to dendrite lines 0–5. IOBs 17 and 18 have likewise connections between IOB dendrite inputs and dendrite 1901A. Portions of adjacent top and bottom dendrites are also illustrated in FIG. 19A. I/O SwBx 7, I/O SwBx 6, and SwBx (3,0) are coupled to HIC(3). I/O SwBx 8, I/O SwBx 9, and SwBx (4,0) are likewise coupled to HIC(4). I/O SwBx 10, I/O SwBx 11, and SwBx (5,0) are likewise coupled to HIC(5). I/O SwBx 12, I/O SwBx 13, and SwBx (6,0) are coupled to HIC(6). SwBx (3,0), (4,0), (5,0), and (6,0) are also coupled to VIC(0) for routing signals between various inter-connect channels.

FIG. 19B illustrates the connections between right IOB dendrite inputs and dendrite lines. Dendrite 1901B includes I/O SwBxs 36, 34, 32 and 30 along with dendrite lines 0–5. The six dendrite line inputs for IOB 60 are connected to respective dendrite lines 0–5. Dendrite line outputs to IOBs 61 and 62 are likewise connected to dendrite lines 0–5. Dendrite line outputs 0–5 for IOB 63 are connected to dendrite lines 0–5. IOBs 64 and 65 have likewise connections between IOB dendrite inputs 0–5 and dendrite 1901B. Portions of adjacent top and bottom dendrites are also illustrated in FIG. 19B. I/O SwBx 36, I/O SwBx 37, and SwBx (3,7) are coupled to HIC(3). I/O SwBx 34, I/O SwBx 35, and SwBx (4,7) are likewise coupled to HIC(4). I/O SwBx 32, I/O SwBx 33, and SwBx (5,7) are likewise coupled to HIC(5). I/O SwBx 30, I/O SwBx 31, and SwBx (6,7) are coupled to HIC(6). SwBxs (3,7), (4,7), (5,7), and (6,7) are also coupled to VIC(7) for routing signals between the various inter-connect channels.

FIGS. 20–23 illustrate the IOB switchboxes for even and odd inter-connect channels for dendrites positioned adjacent top, right, bottom, and left IOBs as illustrated in FIGS. 15–19.

Figure 20:
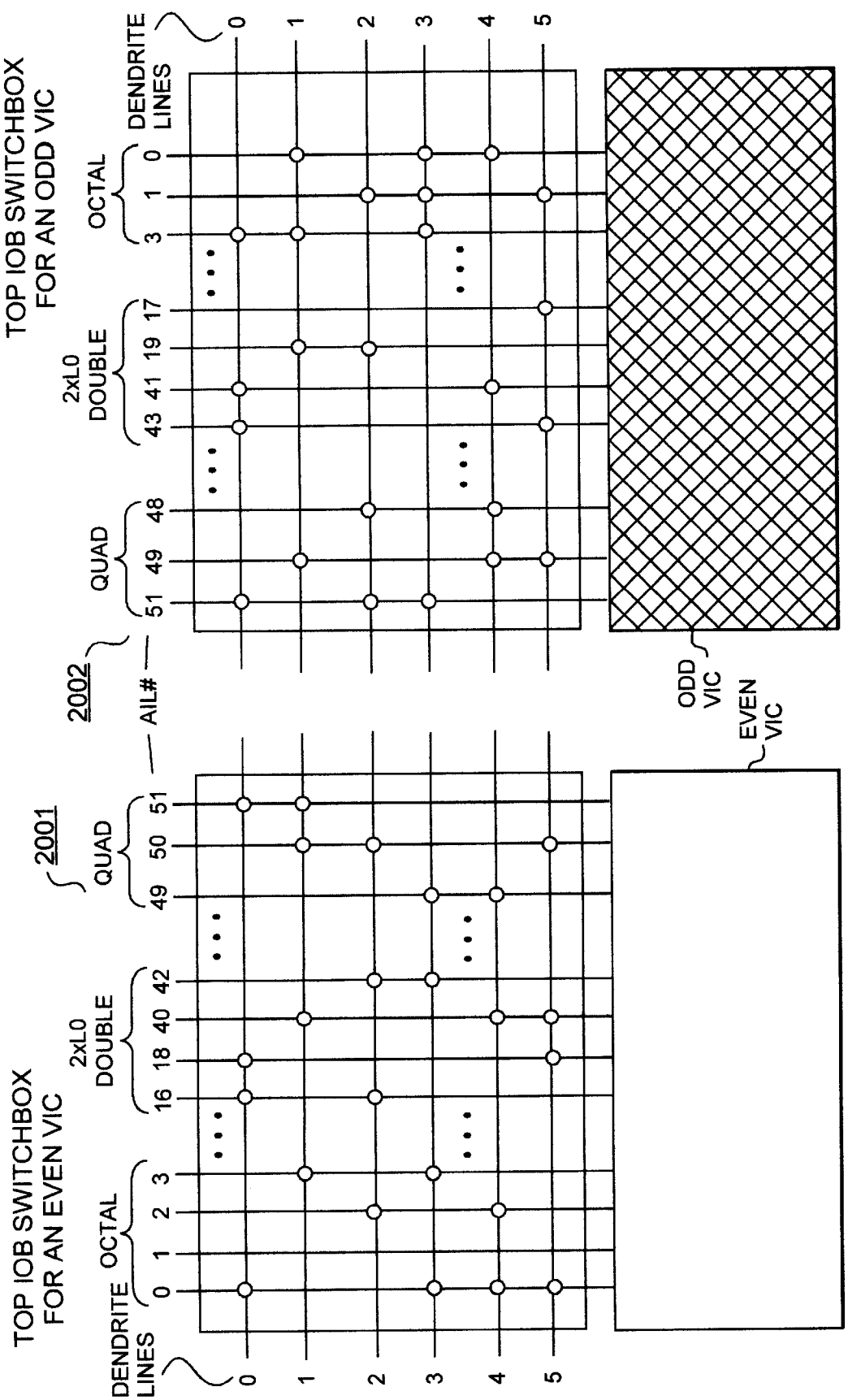
FIG. 20 illustrates a top IOB switchbox in a dendrite.

FIG. 20 illustrates IOB switchboxes in dendrites adjacent top IOBs coupled to even and odd vertical inter-connect channels. In an embodiment, switchbox 2001 adjacent top IOBs corresponds to I/O SwBxs 49 and 45 illustrated in FIGS. 15 and 16A. In this embodiment, an even VIC illustrated in FIG. 20 likewise corresponds to VIC(4) and VIC(6) illustrated in FIGS. 15 and 16A.

Similarly, switchbox 2002 adjacent top IOBs corresponds to I/O SwBxs 51 and 47 illustrated in FIGS. 15 and 16A. In an embodiment, an odd VIC may correspond to VIC(5) and VIC(3) respectively also illustrated in FIGS. 15 and 16A.

As can be seen in FIG. 20, PIPs are used to configurably connect AILs in even and odd vertical inter-connect channels to dendrite lines 0–5. Specifically, octal, double and quad AIL lines in even VICs are programmably configured to dendrite lines 0–5. In IOB switchbox 2001 adjacent top IOBs, AILs #0, 16, 18, and 51 are programmably configured by PIPs to dendrite line 0. AILs #3, 40, 50 and 51 are programmably configured by PIPs to dendrite line 1. AILs #2, 16, 42, and 50 are programmably configured by PIPs to dendrite line 2. AILs #0, 3, 42, and 49 are programmably configured by PIPs to dendrite line 3. AILs #0, 2, 40, and 49 are programmably configured by PIPs to dendrite line 4. AILs #0, 18, 40, and 50 are programmably configured by PIPs to dendrite line 5.

Likewise, IOB switchbox 2002 adjacent top IOBs uses PIPs to programmably configure AILs in odd VICs to dendrite lines. Specifically, octal, double and quad AIL lines in VICs are programmably configured to dendrite lines 0–5. In switchbox 2002 adjacent top IOBs, AILs #3, 41, 43, and 51 are programmably configured by PIPs to dendrite line 0. AILs #0, 3, 19 and 49 are programmably configured by PIPs to dendrite line 1. AILs #1, 19, 48, and 51 are programmably configured by PIPs to dendrite line 2. AILs #0, 1, 3, and 51 are programmably configured by PIPs to dendrite line 3. AILs #0, 41, 48, and 49 are programmably configured by PIPs to dendrite line 4. AILs #1, 17, 43, and 49 are programmably configured by PIPs to dendrite line 5.

Figure 21:
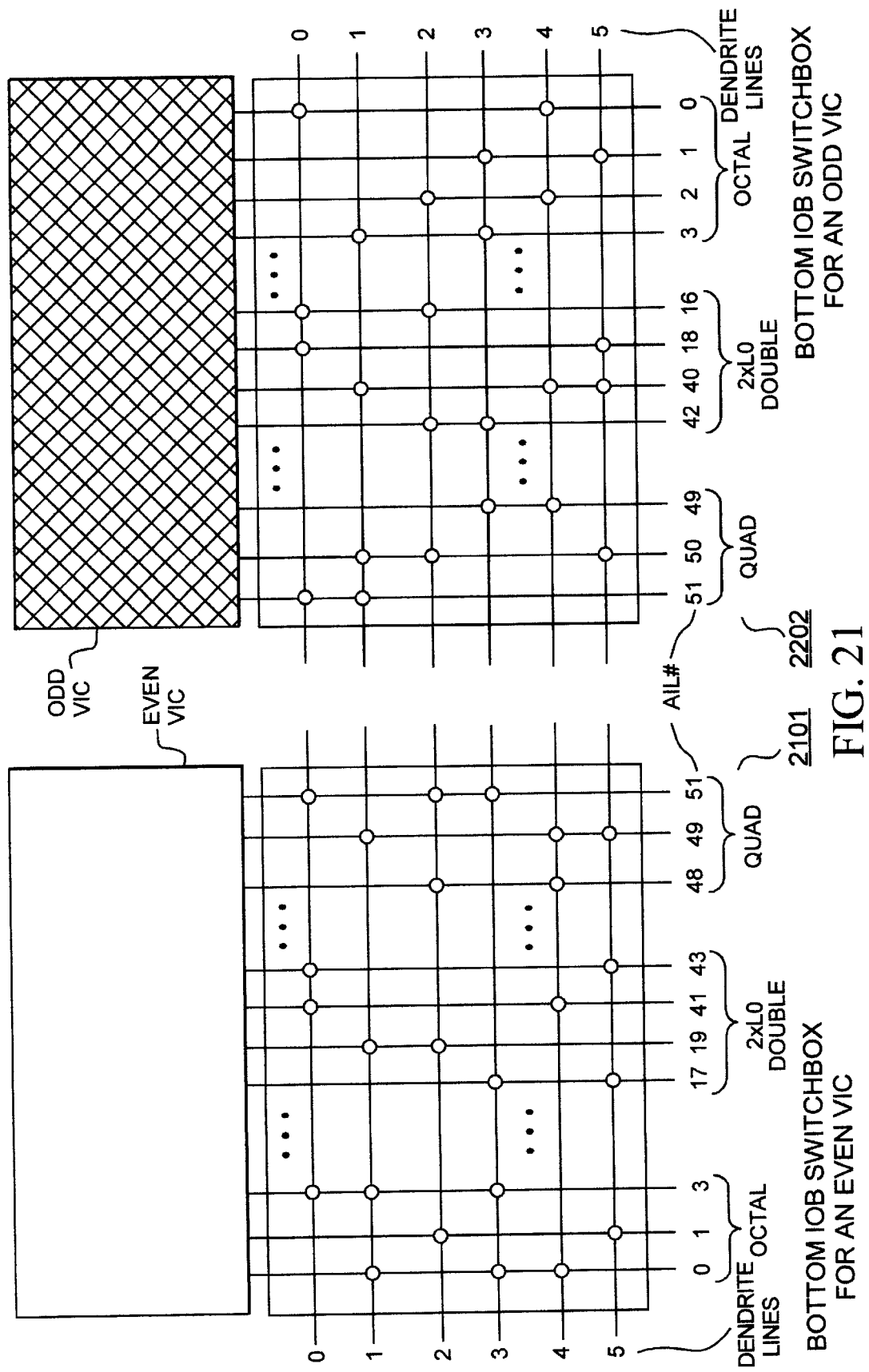
FIG. 21 illustrates a bottom IOB switchbox in a dendrite.

FIG. 21 illustrates IOB switchboxes in dendrites adjacent bottom IOBs for an even and odd vertical inter-connect channel. In an embodiment, switchbox 2101 corresponds to I/O SwBxs 22 and 26 illustrated in FIG. 16B. In this embodiment, an even VIC illustrated in FIG. 21 likewise corresponds to VIC(4) and VIC(6) illustrated in FIG. 16B.

Similarly, switchbox 2102 corresponds to I/O SwBxs 20 and 24 illustrated in FIG. 16B. In an embodiment, an odd VIC corresponds to VIC(3) and VIC(5), respectively, which is also illustrated in FIG. 16B.

PIPs are used to programmably configure AILs in even and odd vertical inter-connect channels to dendrite lines 0–5. Specifically, octal, double and quad AIL lines are programmably configured to dendrite lines 0–5. In IOB switchbox 2101, AILs #3, 41, 43, and 51 are programmably configured by PIPs to dendrite line 0. AILs #0, 3, 19 and 49 are programmably configured by PIPs to dendrite line 1. AILs #1, 19, 48, and 51 are programmably configured by PIPs to dendrite line 2. AILs #0, 3, 17, and 51 are programmably configured by PIPs to dendrite line 3. AILs #0, 41, 48, and 49 are programmably configured by PIPs to dendrite line 4. AILs #1, 17, 43, and 49 are programmably configured by PIPs to dendrite line 5.

IOB switchbox 2102, like IOB switchbox 2101, uses PIPs to programmably configure AILs in odd VICs to dendrite lines adjacent bottom IOBs. Specifically, octal, double and quad AIL lines are programmably configured to dendrite lines 0–5. In switchbox 2102 adjacent bottom IOBs, AILs #0, 16, 18, and 51 are programmably configured by PIPs to dendrite line 0. AILs #3, 40, 50 and 51 are programmably configured by PIPs to dendrite line 1. AILs #2, 16, 42, and 50 are programmably configured by PIPs to dendrite line 2. AILs #1, 3, 42, and 49 are programmably configured by PIPs to dendrite line 3. AILs #0, 2, 40, and 49 are programmably configured by PIPs to dendrite line 4. AILs #1, 18, 40, and 50 are programmably configured by PIPs to dendrite line 5.

Figure 22:
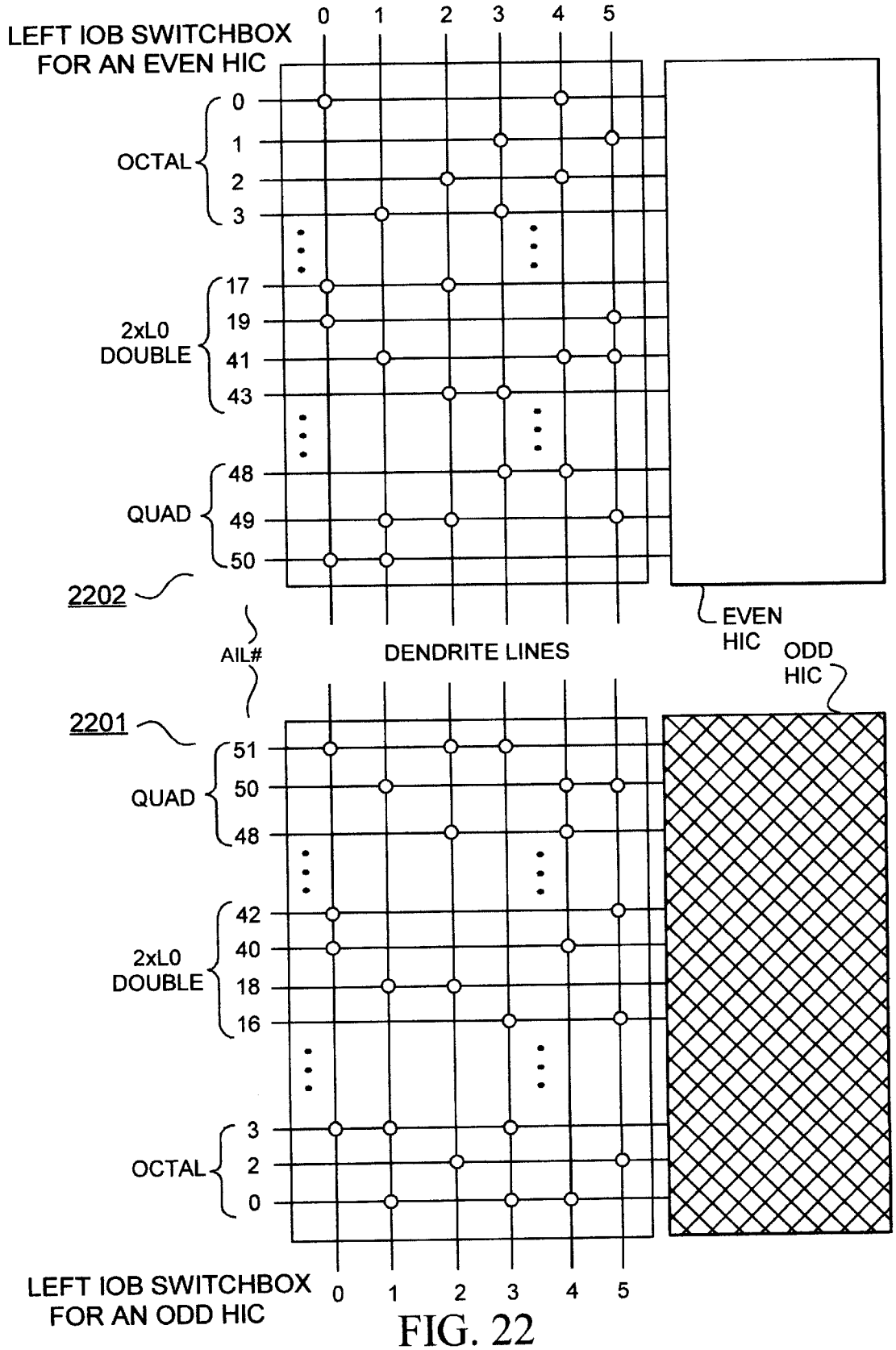
FIG. 22 illustrates a left IOB switchbox in a dendrite.

FIG. 22 illustrates IOB switchboxes in dendrites adjacent left IOBs for even and odd horizontal inter-connect channels. In an embodiment, switchbox 2202 corresponds to I/O SwBxs 8 and 12 illustrated in FIG. 17A. An even HIC illustrated in FIG. 22 likewise corresponds to HIC(4) and HIC(6) illustrated in FIG. 17A.

Likewise, switchbox 2201 corresponds to I/O SwBxs 6 and 10 illustrated in FIG. 17A. In an embodiment, an odd HIC may correspond to HIC(3) and HIC(5), respectively, also illustrated in FIG. 17A.

PIPs are used to programmably configure AILs in even and odd horizontal inter-connect channels to dendrite lines 0–5. Specifically, octal, double and quad AIL lines are programmably configured to dendrite lines 0–5. In switchbox 2201 adjacent left IOBs, AILs #3, 40, 42, and 51 are programmably configured by PIPs to dendrite line 0. AILs #0, 3, 18 and 50 are programmably configured by PIPs to dendrite line 1. AILs #2, 18, 48, and 51 are programmably configured by PIPs to dendrite line 2. AILs #0, 3, 16, and 51 are programmably configured by PIPs to dendrite line 3. AILs #0, 40, 48, and 50 are programmably configured by PIPs to dendrite line 4. AILs #2, 16, 42, and 50 are programmably configured by PIPs to dendrite line 5.

IOB switchbox 2202 also uses PIPs to programmably configure AILs in even HICs to dendrite lines adjacent left IOBs. Specifically, octal, double and quad AIL lines are programmably configured to dendrite lines 0–5. IOB switchbox 2202 adjacent left IOBs, AILs #0, 17, 19, and 50 are programmably configured by PIPs to dendrite line 0. AILs #3, 41, 49 and 50 are programmably configured by PIPs to dendrite line 1. AILs #2, 17, 43, and 49 are programmably configured by PIPs to dendrite line 2. AILs #1, 3, 43, and 48 are programmably configured by PIPs to dendrite line 3. AILs #0, 2, 41, and 48 are programmably configured by PIPs to dendrite line 4. AILs #1, 19, 41, and 49 are programmably configured by PIPs to dendrite line 5.

Figure 23:
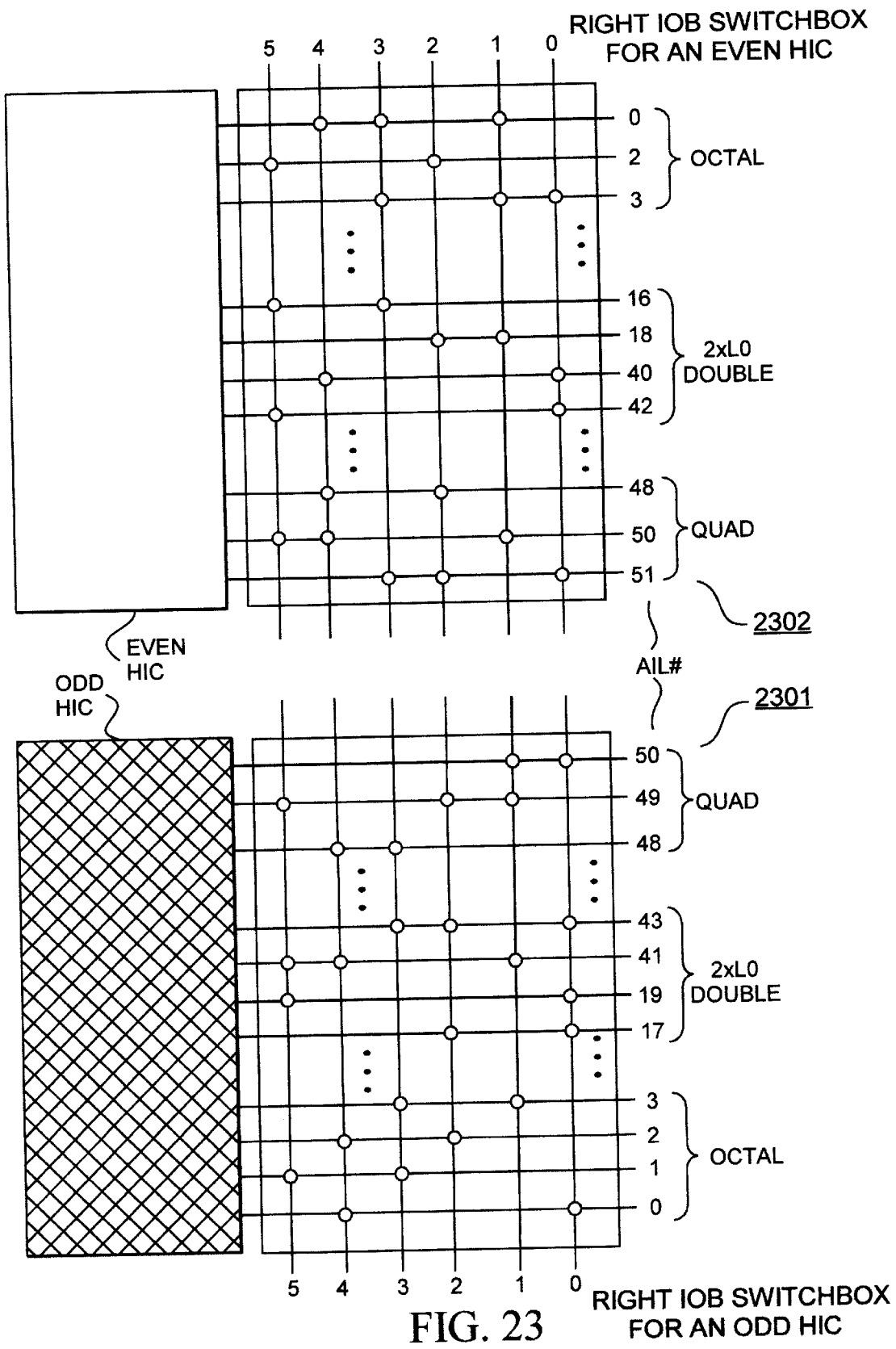
FIG. 23 illustrates a right IOB switchbox.

FIG. 23 illustrates IOB switchboxes in dendrites adjacent right IOBs for even and odd horizontal inter-connect channels. In an embodiment, IOB switchbox 2301 corresponds to I/O SwBxs 32 and 36 illustrated in FIG. 17B. Odd HICs illustrated in FIG. 23 likewise corresponds to HIC(3) and HIC(5) illustrated in FIG. 17B.

Likewise, switchbox 2302 corresponds to I/O SwBxs 34 and 30 illustrated in FIG. 17B. An even HIC may correspond to HIC(4) and HIC(6) also illustrated in FIG. 17B.

PIPs are used to programmably configure AILs in even and odd horizontal inter-connect channels to dendrite lines 0–5. Specifically, octal, double and quad AIL lines are programmably configured to dendrite lines 0–5. In IOB switchbox 2301 adjacent right IOBs, AILs #0, 17, 19, 43, and 50 are programmably configured by PIPs to dendrite line 0. AILs #3, 41, 49 and 50 are programmably configured by PIPs to dendrite line 1. AILs #2, 17, 43, and 49 are programmably configured by PIPs to dendrite line 2. AILs #1, 3, 43, and 48 are programmably configured by PIPs to dendrite line 3. AILs #0, 2, 41, and 48 are programmably configured by PIPs to dendrite line 4. AILs #1, 19, 41, and 49 are programmably configured by PIPs to dendrite line 5.

IOB switchbox 2302 also uses PIPs to programmably configure AILs in even HICs to dendrite lines adjacent right IOBs. Specifically, octal, double and quad AIL lines are programmably configured to dendrite lines 0–5. In IOB switchbox 2302, AILs #3, 40, 42, and 51 are programmably configured by PIPs to dendrite line 0. AILs #0, 3, 18 and 50 are programmably configured by PIPs to dendrite line 1. AILs #2, 18, 48, and 51 are programmably configured by PIPs to dendrite line 2. AILs #0, 3, 16, and 51 are programmably configured by PIPs to dendrite line 3. AILs #0, 40, 48, and 50 are programmably configured by PIPs to dendrite line 4. AILs #2, 16, 42, and 50 are programmably configured by PIPs to dendrite line 5.

Figure 24:
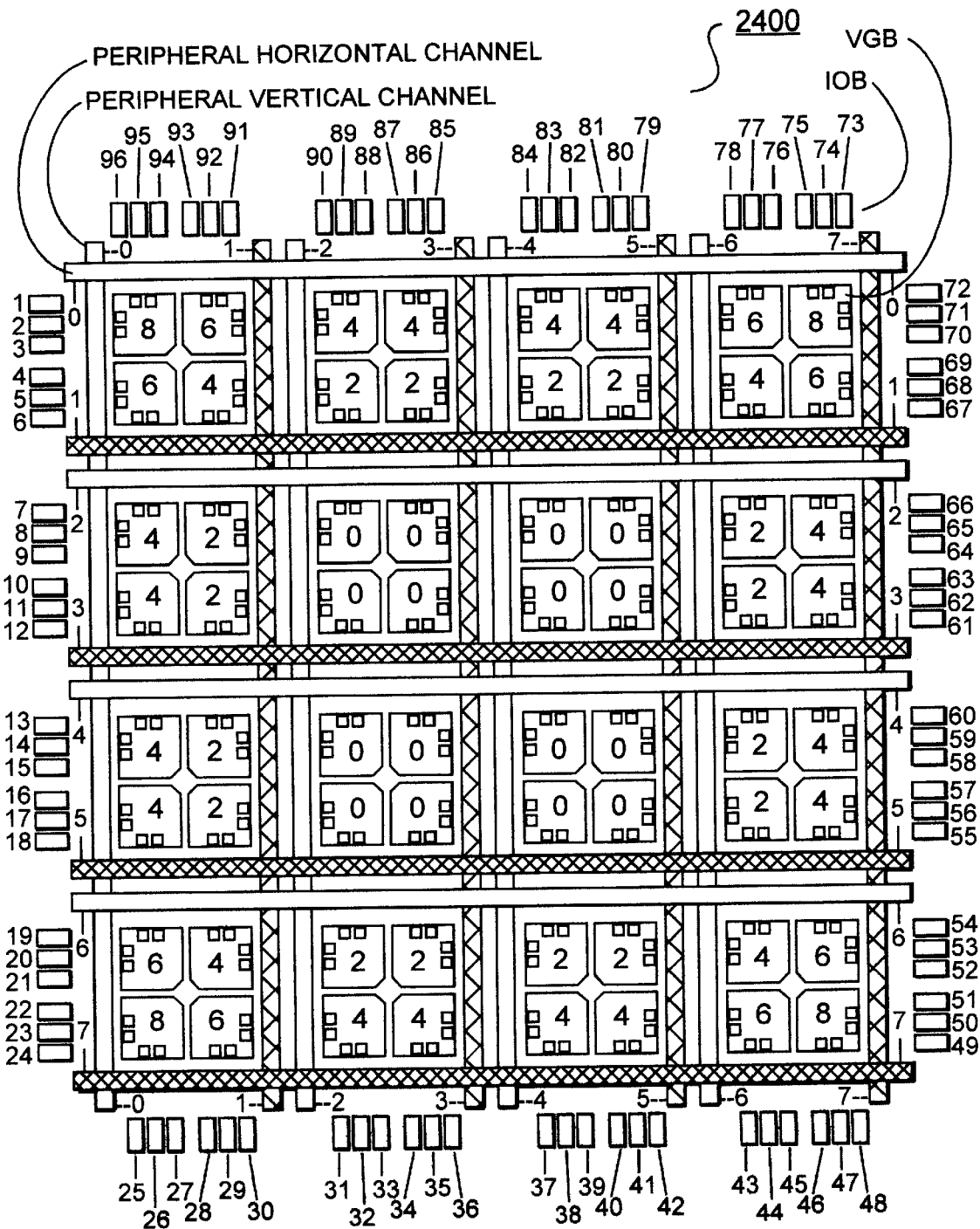
FIG. 24 illustrates the number of direct signals available between IOB and VGBs.

FIG. 24 illustrates the number of direct connect output signals which may be generated from particular VGBs to adjacent IOBs as well as the number of direct connect input signals which may be generated by IOBs to particular VGBs. FPGA 2400 illustrated in FIG. 24 corresponds to FPGA 800 as illustrated in FIG. 8. However, the corresponding VGB references, such as VGB(0,0), are replaced with the number of available direct connect input and output signals from and to adjacent IOBs. For example, VGB(0,0) has eight available direct connect input signals from adjacent IOBs and may output eight direct connect output signals on direct connect lines to adjacent IOBs, such as IOB 96. Similarly, VGB(0,1) has six direct connect input and output signals available from and to adjacent IOBs. VGB (1,0) likewise has six direct connect input and output signals available from and to adjacent IOBs. VGB(1,1) has four direct connect input and output signals available from and to adjacent IOBs.

The three other respective super-VGBs at respective corners of FPGA 2400 have similar direct connect capabilities.

The top, right, bottom, and left non-corner super-VGBs have similar direct connect capabilities. For example, VGB (0,2) and VGB(0,3) have four respective direct connect input and output signals available from and to adjacent IOBs. VGB(1,2) and VGB(1,3) have two respective direct connect input and output signals available from and to adjacent IOBs.

As can be seen from FIG. 24, the center super-VGBs, such as VGBs (2,2), (2,3), (3,2), and (3,3), do not have direct connect inputs and outputs in this embodiment.

FIGS. 25–28 illustrate a detailed direct connect architecture between adjacent IOBs and super-VGBs.

Figure 25:
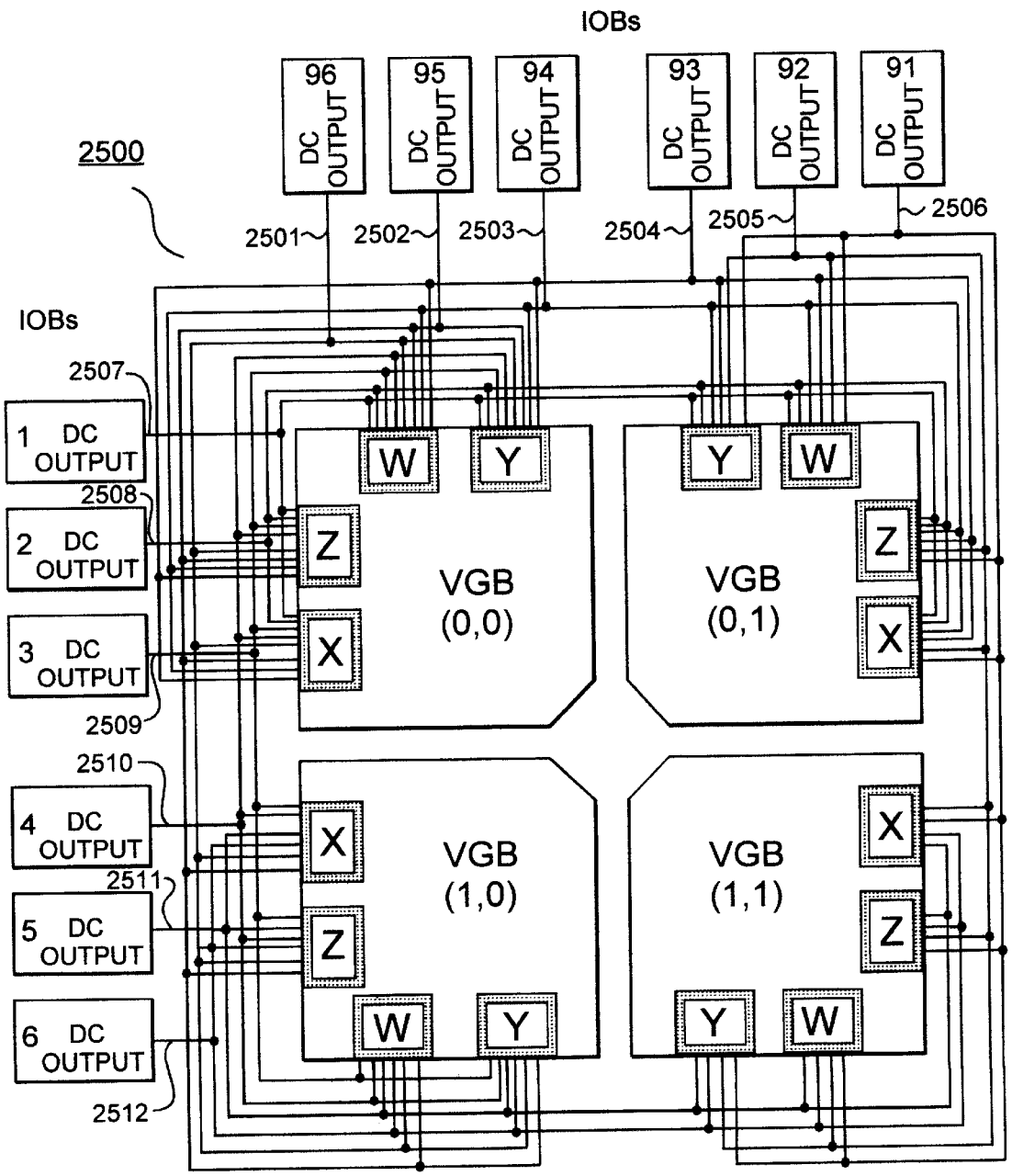
FIG. 25 illustrates a direct connect architecture between corner IOB direct connect outputs and corner super-VGB inputs.

FIG. 25 illustrates a direct connect architecture 2500 between corner IOBs direct connect outputs and a corner super-VGB, including VGBs (0,0), (0,1), (1,0), and (1,1). FIG. 25 illustrates an expanded view of the upper lefthand corner of FIG. 8. In particular, FIG. 25 illustrates the direct connect output connections between IOBs 1–6 and 91–96 to VGBs (0,0), (0,1), (1,0), (1,1).

Direct connect outputs from corner IOBs 1–6 and 96–91 are connected to CBBs Y, W, Z, and X in VGBs (0,0), (0,1), (1,0), (1,1) by direct connect lines 2501–2512. A direct connect output of IOB 1 is connected to direct connect line 2507. Direct connect line 2507 is connected to CBBs Y, W, Z, and X in VGB (0,0) and (0,1). A direct connect output of IOB 2 is connected to direct connect line 2508. Direct connect line 2508 is connected to CBBs Y, W, Z, and X in VGB (0,0) and (0,1). A direct connect output of IOB 3 is connected to direct connect line 2509. Direct connect line 2509 is connected to CBBs Y, W, Z, and X in VGBs (0,0) and (1,0). A direct connect output of IOB 4 is connected to direct connect line 2510. Direct connect line 2510 is connected to CBBs Y, W, Z, and X in VGBs (0,0) and (1,0). A direct connect output of IOB 5 is connected to direct connect line 2511. Direct connect line 2511 is connected to CBBs Y, W, Z, and X in VGBs (1,0) and (1,1). A direct connect output of IOB 6 is connected to direct connect line 2512. Direct connect line 2512 is connected to CBBs Y, W, Z, and X in VGBs (1,0) and (1,1). Direct connect output in IOB 91 is connected to direct connect line 2506. Direct connect line 2506 is connected to CBBs Y, W, Z, and X in VGBs (0,1) and (1,1). A direct connect output in IOB 92 is connected to direct connect line 2505. Direct connect line 2505 is connected to CBBs Y, W, Z, and X in VGBs (0,1) and (1,1). A direct connect output in IOB 93 is connected to direct connect 2504. Direct connect 2504 is connected to CBBs Y, W, Z, and X in VGBs (0,0) and (0,1). Direct connect output in IOB 94 is connected to direct connect line 2503. Direct connect line 2503 is connected to CBBs Y, W, Z, and X and VGBs (0,0) and (0,1). A direct connect output in IOB 95 is connected to direct connect line 2502. Direct connect line 2502 is connected to CBBs Y, W, Z, and X in VGBs (0,0) and (1,0). A direct connect output in IOB 96 is connected to direct connect line 2501. Direct connect line 2501 is connected to CBBs Y, W, Z, and X in VGBs (0,0) and (1,O).

A similar direct connect architecture is repeated for the other corner IOBs illustrated in FIG. 8. For example, a similar direct connect architecture may be used for the corner IOBs 67–78, 43–54 and 19–30 with respective VGBs (0,6), (0,7), (1,6), (1,7); (6,6), (6,7), (7,6), (7,7); and (6,0), (6,1), (7,0), (7,1) respectively.

Figure 26:
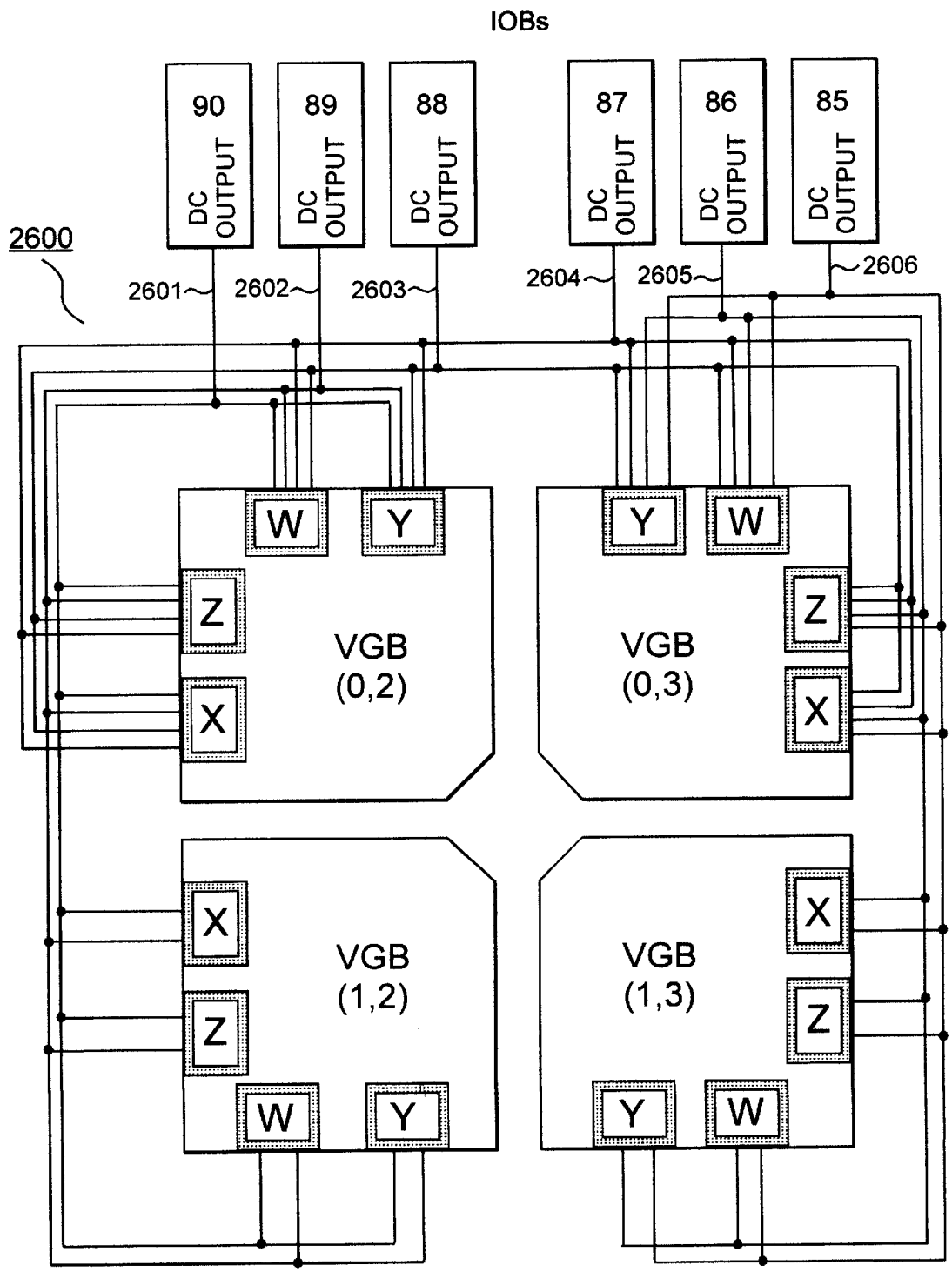
FIG. 26 illustrates a direct connect architecture between non-corner IOB direct connect outputs and non-corner super-VGB inputs.

FIG. 26 illustrates a direct connect architecture 2600 between non-corner IOB direct connect outputs and non-corner VGBs. FIG. 26 corresponds to IOBs 85–90 and VGBs (0,2), (0,3), (1,2) and (1,3) illustrated in FIG. 8. Direct connect outputs of IOBs 85–90 are connected to CBBs Y, W, Z, and X in VGBs (0,2), (0,3), (1,2) and (1,3). Specifically, a direct connect output of IOB 90 is connected to direct connect line 2601. Direct connect line 2601 is connected to CBBs Y, W, Z, and X in VGBs (0,2) and (1,2). A direct connect output in IOB 89 is connected to direct connect line 2602. Direct connect line 2602 is connected to CBBs Y, W, Z, and X in VGB (0,2) and (1,2). A direct connect output in IOB 88 is connected to direct connect line 2603. Direct connect line 2603 is connected to CBBs Y, W, Z, and X in VGBs (0,2) and (0,3). A direct connect output in IOB 87 is connected to direct connect line 2604. Direct connect line 2604 is connected to CBBs Y, W, Z, and X in VGBs (0,2) and (0,3). A direct connect output in IOB 86 is connected to direct connect line 2605. Direct connect line 2605 is connected to CBBs Y, W, Z, and X in VGBs (0,3) and (1,3). A direct connect output in IOB 85 is connected to direct connect line 2606. Direct connect line 2606 is connected to CBBs Y, W, Z, and X in VGBs (0,3) and (1,3).

A similar direct connect architecture is repeated with other non-corner IOBs. For example, IOBs 79–84 and VGB (0,4), (0,5), (1,4), and (1,5) may have a similar direct connect architecture. Further, IOBs 7–18, 31–42 and 55–66 may have a similar direct connect architecture with respective adjacent non-corner VGBs.

FIGS. 27A–L illustrate a direct connect architecture 2700*a–l* between corner IOB direct connect inputs and corner VGBs. FIGS. 27A–L illustrate an expanded view of the upper lefthand corner of FIG. 8. In particular, FIGS. 27A–L illustrate the direct connect input connections between IOBs 1–6 and 91–96 and VGBs (0,0), (0,1), (1,0), (1,1).

Direct connect inputs to corner IOBs 1–6 and 96–91 are connected to CBBs Y, W, Z, and X in VGBs (0,0), (0,1), (1,0), (1,1) by direct connect lines 2701*a–l* to 2708*a–l*.

Figure 27A:
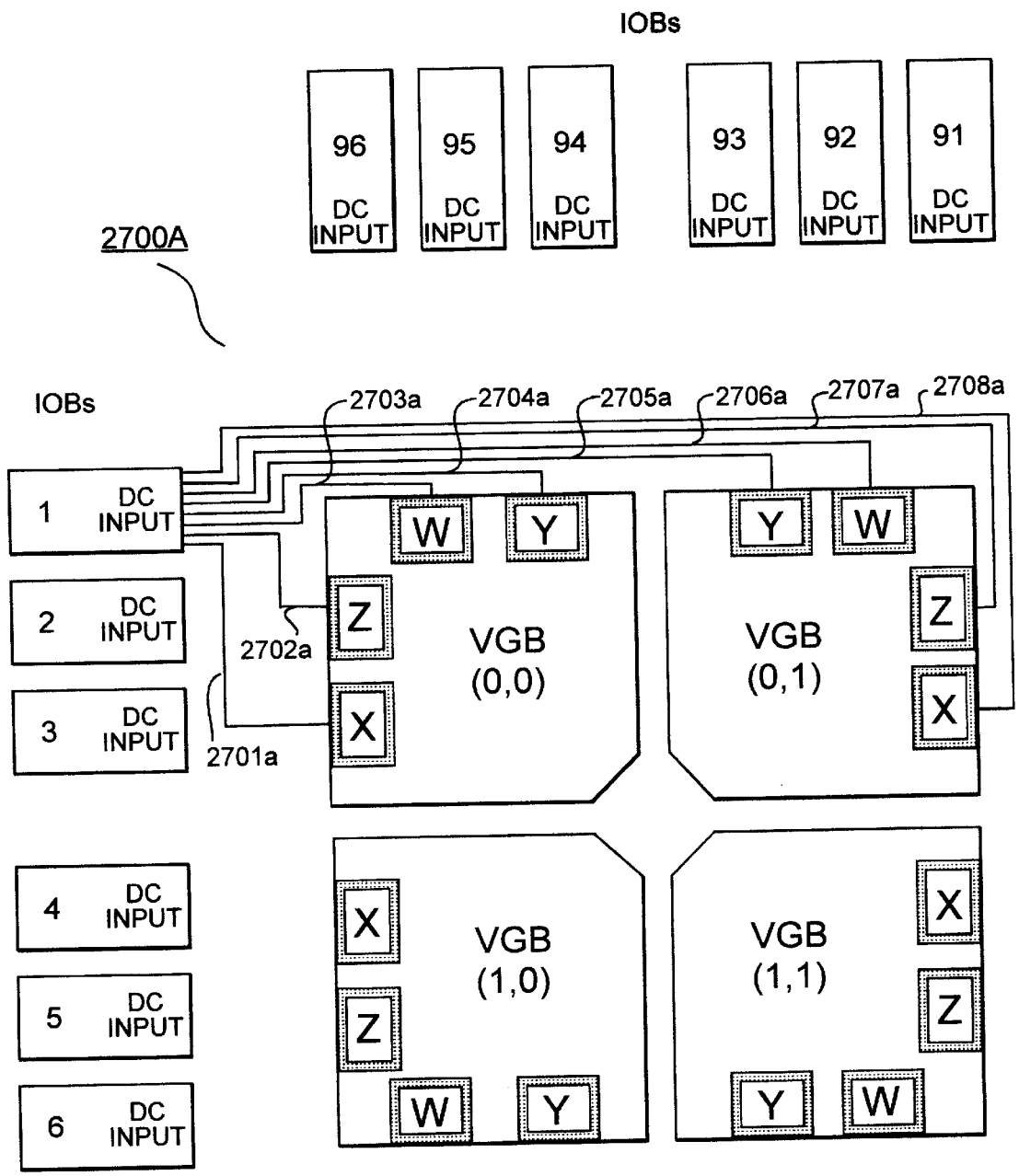
FIGS. 27A–L illustrate a direct connect architecture between corner super-VGB outputs and corner IOB direct connect inputs.

FIG. 27A illustrates direct connect inputs of IOB 1 which are connected to direct connect lines 2701*a*–2708*a*. Direct connect lines 2701*a*–2708*a* are connected to CBBs Y, W, Z, and X in VGB (0,0) and (0,1).

Figure 27B:
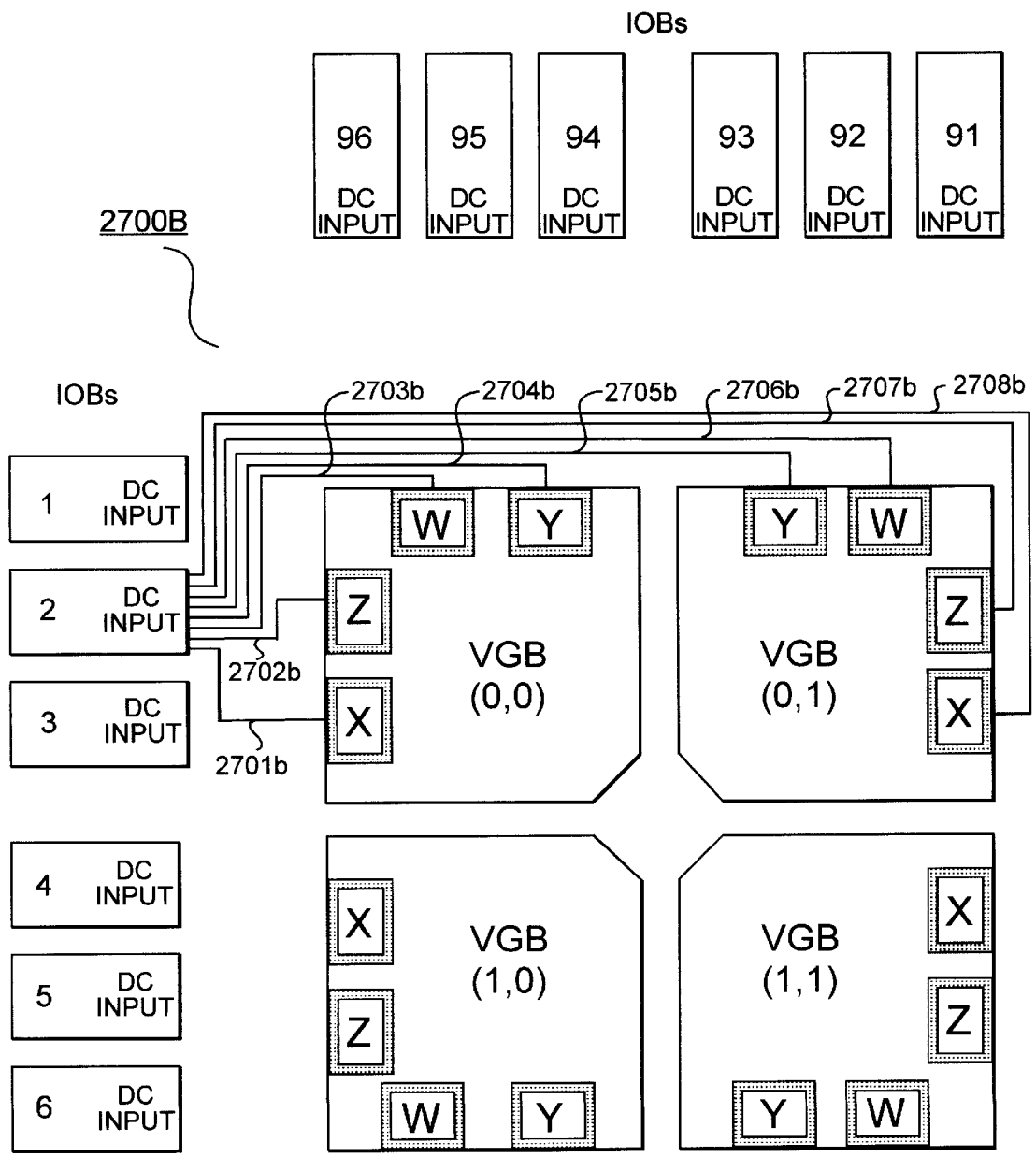

FIG. 27B illustrates direct connect inputs of IOB 2 which are connected to direct connect lines 2701*b*–2708*b*. Direct connect lines 2701*b*–2708*b* are connected to CBBs Y, W, Z, and X in VGB (0,0) and (0,1).

Figure 27C:
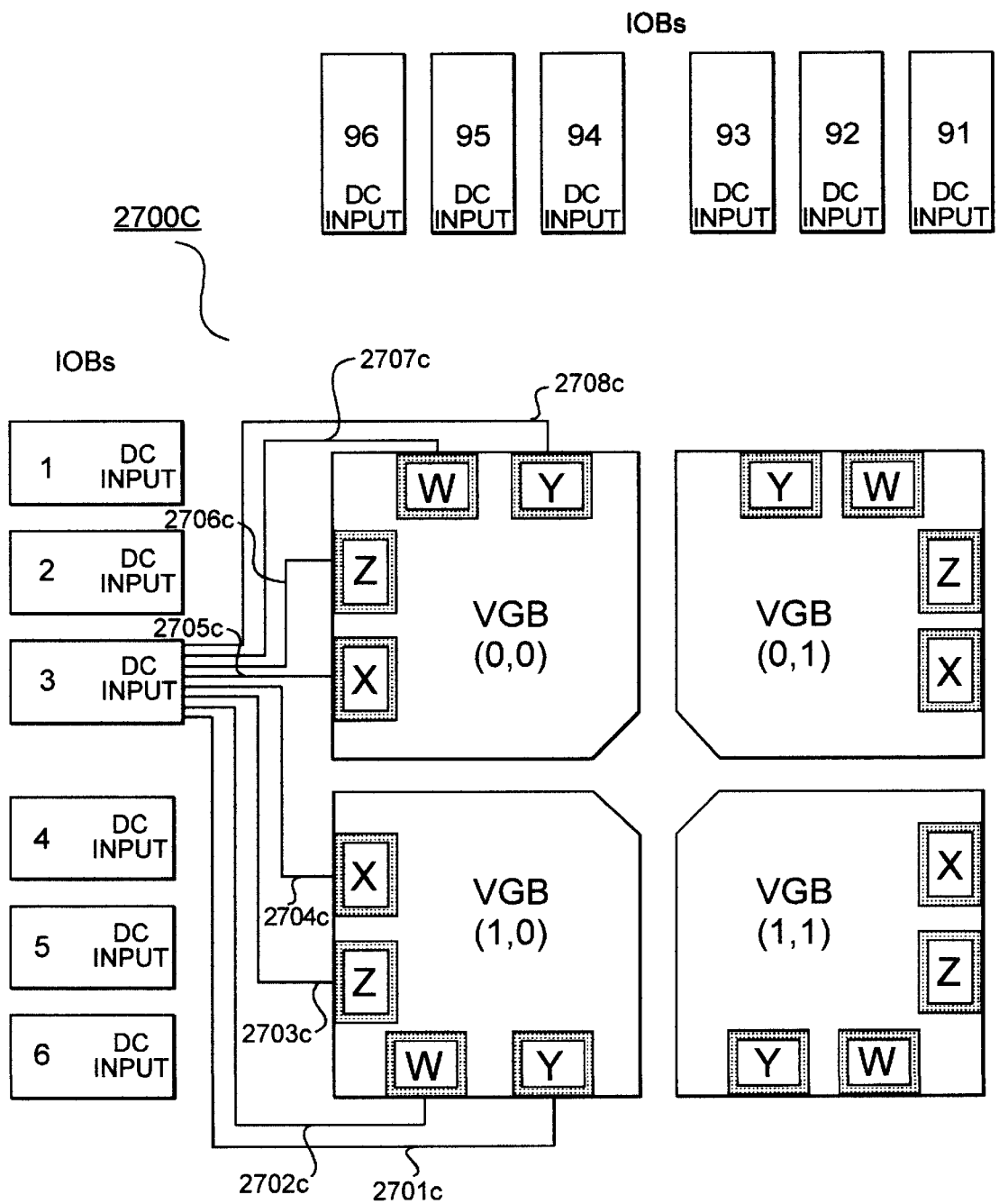

FIG. 27C illustrates direct connect inputs of IOB 3 which are connected to direct connect lines 2701*c*–2708*c*. Direct connect lines 2701*c*–2708*c* are connected to CBBs Y, W, Z, and X in VGBs (0,0) and (1,0).

Figure 27D:
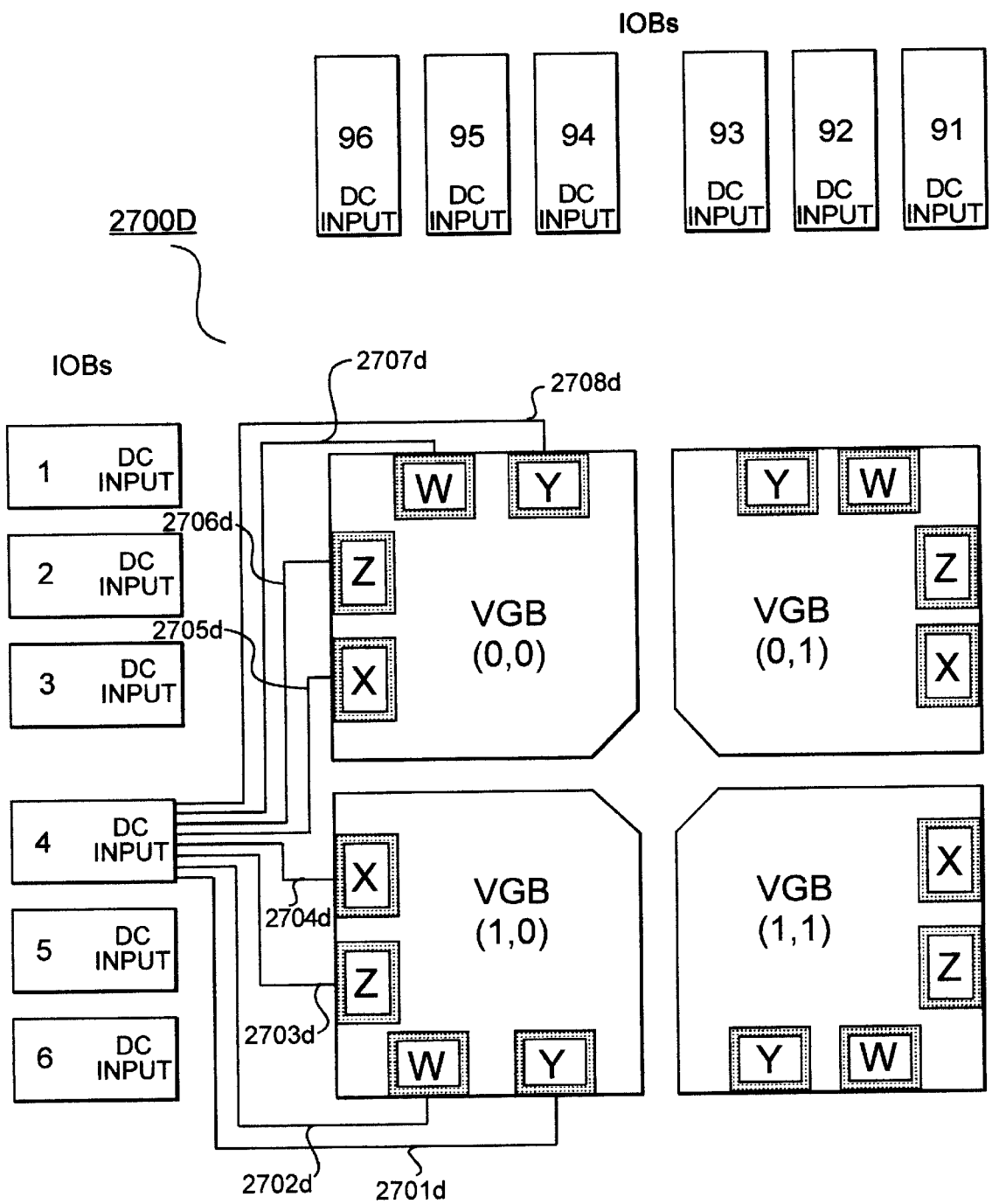

FIG. 27D illustrates direct connect inputs of IOB 4 which are connected to direct connect lines 2701*d*–2708*d*. Direct connect lines 2701*d*–2708*d* are connected to CBBs Y, W, Z, and X in VGBs (0,0) and (1,0).

Figure 27E:
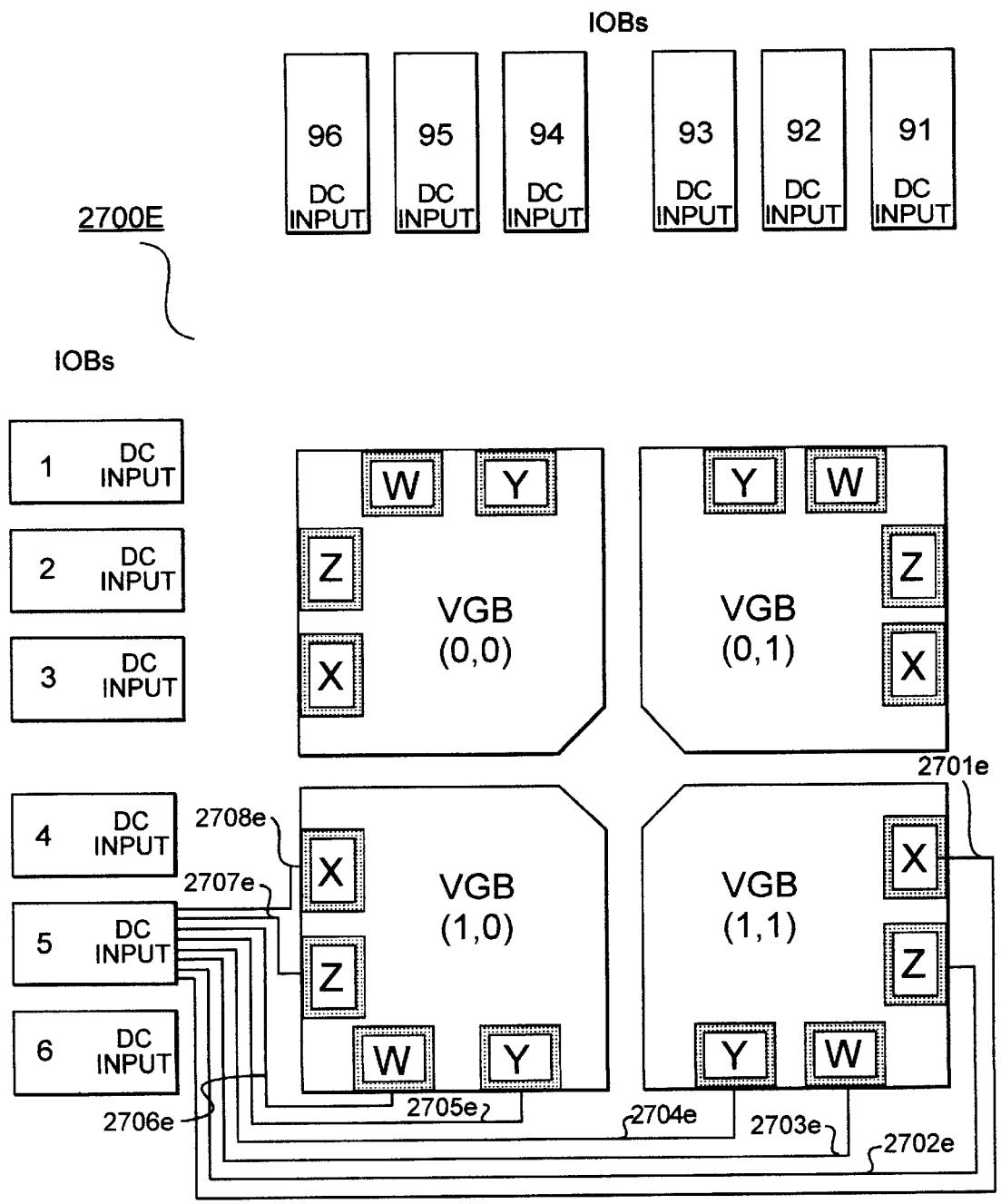

FIG. 27E illustrates direct connect inputs of IOB 5 which are connected to direct connect lines 2701*e*–2708*e*. Direct connect lines 2701*e*–2708*e* are connected to CBBs Y, W, Z, and X in VGBs (1,0) and (1,1).

Figure 27F:
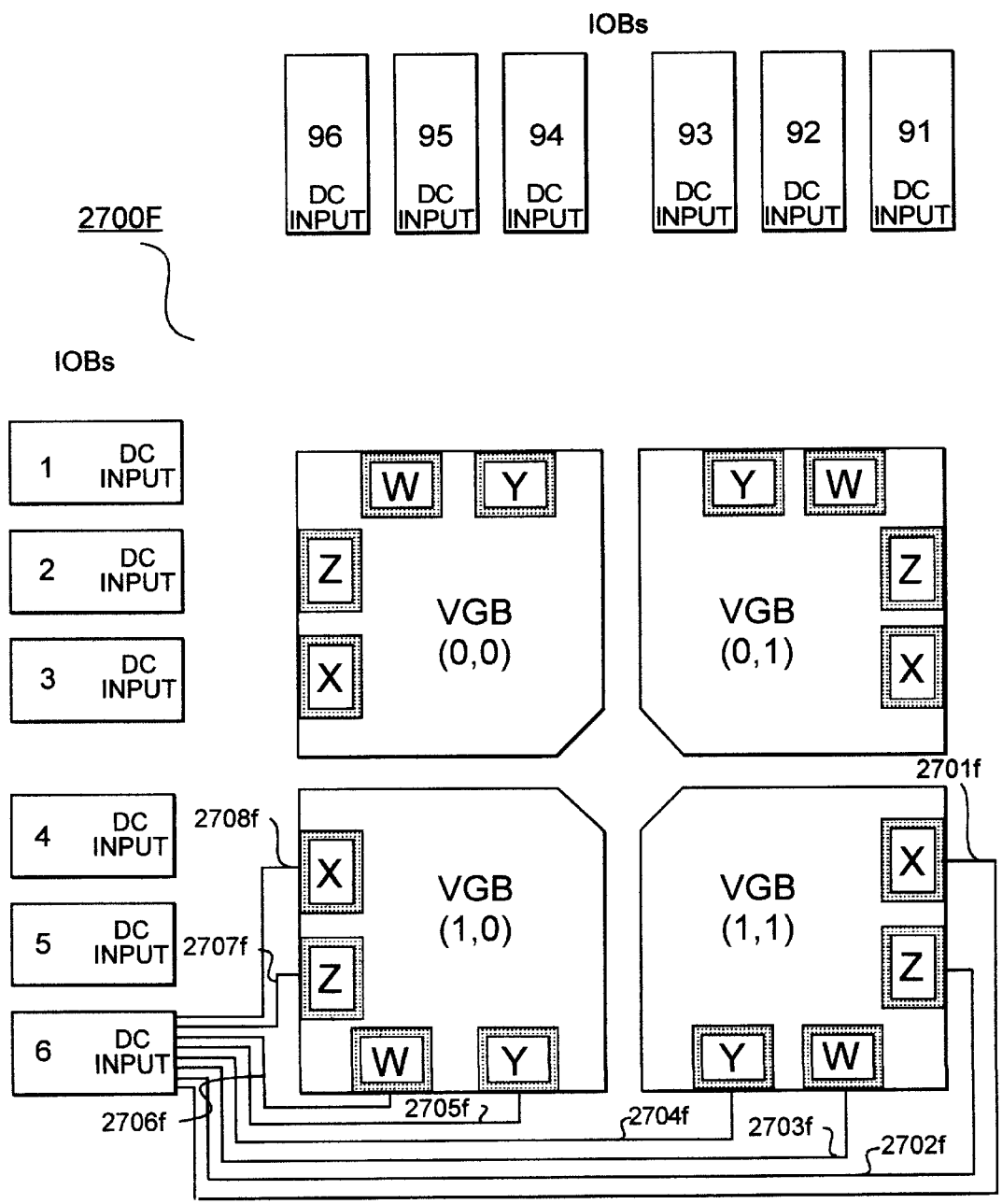

FIG. 27F illustrates direct connect inputs of IOB 6 which are connected to direct connect lines 2701*f*–2708*f*. Direct connect lines 2701*f*–2708*f* are connected to CBBs Y, W, Z, and X in VGBs (1,0) and (1,1).

Figure 27G:
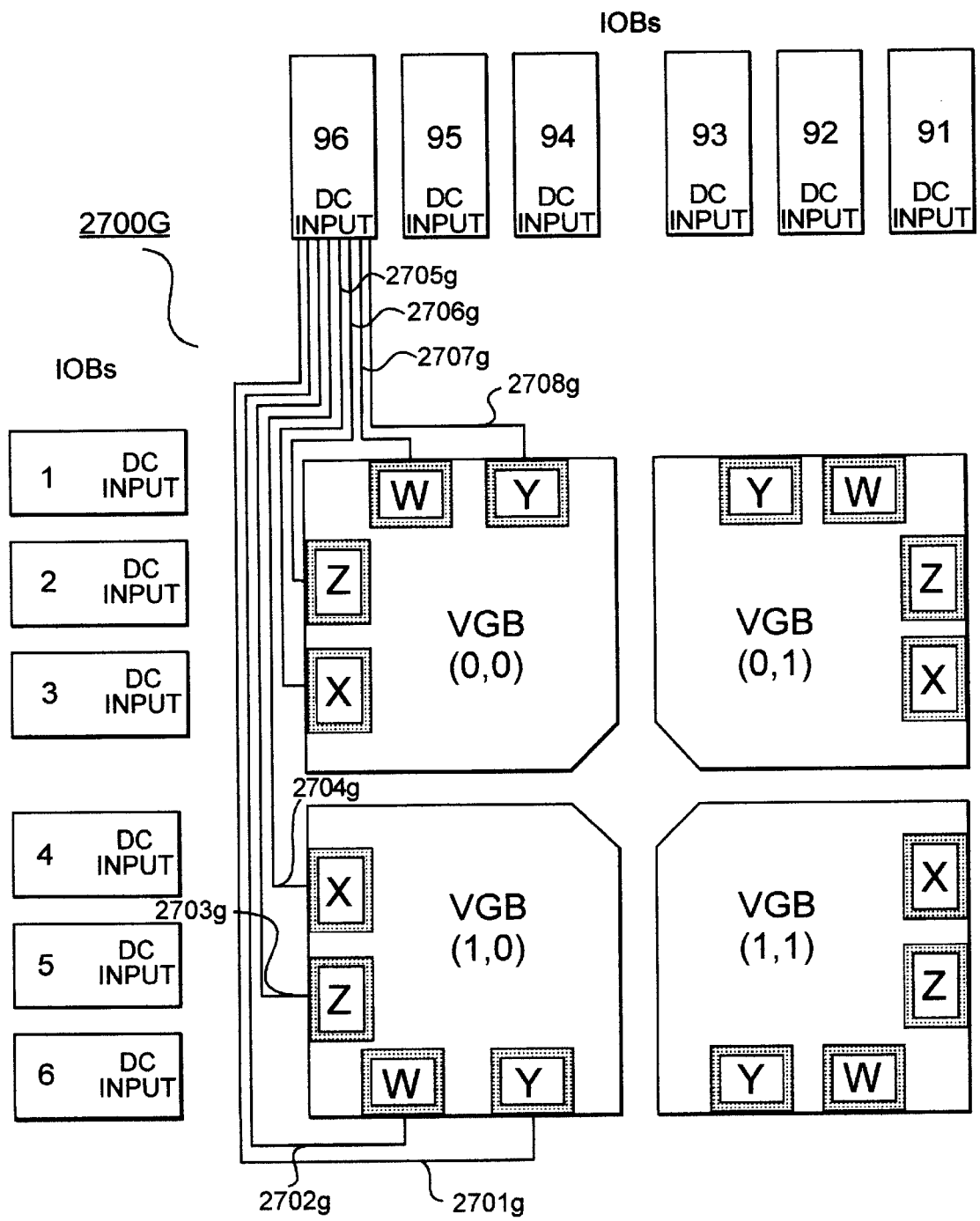

FIG. 27G illustrates direct connect inputs of IOB 91 which are connected to direct connect lines 2701*g*–2708*g*. Direct connect lines 2701*g*–2708*g* are connected to CBBs Y, W, Z, and X in VGBs (0,0) and (1,0).

Figure 27H:
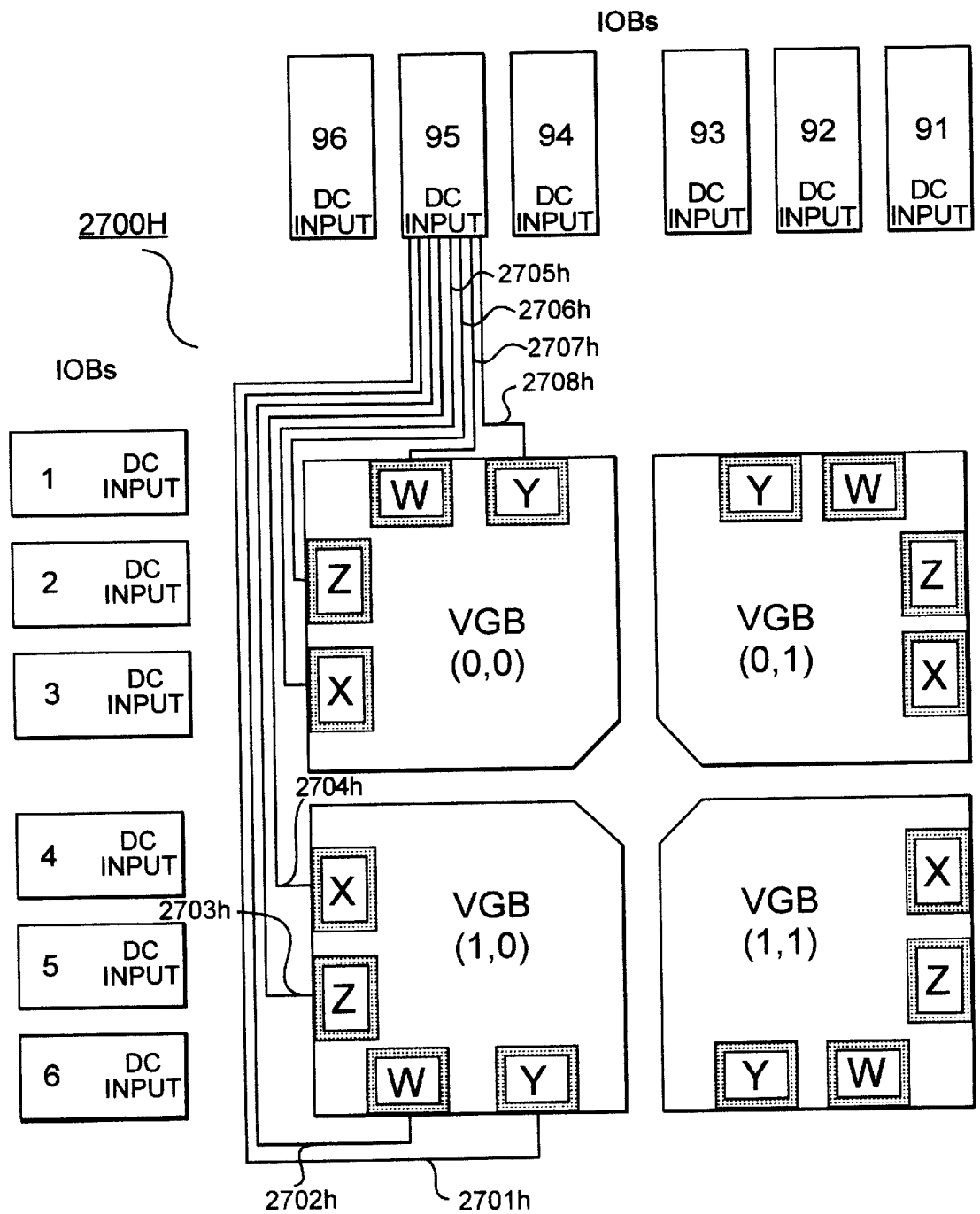

FIG. 27H illustrates direct connect inputs of IOB 95 which are connected to direct connect lines 2701*h*–2708*h*. Direct connect lines 2701*h*–2708*h* are connected to CBBs Y, W, Z, and X in VGBs (0,0) and (1,0).

Figure 27I:
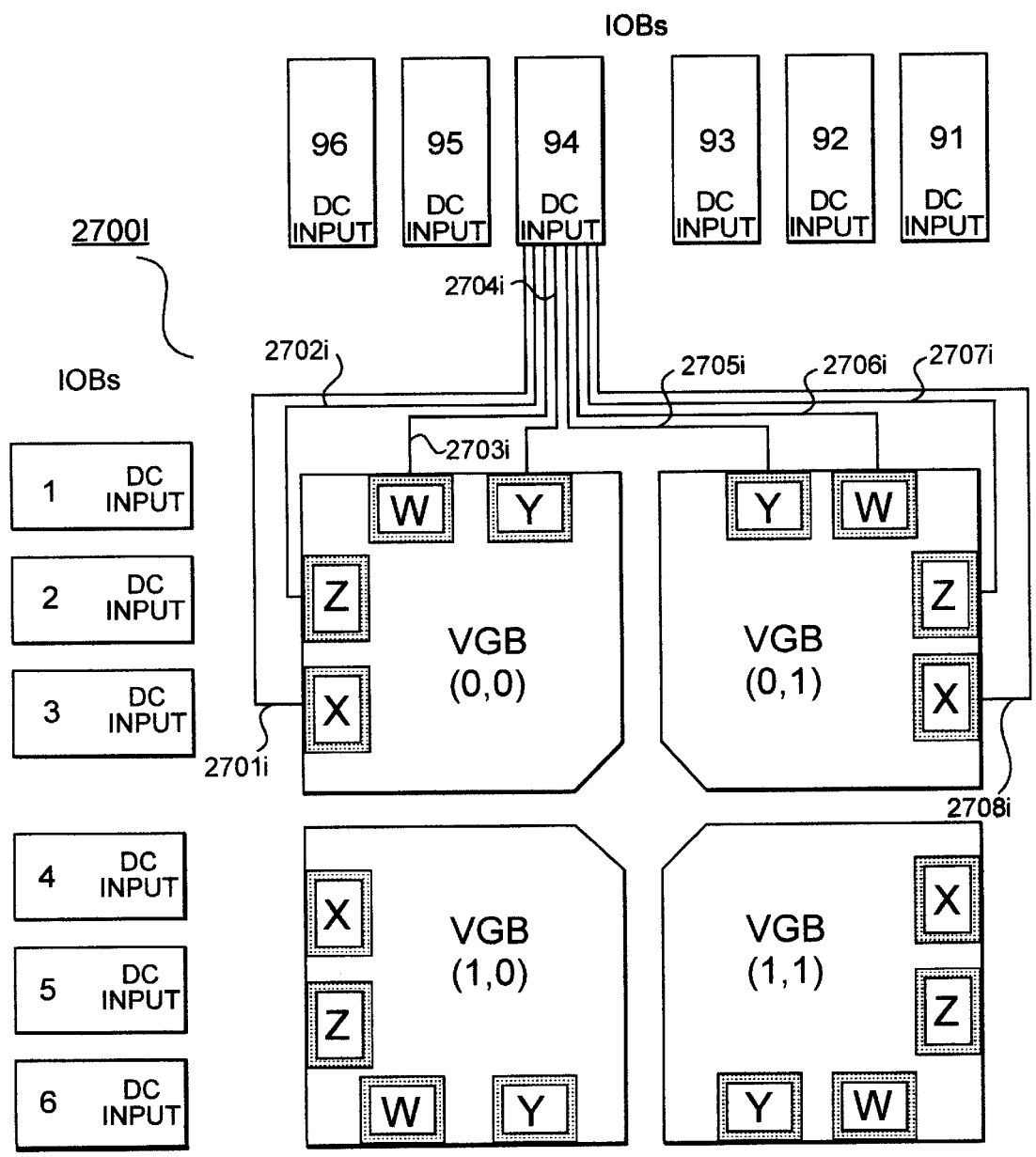

FIG. 27I illustrates direct connect inputs of IOB 94 which are connected to direct connect lines 2701*i*–2708*i*. Direct connect lines 2701*i*–2708*i* are connected to CBBs Y, W, Z, and X in VGBs (0,0) and (0,1).

Figure 27J:
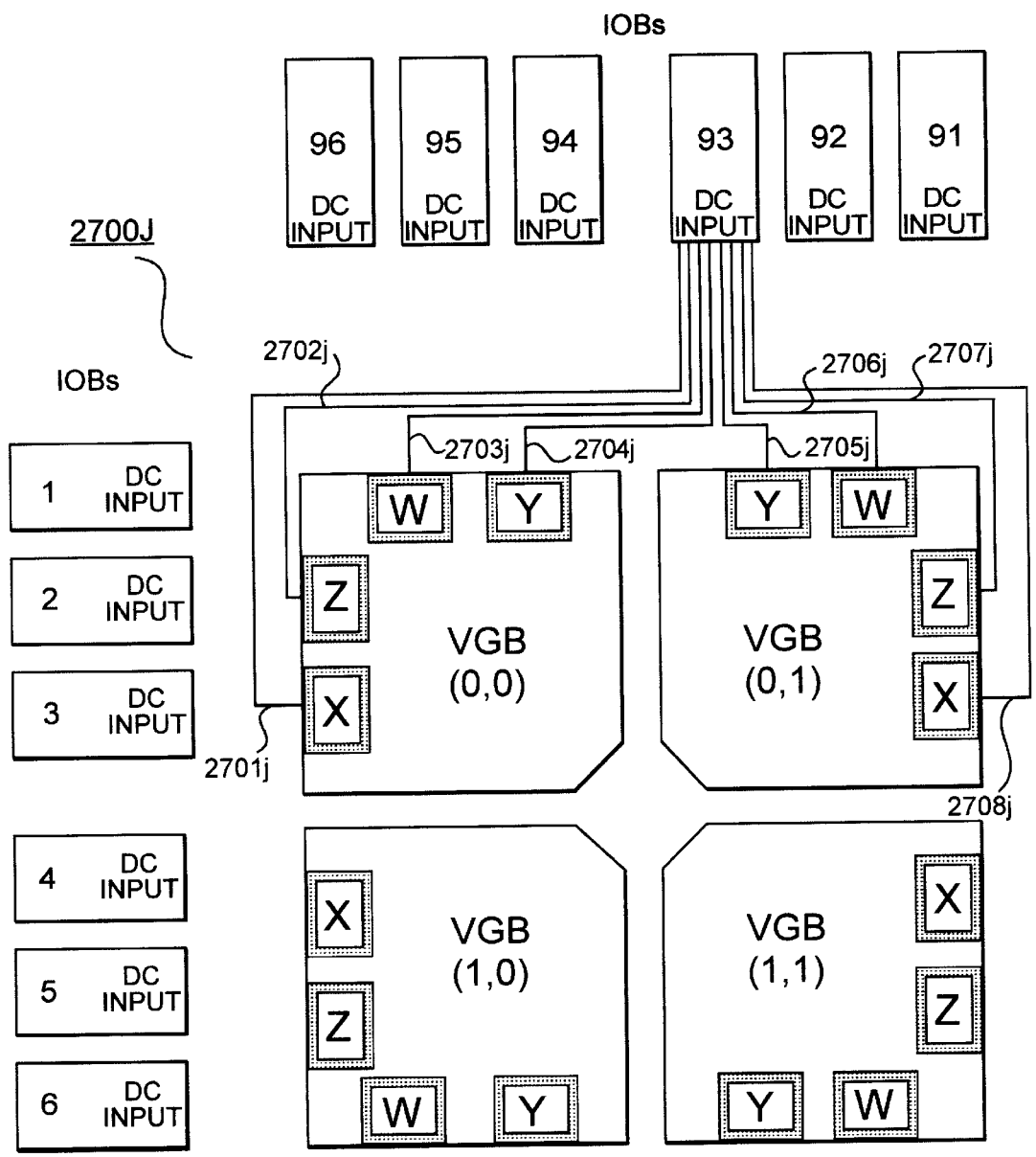

FIG. 27J illustrates direct connect inputs of IOB 93 which are connected to direct connect lines 2701*j*–2708*j*. Direct connect lines 2701*j*–2708*j* are connected to CBBs Y, W, Z, and X and VGBs (0,0) and (0,1).

Figure 27K:
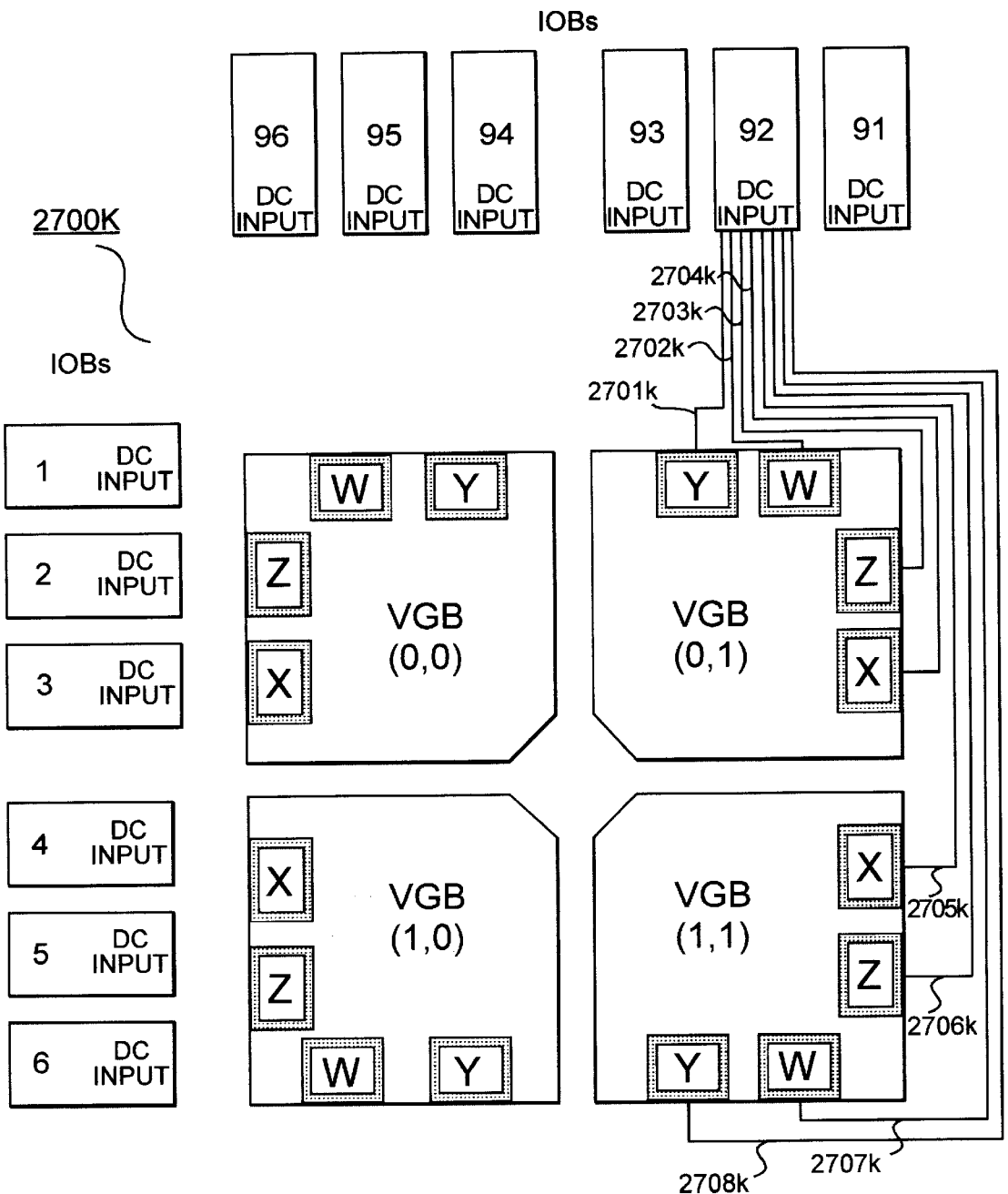

FIG. 27K illustrates direct connect inputs of IOB 92 which are connected to direct connect lines 2701*k*–2708*k*. Direct connect lines 2701*k*–2708*k* are connected to CBBs Y, W, Z, and X in VGBs (0,1) and (1,1).

Figure 27L:
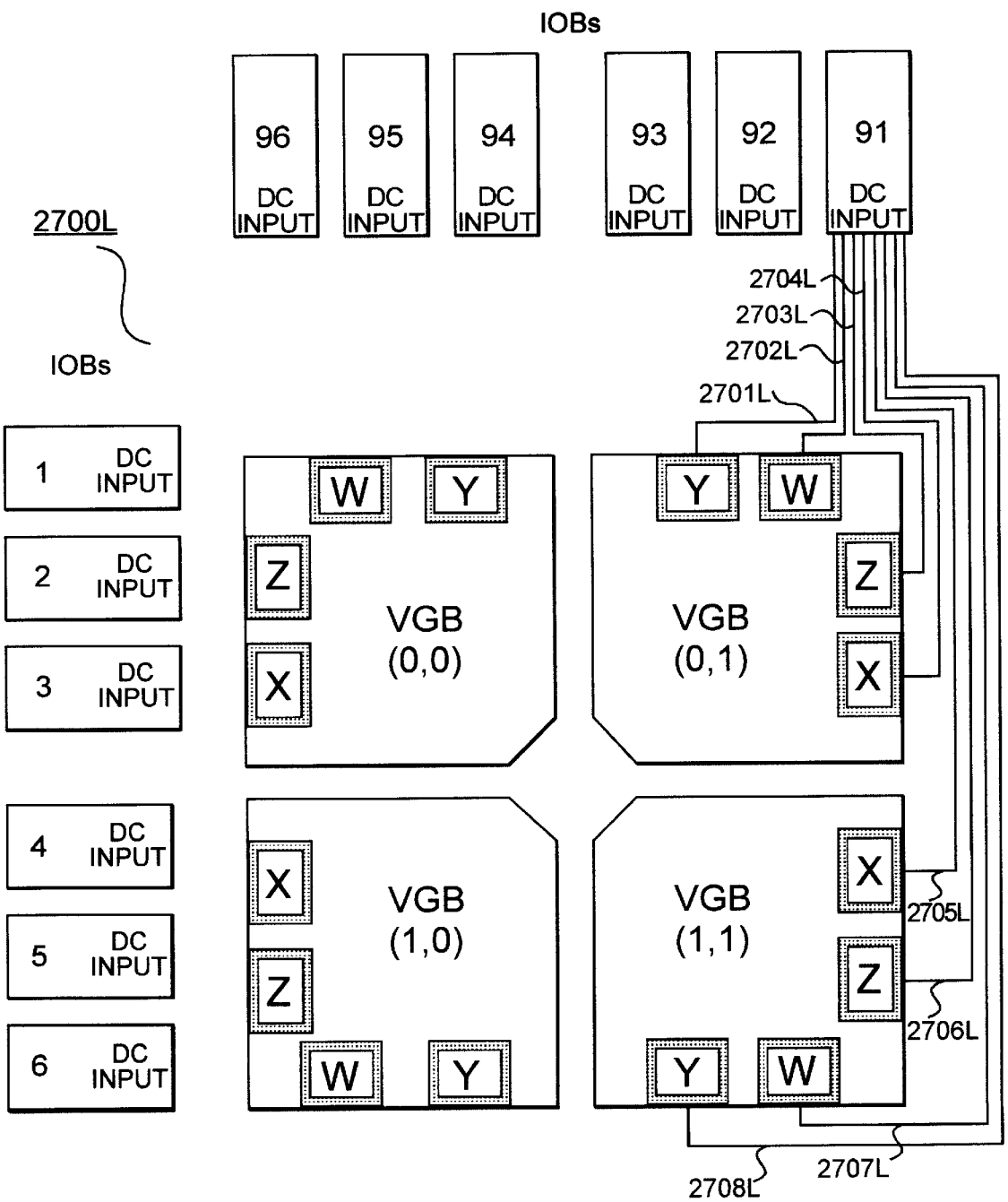

FIG. 27L illustrates direct connect inputs of IOB 91 which are connected to direct connect lines 2701*l*–2708*l*. Direct connect lines 2701*l*–2708*l* are connected to CBBs Y, W, Z, and X in VGBs (0,1) and (1,1).

A similar direct connect architecture is repeated for the other corner IOBs illustrated in FIG. 8. For example, a similar direct connect architecture may be used for the corner IOBs 67–78, 43–54 and 19–30 with respective VGBs (0,6), (0,7), (1,6), (1,7); (6,6), (6,7), (7,6), (7,7); and (6,0), (6,1), (7,0), and (7,1).

FIGS. 28A–F illustrates a direct connect architecture 2800*a–f* between non-corner IOB direct connect inputs and non-corner VGBs. FIGS. 28A–F correspond to IOBs 85–90 and VGBs (0,2), (0,3), (1,2) and (1,3) illustrated in FIG. 8. Direct connect inputs of IOBs 85–90 are connected to CBBs Y, W, Z, and X in VGBs (0,2), (0,3), (1,2) and (1,3).

Figure 28A:
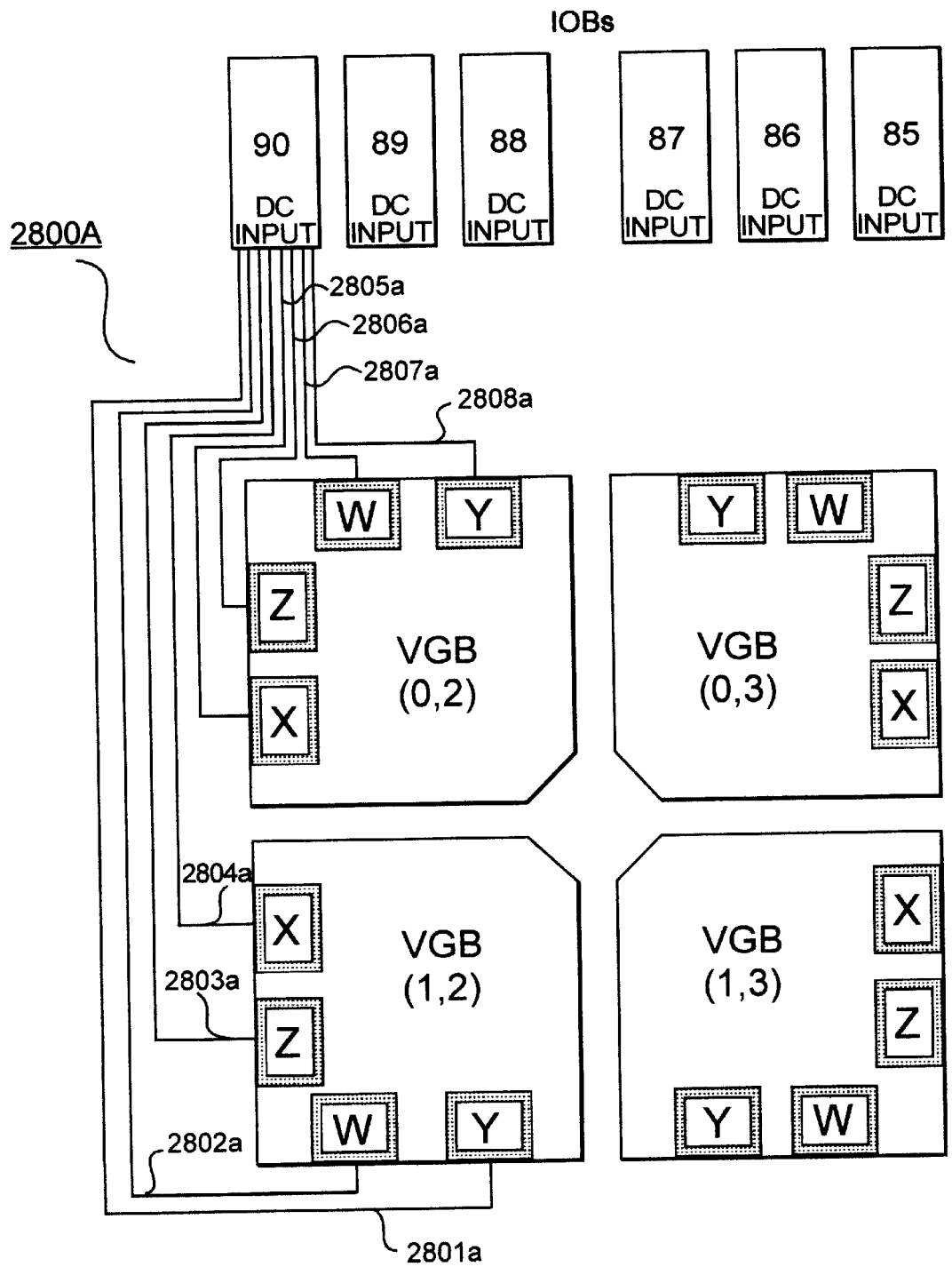
FIGS. 28A–F illustrate a direct connect architecture between non-corner super-VGB outputs and non-corner IOB direct connect inputs.

Specifically, FIG. 28A illustrates direct connect inputs of IOB 90 which are connected to direct connect lines 2801*a*–2808*a*. Direct connect lines 2801*a*–2808*a* are connected to CBBs Y, W, Z, and X in VGBs (0,2) and (1,2).

Figure 28B:
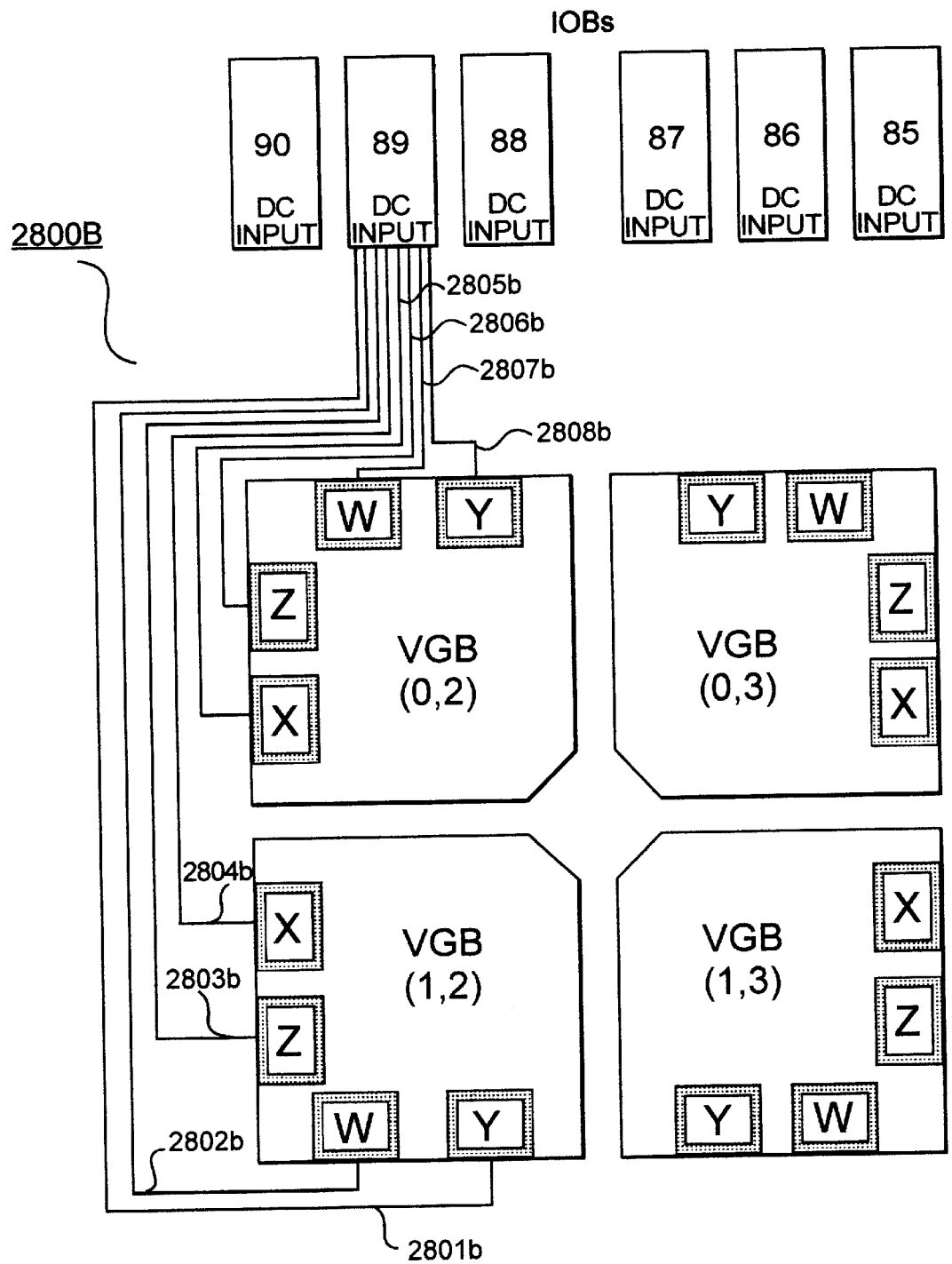

FIG. 28B illustrates direct connect inputs of IOB 89 which are connected to direct connect lines 2801*b*–2808*b*. Direct connect lines 2801*b*–2808*b* are connected to CBBs Y, W, Z, and X in VGB (0,2) and (1,2).

Figure 28C:
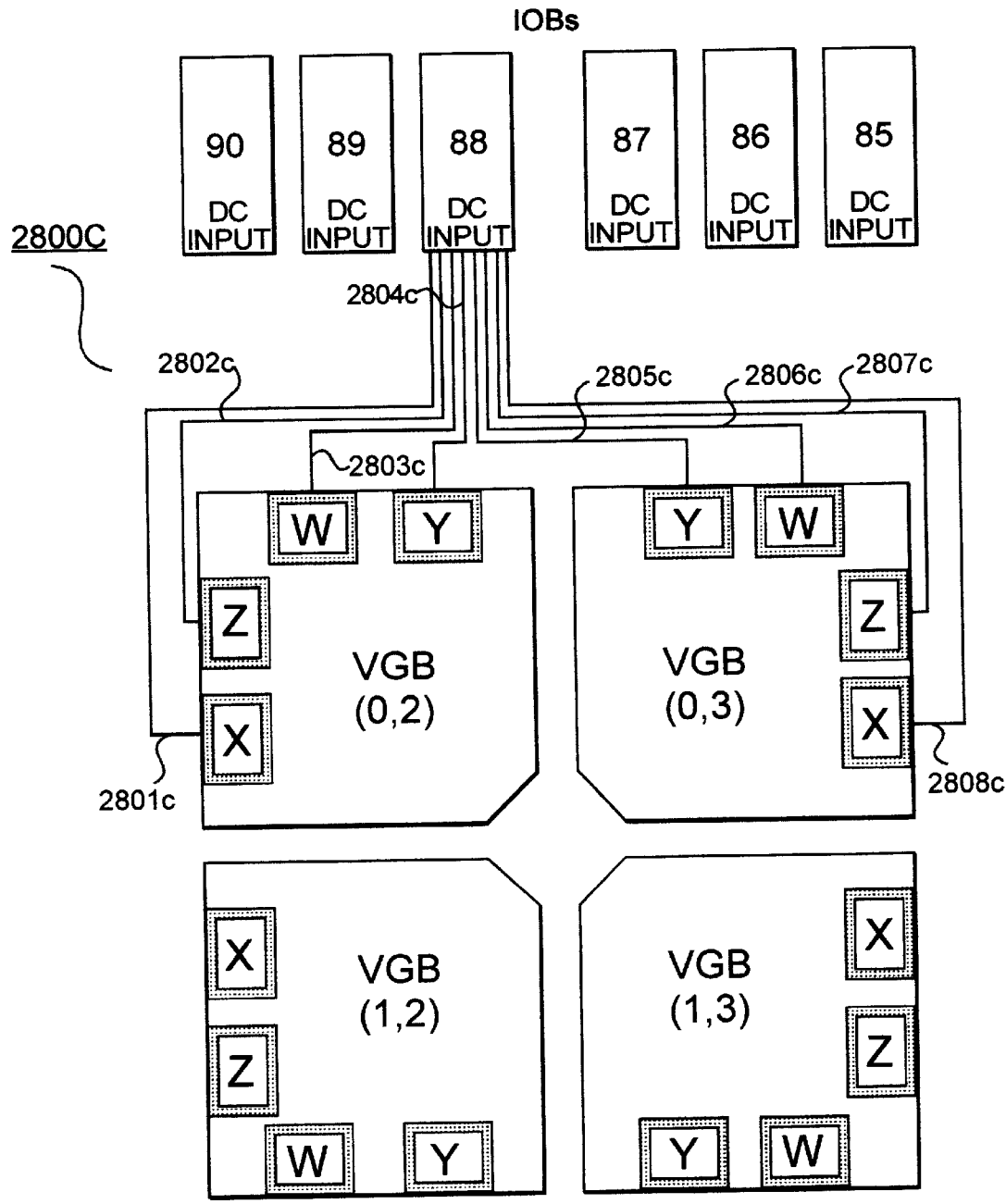

FIG. 28C illustrates direct connect inputs of IOB 88 which are connected to direct connect lines 2801*c*–2808*c*. Direct connect lines 2801*c*–2808*c* are connected to CBBs Y, W, Z, and X in VGBs (0,2) and (0,3).

Figure 28D:
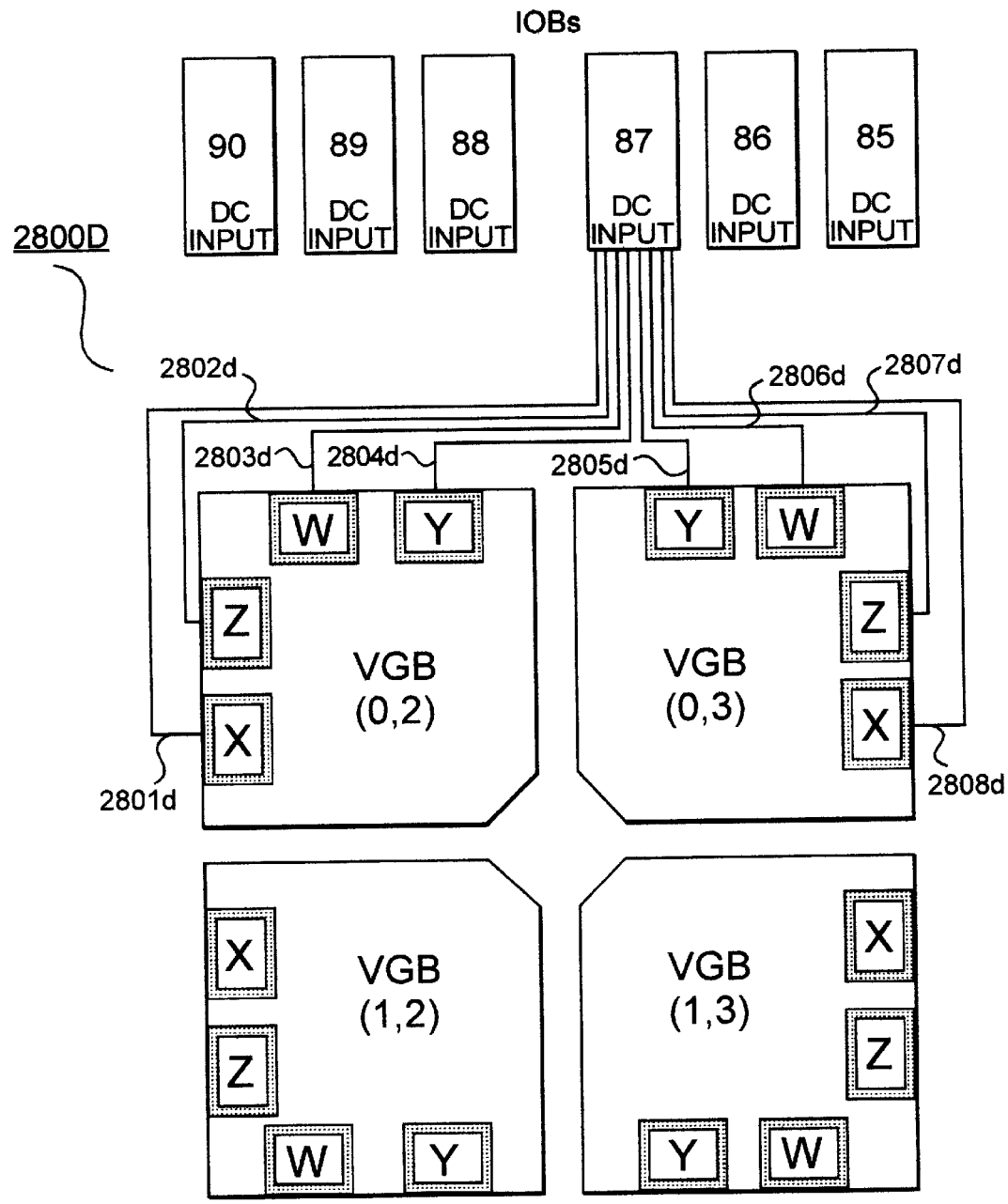

FIG. 28D illustrates direct connect inputs of IOB 87 which are connected to direct connect lines 2801*d*–2808*d*. Direct connect lines 2801*d*–2808*d* are connected to CBBs Y, W, Z, and X in VGBs (0,2) and (0,3).

Figure 28E:
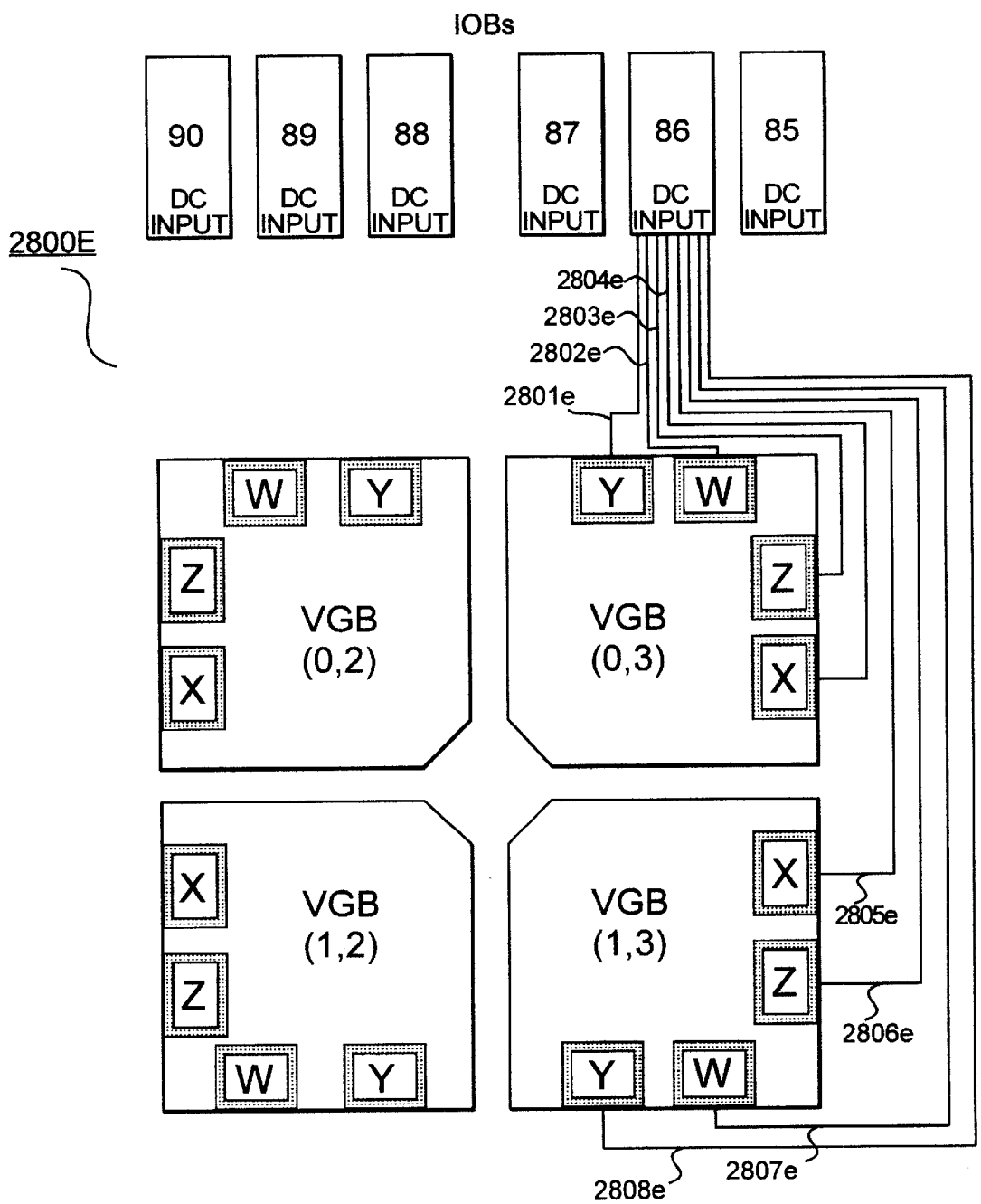

FIG. 28E illustrates direct connect inputs of IOB 86 which are connected to direct connect lines 2801*e*–2808*e*. Direct connect lines 2801*e*–2808*e* are connected to CBBs Y, W, Z, and X in VGBs (0,3) and (1,3).

Figure 28F:
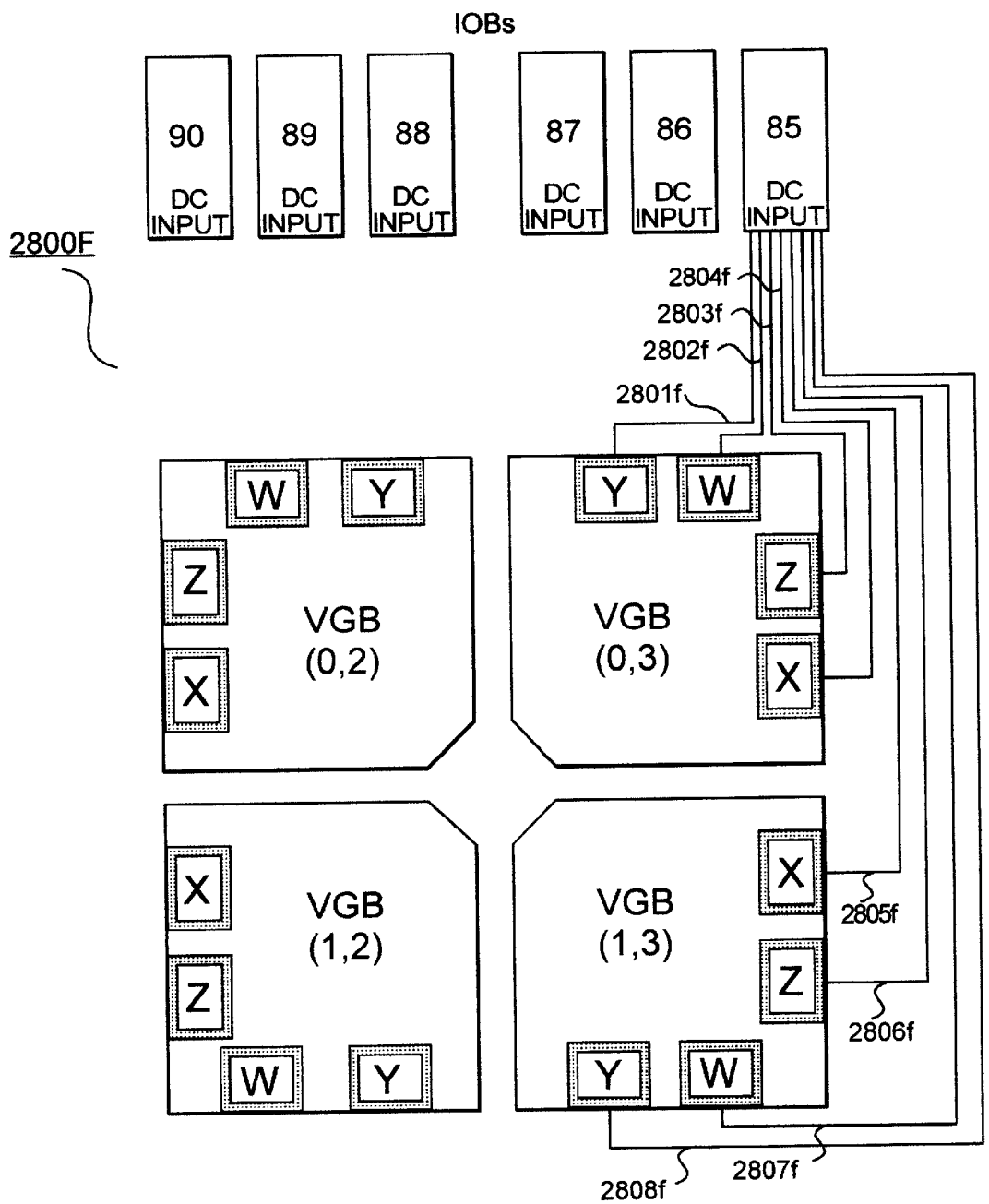

FIG. 28F illustrates direct connect inputs of IOB 85 which are connected to direct connect lines 2801*f*–2808*f*. Direct connect lines 2801*f*–2808*f* are connected to CBBs Y, W, Z, and X in VGBs (0,3) and (1,3).

A similar direct connect architecture is repeated for other non-corner IOBs. For example, IOBs 79–84 and VGB (0,4), (0,5), (1,4), and (1,5) have a similar direct connect architecture Further, IOBs 7–18, 31–42 and 56–66 have a similar direct connect architecture with respective adjacent VGBs.

The direct connect architecture between VGBs and IOBs illustrated in FIGS. 24–28 offers several advantages over the previously suggested direct connect architecture.

First, the present direct connect architecture provides 24 direct connect input signals from corner IOBs to corner super-VGB. Similarly, a non-corner super-VGB may receive 10 direct connect input signals from non-corner IOBs. Thus, the use of additional direct connections from IOBs to super-VGBs enables greater degrees of freedom for the FPGA configuration software. When configuring a FPGA-implemented circuit, the routing phase has additional direct connect lines to use in establishing connections between IOBs interfacing to external peripheral devices and chunk-implemented VGBs in the corner super-VGB. Further, the use of the additional direct connect lines enables the FPGA configuration software to select other inter-connect resources which would have been otherwise used.

Second, the present direct connect architecture provides 24 direct connect output signals from a corner super-VGB to corner IOBs. Likewise, 10 direct connect output signals may be provided from a non-corner super-VGB to non-corner IOBs. As with the increased number of direct connect inputs from IOBs described above, the increased number of direct connect outputs from a super-VGB to IOBs allows for greater degrees of freedom in the FPGA configuration software.

Third, the direct connect architecture allows for efficient implementation of random logic nets. The increased direct connect lines and dedicated drive amplifiers in IOBs and VGBs efficiently emulate short connections in random logic.

Fourth, the direct connect and symmetric VGB/IOB architecture enables the FPGA configuration software to reposition a plurality of circuit chunks requiring high speed direct connect signals between a first group of VGBs and IOBs into a second group of VGBs and IOBs. Because of the symmetric positioning of VGBs/IOBs and direct connect architecture, circuit chunks repositioned into the second group of VGBs will have substantially the same direct connect signal delays between respective IOBs and CBBs as compared to the first group of VGBs.

For example, circuit chunks may be placed by FPGA configuration software into a first group of VGBs: VGBs (0,0), (0,1), (1,0), and (1,1) as illustrated in FIG. 8. The configuration software then may route the appropriate direct connect I/O connections between corner IOBs 1–6 and 91–96. The first group of circuit chunk implemented VGBs may require high speed direct connect input and output signals between VGBs and IOBs.

The FPGA configuration software may then reposition the circuit chunks into a second group of VGBs which still meet the circuit chunk implemented VGB direct connect input and output signal timing requirements between VGBs and an external I/O device. The second group of VGBs may, for example, be rotated and positioned in VGBs (6,6), (6,7), (7,6), and (7,7) as illustrated in FIG. 8.

Fifth, the direct connect architecture enables flexible routing of IOB direct connect input/output signals. For example, the FPGA-configuring software module may route a direct connect input or output to a FPGA implemented circuit chunk in a super-VGB as illustrated in FIGS. 25, 27G–H from either IOB 96 or 95 to VGBs (0,0) and (1,0). Since the direct connect architecture between IOB 96 and VGBs (0,0), (1,0) is substantially the same as the direct connect architecture between IOB 95 and VGBs (0,0), (1,0), the FPGA-configuring software has the flexibility of positioning a given direct connect input or output in either IOB 96 or IOB 95 and the direct connect signal propagation times (RCL delay) between IOBs 96–95 and VGBs (0,0), (1,0) will be substantially equal.

Figure 29:
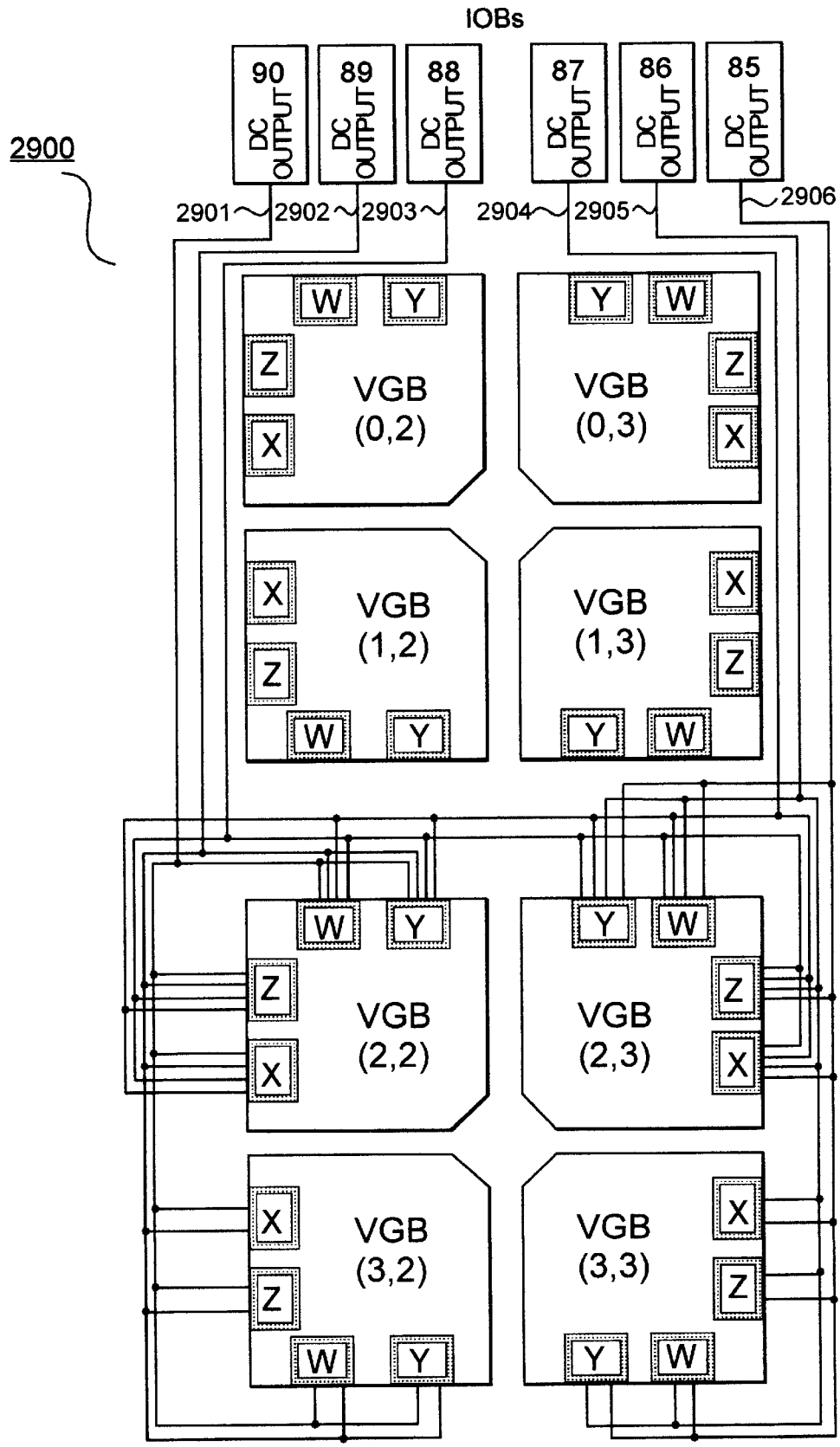
FIG. 29 illustrates a direct connect architecture between a next-adjacent non-corner super-VGB and non-corner IOBs.

FIG. 29 illustrates an embodiment of direct connections between non-corner IOBs and a next-adjacent super-VGB. FIG. 29 illustrates a direct connect architecture 2900 in which non-corner IOBs are directly connected to next-adjacent super-VGBs. Specifically, an IOB direct connect output from IOB 40 is connected to direct connect line 2901. Direct connect line 2901 is connected to CBBs Y, W, Z, and X in VGBs (2,2), (3,2). The direct connect output of IOB 89 is connected to direct connect line 2902. Direct connect line 2902 is connected to CBBs Y, W, Z, and X in VGBs (2,2), (3,2). Likewise, a direct connect output from IOBs 88 and 87 are connected to direct connect lines 2903 and 2904 respectively. Direct connect line 2903 is connected to CBBs Y, W, Z, and X in VGBs (2,2), (2,3). The direct connect line 2904 is connected to CBBs Y, W, Z, and X in VGB (2,2), (2,3).

A similar direct connect architecture may be repeated for other non-corner IOBs and next-adjacent super-VGBs.

Likewise, a direct connect architecture for driving non-corner IOB direct connect inputs from next-adjacent super-VGBs may be used.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An input/output block (IOB) for a field programmable gate array (FPGA) device, comprising:

(a) an input for receiving an input signal from a pin;

(b) a register/latch, coupled to the input, having an output, for providing an output signal; and (c) a first transistor, coupled to the register/latch output, for providing a ground path for an inter-connect resource coupled to the IOB, wherein the inter-connect resource is coupled to a second IOB and a current source.

2. The IOB of claim 1, wherein the inter-connect resource is a line positioned substantially parallel to a side of the FPGA.

3. The IOB of claim 1, wherein a second transistor is coupled to the first transistor.

4. The IOB of claim 3, wherein the second transistor includes a gate coupled to a multiplexer and the first transistor includes a gate coupled to the register/latch output.

5. An input/output block (IOB) for a field programmable gate array (FPGA) device, comprising:

(a) an input for receiving an input signal from a pin;

(b) a delay element, coupled to the input, having an output for providing a delayed input signal;

(c) a first multiplexer, coupled to the delay element, having an output for providing a first multiplexer signal responsive to the delayed input signal;

(d) a second multiplexer, coupled to the first multiplexer, having an output for providing a second multiplexer signal responsive to the first multiplexer signal;

(e) a register/latch, coupled to the second multiplexer, having an output for providing a register/latch output signal responsive to the second multiplexer signal, a set signal and a reset signal;

(f) a set/reset line for providing a set/reset signal;

(g) a decoder, coupled to the set/reset line, for providing the set signal or the reset signal responsive to the set/reset signal;

(h) a third multiplexer, coupled to the register/latch output, having an output for providing a third multiplexer signal responsive to the register/latch output signal; and, (i) an amplifier, coupled to the third multiplexer, having an output for providing an amplified signal to an inter-connect resource in the FPGA responsive to the third multiplexer signal.

\* \* \* \* \*